(12) United States Patent
Hasegawa et al.

(10) Patent No.: US 7,283,335 B2
(45) Date of Patent: Oct. 16, 2007

(54) MAGNETIC DETECTING ELEMENT

(75) Inventors: Naoya Hasegawa, Niigata-ken (JP); Eiji Umetsu, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 391 days.

(21) Appl. No.: 10/430,893

(22) Filed: May 6, 2003

(65) Prior Publication Data

US 2004/0027731 A1    Feb. 12, 2004

(30) Foreign Application Priority Data

May 7, 2002   (JP)   ............................. 2002-131276
Aug. 21, 2002   (JP)   ............................. 2002-240760

(51) Int. Cl.
G11B 5/39   (2006.01)
G11B 5/127   (2006.01)

(52) U.S. Cl. .............................. 360/324.12; 360/324.11

(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 5,943,763 A | 8/1999 | Shouji et al. | |
| 6,030,753 A | 2/2000 | Lin | |
| 6,856,494 B2 * | 2/2005 | Ooshima et al. | 360/324.12 |
| 6,865,062 B2 * | 3/2005 | Pinarbasi | 360/324.11 |
| 6,893,734 B2 * | 5/2005 | Hasegawa et al. | 428/611 |
| 2001/0015877 A1 * | 8/2001 | Seyama et al. | 360/322 |
| 2001/0028540 A1 * | 10/2001 | Sakaguci et al. | 360/324.12 |
| 2001/0033466 A1 | 10/2001 | Ooshima et al. | |
| 2002/0024781 A1 | 2/2002 | Ooshima et al. | |
| 2002/0069511 A1 * | 6/2002 | Hasegawa et al. | 29/603.14 |

\* cited by examiner

*Primary Examiner*—William J Klimowicz
(74) *Attorney, Agent, or Firm*—Brink Hofer Gilson & Lione

(57) ABSTRACT

In a magnetic detecting element, ferromagnetic layers are formed on both side portions of a free magnetic layer through nonmagnetic intermediate layers, and second antiferromagnetic layers are formed on the ferromagnetic layers with a spacing greater than the spacing between the ferromagnetic layers in the track width direction. Also, in both side portions of the element, the ferromagnetic layers have portions extending from the inner end surfaces of the respective second antiferromagnetic layers toward the center in the track width direction. Furthermore, electrode layers are formed on the second antiferromagnetic layers and on the extending portions of the ferromagnetic layers. It is thus possible to improve reproduced output, and suppress widening of an effective reproducing track width to appropriately suppress the occurrence of side reading.

8 Claims, 21 Drawing Sheets

MAGNETIC DETECTING ELEMENT

BACKGROUND

1. Field of the Invention

The present invention relates to magnetic detecting elements. Included among the material disclosed here are structures and techniques for magnetic detecting elements with an exchange bias system for controlling the magnetization of a free magnetic layer. Also included are discussions of a magnetic detecting element capable of improving reproduced output and suppressing the occurrence of side reading even with a narrower track, and of a method of manufacturing the magnetic detecting element.

2. Description of the Related Art

FIG. 24 is a partial sectional view of a conventional magnetic detecting element (spin-valve thin film element), as viewed from a side facing a recording medium.

In FIG. 24, reference numeral 1 denotes a first antiferromagnetic layer made of PtMn or the like, and a pinned magnetic layer 2 made of a NiFe alloy or the like, a nonmagnetic material layer 3 made of Cu or the like, and a free magnetic layer 4 made of a NiFe alloy or the like are formed on the first antiferromagnetic layer 1.

As shown in FIG. 24, second antiferromagnetic layers 5 are formed on the free magnetic layer 4 with a distance corresponding to a track width Tw apart in the track width direction (the X direction shown in the drawing), and electrode layers 6 are formed on the second antiferromagnetic layers 5.

In the magnetic detecting element shown in FIG. 24, an exchange coupling magnetic field is produced at each of the interfaces between the free magnetic layer 4 and the second antiferromagnetic layers 5 to pin the magnetizations in both end portions of the free magnetic layer 4 in the X direction. However, the central portion of the free magnetic layer 4 is weakly put into a single magnetic domain state to an extent which permits magnetic reversal in response to an external magnetic field. This method for controlling the magnetization of the free magnetic layer 4 is referred to as an "exchange bias system".

The conventional example shown in FIG. 24 has a problem in which when the track width is further narrowed for increasing the recording density, a dead zone having a difficulty in magnetic reversal in response to an external magnetic field extends into the central portion of the free magnetic layer 4. This causes the problem of failing to achieve magnetic reversal in the central portion of the free magnetic layer 4 with high sensitivity to the external magnetic field, decreasing reproduced output.

The central portion of the free magnetic layer 4 is magnetized in the X direction by an exchange coupling bias magnetic field produced at each of the interfaces between both side portions of the free magnetic layer 4 and the second antiferromagnetic layers 5 due to an exchange interaction in the magnetic layer. The bias magnetic field is strongly exerted on the vicinities of the interfaces between the central portion and both side portions of the free magnetic layer 4, and the bias magnetic field can readily extend over the entire region of the central portion of the free magnetic layer 4 as the track width Tw decreases.

In the central portion of the free magnetic layer 4 strongly subjected to the bias magnetic field, magnetization is not pinned so strongly as in both side portions. Nonetheless, magnetic reversal can suffer a reduced sensitivity to the external magnetic field, thereby easily producing the dead zone in a region strongly subjected to the bias magnetic field. As a result, the reproduced output decreases as the track is further narrowed.

On the other hand, FIG. 25 is a partial sectional view of a conventional magnetic detecting element in which electrode layers 6 are formed in a different shape from the electrode layers 6 of the element shown in FIG. 24, as viewed from a side facing a recording medium. In FIG. 25, the same reference numerals as in FIG. 24 denote the same layers as the layers shown in FIG. 24.

Unlike in FIG. 24, in FIG. 25, the inner ends 6a of the electrode layers 6 in the track width direction (the X direction shown in the drawing) extend to the portions of the free magnetic layer 4 that are exposed in the distance T1 between the second antiferromagnetic layers 5, so that the track width Tw is regulated by the width dimension between the electrode layers 6 in the track width direction (the X direction).

In the conventional example shown in FIG. 25, the distance T1 between the second antiferromagnetic layers 5 in the track width direction can be increased, as compared with the conventional example shown in FIG. 24. In the conventional example shown in FIG. 25, magnetizations of both side portions of the free magnetic layer 4, which are formed in contact with the second antiferromagnetic layers 5 in the thickness direction, are strongly pinned in the X direction. On the other hand, in the intermediate regions of the free magnetic layer 4, which are formed by overlapping the inner ends 6a of the electrode layers 6 with the free magnetic layer 4, the strong bias magnetic field is exerted from both side portions of the free magnetic layer 4 to produce dead zones which substantially do not contribute to a change in magnetoresistance. Therefore, only the central portion of the free magnetic layer 4 is weakly put into a single magnetic domain state in the X direction, and thus the central portion becomes a sensitive zone in which magnetic reversal occurs with high sensitivity to the external magnetic field.

A sensing current from the electrode layers 6 to the free magnetic layer 4 mainly flows from the inner ends 6a of the electrode layers 6 to the central portion of the free magnetic layer 4, and thus the sensing current can be caused to flow less through the intermediate regions, i.e., the dead zones, of the free magnetic layer 4, thereby electrically killing the dead zones.

As described above, in the conventional example shown in FIG. 25, the distance T1 between the second antiferromagnetic layers 5 in the track width direction can be widened, as compared with the example shown in FIG. 24. Also, the track width Tw controlled by the electrode layers 6 can be matched with the width dimension of the sensitive zone of the free magnetic layer 4 apart from the dead zones. It is thus expected that a magnetic sensing element capable of producing great reproduced output even with a narrow track can be manufactured.

However, the conventional example shown in FIG. 25 also has a problem. Although the dead zones can assume a state in which they are electrically killed, they might not be completely magnetically killed, even though the intermediate regions of the free magnetic layer 4 are defined as the dead zones. In other words, although little magnetic reversal occurs in the dead zones in response to an external magnetic field, magnetization is not completely pinned. Thus, a little magnetic reversal can occur in response to the external magnetic field in some cases.

In this situation, the magnetic reversal is propagated to the central portion serving as the sensing zone in the free magnetic layer 4, and thus an external magnetic field entering in the dead zones is read as noise, deteriorating reproducing characteristics.

This situation results in a problem of side reading, in which the effective reproducing track width (which substantially corresponds to the track width Tw) becomes greater than the track width Tw (referred to as the "optical track width") controlled by the electrode layers 6 shown in FIG. 25, thereby reading an external magnetic field leaking from an adjacent track on a medium. Therefore, the structure shown in FIG. 25 cannot realize a magnetic detecting element appropriately adaptable for a narrower track.

Particularly, the problem of side reading becomes significant as the overlap length between each of the inner ends 6a of the electrode layers 6 and the upper surface of the free magnetic layer 4 increases (i.e., as the width of each intermediate region in the track width direction increases).

SUMMARY

The techniques disclosed herein address, among others, the above-described problems. Some of these techniques can be used to provide a magnetic detecting element capable of improving reproduced output even with a narrower track, and of suppressing widening of an effective reproducing track to suppress the occurrence of side reading. Also described is a method of manufacturing the magnetic detecting element.

This disclosure also relates a magnetic detecting element comprising a multilayer film comprising a first antiferromagnetic layer, a pinned magnetic layer, a nonmagnetic material layer, and a free magnetic layer, which are laminated in that from below, ferromagnetic layers formed on both side portions of the free magnetic layer through nonmagnetic intermediate layers, second antiferromagnetic layers formed on the ferromagnetic layers with a distance greater than the distance between the ferromagnetic layers in the track width direction so that the ferromagnetic layers have portions intending from the inner ends of the respective second antiferromagnetic layers to the center in the track width direction within both side portions, and electrode layers formed to extend from the respective second antiferromagnetic layers to the extending portions of the ferromagnetic layers.

In this magnetic detecting element, the ferromagnetic layers are formed on both side portions of the free magnetic layer through the nonmagnetic intermediate layers, and the second antiferromagnetic layers are formed on the ferromagnetic layers with the distance greater than the distance between the ferromagnetic layers. Therefore, in the ferromagnetic layers overlapped with the respective second antiferromagnetic layers in the thickness direction, magnetizations are strongly pinned in the track width direction by exchange coupling magnetic fields produced between the ferromagnetic layers and the second antiferromagnetic layers. Also, in the free magnetic layer facing the ferromagnetic layers having pinned magnetization in the thickness direction, magnetization is pinned in the direction opposite to the magnetization direction of the ferromagnetic layers by exchange coupling due to a Ruderman-Kittel-Kasuya-Yosida (RKKY) interaction produced between the free magnetic layer and the ferromagnetic layers.

On the other hand, the extending portions of the ferromagnetic layers, which extend from the inner ends of the second antiferromagnetic layers in the track width direction, and the free magnetic layer facing the extending portions of the ferromagnetic layers in the thickness direction are subjected to bias magnetic fields produced in the ferromagnetic layers and the free magnetic layer, and to exchange coupling due to a RKKY interaction produced between the ferromagnetic layers and the free magnetic layer, thereby increasing a difficulty (decrease in sensitivity) of magnetic reversal in response to an external magnetic field, as compared with the intermediate regions shown in FIG. 25.

In the central portion of the free magnetic layer, the ferromagnetic layers are not formed through the nonmagnetic intermediate layer in the thickness direction, and thus the central portion is subjected to only the bias magnetic field produced in the magnetic layer, but not subjected to exchange coupling due to the RKKY interaction with the ferromagnetic layers. Therefore, the central portion is weakly put into a single magnetic domain state to an extent which permits magnetic reversal with high sensitivity to the external magnetic field.

Furthermore, the electrode layers are formed to extend from the inner ends of the second antiferromagnetic layers to the center in the track width direction and overlap with the ferromagnetic layers. Therefore, a sensing current from each of the electrode layers less flows to the multilayer film formed below the second antiferromagnetic layers and the ferromagnetic layers having the extending portions, but the sensing current flows to the central portion of the free magnetic layer at the shortest distance and the portion below the central portion.

The track width Tw is controlled by the width dimension between the ferromagnetic layers in the track width direction.

As described above, in the present invention, the distance between the second antiferromagnetic layers in the track width direction can be increased to be greater than the track width Tw controlled by the distance between the ferromagnetic layers, and the inner ends of the electrode layers are overlapped with the extending portions of the ferromagnetic layers, which extend from the second antiferromagnetic layers to the center in the track width direction. Therefore, the sensing current can be appropriately flowed to the central portion of the free magnetic layer with a small shunt loss. Furthermore, the central portion of the free magnetic layer is not subjected to exchange coupling due to the RKKY interaction with the ferromagnetic layers, and thus magnetic reversal occurs in the central portion with high sensitivity, resulting in an improvement in reproduced output.

Furthermore, each of the extending portions of the ferromagnetic layers, which extend from the inner ends of the second antiferromagnetic layers to the center in the track width direction, has a so-called synthetic ferrimagnetic structure comprising the free magnetic layer formed below the ferromagnetic layers through the nonmagnetic intermediate layer. Therefore, sensitivity to the external magnetic field can be effectively lowered by exchange coupling due to the RKKY interaction between the ferromagnetic layers and the free magnetic layer, and thus magnetic reversal in the extending portions can be effectively made less sensitive to the external magnetic field. As a result, it is possible to appropriately suppress widening of an effective reproducing track, and suppress the occurrence of side reading, as compared with the conventional example shown in FIG. 25.

As described above, the magnetic detecting element can increase reproduced output even with a narrower track, and widening of the effective reproducing track width can be suppressed to appropriately suppress the occurrence of side reading. It is thus possible to provide a magnetic detecting element capable of effectively improving reproducing characteristics even with a higher recording density, as compared with a conventional element.

In one construction of the magnetic detecting element, stopper layers are preferably provided to extend from the respective second antiferromagnetic layers to the extending portions of the ferromagnetic layers, with the electrode layers being formed on the stopper layers.

Each of the electrode layers may comprise a first electrode layer formed on each of the second antiferromagnetic layers, and a second electrode layer formed to extend from the inner ends of the first electrode and of each second antiferromagnetic layer to the extending portion of each ferromagnetic layer. This makes it easy to form the symmetrical overlap lengths of the electrode layers (second electrode layers) in the track width direction.

The first and second electrode layers are preferably formed separately.

In various implementations of the magnetic detecting element, the first and second electrode layers may be made of different nonmagnetic conductive materials.

Furthermore, the first electrode layer is preferably made of a material having lower ductility than that of the second electrode layer. When both the first and second electrode layers are made of a high-ductility soft material such as Au or the like, smearing occurs in the electrode layers by, for example, polishing at the time of slider processing, to cause a short-circuit between the electrode layers and an upper shield layer or a lower shield layer, thereby damaging the reproducing function of the magnetic detecting element. It is important that the second electrode layers having the overlap portions have high conductivity. Although Au having high conductivity has high ductility, the first electrode layers may be made of a material with lower conductivity than the second electrode layers because the reproducing characteristics less deteriorate from the structural viewpoint. Also, the formation region of the first electrode layers is larger than that of the second electrode layers. Therefore, when the first electrode layers are made of a material having lower ductility than the second electrode layers, the occurrence of smearing can be effectively suppressed.

The first electrode layers are preferably made of an alloy material composed of Au and at least one of Pd, Cr, and Cu, or at least one of Cr, Rh, Ru, Ta, and W, and the second electrode layers are preferably made of at least one of Au, Cu, and Ag.

The stopper layers are preferably formed to extend from the inner ends of the first electrode layers and of the second antiferromagnetic layers to the extending portions of the ferromagnetic layers, the second electrode layers being formed on the stopper layers.

Further, the stopper layers are preferably formed between the first electrode layers and the second antiferromagnetic layers.

The stopper layers are preferably made of a material having a lower etching rate than the electrode layers. Specifically, the stopper layers are preferably composed of at least one element of Ta, Cr, V, Nb, Mo, W, Fe, Co, Ni, Pt, and Rh.

In one implementation, the stopper layers may comprise a Cr layer, and a Ta layer may be laminated thereon.

As constructed by one preferred approach, the second antiferromagnetic layers may have thin portions formed to extend from the bottoms of the inner end surfaces to the extending portions of the ferromagnetic layers.

Furthermore, the central portion of the free magnetic layer is exposed in the distance between the ferromagnetic layers, and a specular layer is preferably formed on the exposed portion of the free magnetic layer.

Also, an insulating layer made of an insulating material may be formed in place of each of the electrode layers, and the electrode layers may be formed above and below the multilayer film in the thickness direction. This type of magnetic detecting element is referred to as a "current perpendicular to the plane (CPP) type".

In a preferred implementation of the various layers, the synthetic magnetic moment (Net Mst) per unit area obtained by subtracting the magnetic moment (Ms·t) per unit area of the ferromagnetic layers from the magnetic moment (Ms·t) per unit area of the free magnetic layer is preferably more than 0 T·nm and 2.6 T·nm or less. According to the experiments described below, by setting the synthetic magnetic moment Net Mst in the above range, the reproduction sensitivity of the overlap portions between the free magnetic layer and the ferromagnetic layers in the thickness direction can be appropriately decreased. Specifically, the reproduction sensitivity $\{\Delta V (\pm 100 \text{ Oe})/\Delta V (\pm 4000 \text{ Oe})\}$ can be decreased to 0.2 or less.

Also, the reason for setting the synthetic magnetic moment Net Mst to a plus value, i.e., setting the magnetic moment per unit area of the free magnetic layer to a larger value than that of the ferromagnetic layers, is to improve the stability of a reproduced waveform, and properly facilitate a magnetic field annealing step for controlling the magnetization direction of the free magnetic layer.

In one desirable construction, the thickness difference obtained by subtracting the thickness (t) of the ferromagnetic layers from the thickness (t) of the free magnetic layer is preferably 0 Å to 30 Å. According to the experiments described below, by setting the thickness difference in the above range, the reproduction sensitivity of the overlap portions between the free magnetic layer and the ferromagnetic layers in the thickness direction can be appropriately decreased. Specifically, the reproduction sensitivity $\{\Delta V (\pm 100 \text{ Oe})/\Delta V (\pm 4000 \text{ Oe})\}$ can be decreased to 0.2 or less. Also, when the thickness of the free magnetic layer is larger than that of the ferromagnetic layers, the same effect as that obtained by setting the Net Mst to a plus value can be obtained.

One version of a method of manufacturing a magnetic detecting element comprises the following steps:

(a) A step of laminating in turn a first antiferromagnetic layer, a pinned magnetic layer, a nonmagnetic material layer, a free magnetic layer, a nonmagnetic intermediate layer and a ferromagnetic layer on a substrate from below to form a multilayer film.

(b) A step of forming second antiferromagnetic layers on both side portions of the upper surface of the multilayer film in the track width direction.

(c) A step of forming an electrode layer on the multilayer film and the second antiferromagnetic layers, forming mask layers with a distance apart, which is smaller than the distance between the second antiferromagnetic layers in the track width direction, on the electrode layer, and then removing the electrode layer from a portion not covered with the mask layers.

(d) A step of removing a portion of the ferromagnetic layer, which is exposed by removing the electrode layer, to leave the ferromagnetic layer on both side portions of the free magnetic layer through the nonmagnetic intermediate layer so that the ferromagnetic layer has portions extending from the inner ends of the respective second antiferromagnetic layers to the center in the track width direction, leaving the electrode layer on the second antiferromagnetic layers and the extending portions of the ferromagnetic layer.

In a particular implementation of the method of manufacturing the magnetic detecting element, the second antiferromagnetic layers can be formed with a distance apart in the track width direction, which is larger than the track width Tw controlled by the distance between the ferromagnetic layers in the track width direction, and the electrode layer can be formed to overlap with the extending portions of the ferromagnetic layer, which extend from the respective second antiferromagnetic layers to the center in the track width direction. Furthermore, the ferromagnetic layers can be easily appropriately formed only on both side portions of the free magnetic layer through the nonmagnetic intermediate layer to form a synthetic ferrimagnetic structure.

In step (c), a stopper layer preferably is formed on the multilayer film and the second antiferromagnetic layers before the electrode layer is formed, and then the electrode layer is formed on the stopper layer.

In the step (c), preferably, the electrode layer is removed until the stopper layer is exposed, and in the step (d), the exposed portion of the stopper layer is removed, and then the exposed portion of the ferromagnetic layer is removed.

By forming the stopper layer, over etching can be prevented by the stopper layer in the step (c) in which the exposed portion of the electrode layer is removed. Then, ion milling is controlled by monitoring with, for example, a SIMS analyzer incorporated in an ion milling apparatus so that ion milling is stopped at an end point of ion milling, i.e., at the moment that removal of the ferromagnetic layer is started, thereby minimizing the influence of ion milling on the central portion of the free magnetic layer formed below the ferromagnetic layers.

One method of manufacturing a magnetic detecting element also includes the following steps:

(e) A step of laminating in turn a first antiferromagnetic layer, a pinned magnetic layer, a nonmagnetic material layer, a free magnetic layer, a nonmagnetic intermediate layer and a ferromagnetic layer on a substrate from below to form a multilayer film.

(f) A step of forming second antiferromagnetic layers and first electrode layers on both side portions of the upper surface of the multilayer film in the track width direction.

(g) A step of forming a second electrode layer on a region ranging from the multilayer film to the inner ends of the second antiferromagnetic layers and of the first electrode layers in the track width direction, and to the tops of the first electrode layers.

(h) A step of removing a portion of the second electrode layer, which is formed on the multilayer film, and removing a portion of the ferromagnetic layer, which is exposed by removing the second electrode layer, to leave the ferromagnetic layer on both side portions of the free magnetic layer through the nonmagnetic intermediate layer so that the ferromagnetic layer has portions extending from the inner ends of the respective second antiferromagnetic layers to the center in the track width direction, leaving the second electrode layer on a region ranging from the inner ends of the first electrode layers and of the second antiferromagnetic layers to the extending portions of the ferromagnetic layer.

In the above-described method of manufacturing the magnetic detecting element, the second antiferromagnetic layers can be formed with a distance apart in the track width direction, which is larger than the track width Tw controlled by the distance between the ferromagnetic layers in the track width direction, and the second electrode layer can be formed to overlap with the extending portions of the ferromagnetic layer, which extend from the respective second antiferromagnetic layers to the center in the track width direction. Furthermore, the ferromagnetic layers can be easily appropriately formed only on both side portions of the free magnetic layer through the nonmagnetic intermediate layer to form a synthetic ferrimagnetic structure. Also, in this manufacturing method, the overlap portions of the second electrode layer can be easily formed to be symmetrical in the track width direction, and thus a magnetic detecting element capable of further improving reproduced output and suppressing the occurrence of side reading can be manufactured.

In the step (g) of forming the second electrode layer, the second electrode layer is preferably deposited at a sputtering angle with respect to a direction perpendicular to the substrate so that the portions of the second electrode, which are formed on the inner ends, are thicker than the portions of the second electrode layer, which are formed on the multilayer film and on the first electrode layers.

It is desirable to change the thickness of the second electrode layer according to positions during sputtering deposition. As described above, in depositing the second electrode layer, the portions of the second electrode, which are formed on the inner end surfaces, must be thicker than the portions of the second electrode layer, which are formed on the multilayer film and on the first electrode layers.

Although the portion of the second electrode layer, which is formed on the multilayer film, is removed in the step (h), the portions of the second electrode layer, which are formed on the inner end surfaces, are also removed in this step. The portions of the second electrode layer that are formed on the inner end surfaces, however, must ultimately remain. If the portions of the second electrode formed on the inner end surfaces are thinner than the portion of the second electrode layer formed on the multilayer film, those portions of the second electrode formed on the inner end surfaces are possibly removed earlier than the portion of the second electrode layer formed on the multilayer film. Therefore the second electrode layer is deposited at the sputtering angle with respect to the direction perpendicular to the substrate so that the portions of the second electrode, which are formed on the inner end surfaces, are thicker than the portions of the second electrode layer, which are formed on the multilayer film and on the first electrode layers.

In the step (h) of removing the portion of the second electrode layer, which is formed on the multilayer film, the milling angle is preferably closer to a right angle than the sputtering angle of formation of the second electrode layer.

As a result, the central portion of the second electrode layer, which is formed on the multilayer film, can be appropriately removed, and the portions of the second electrode, which are formed on the inner end surfaces, can be left with a predetermined thickness, thereby permitting the precise formation of the overlap portions of the electrode layer, which are equal in thickness in the track width direction.

Therefore, the portion of the second electrode layer, which is formed on the multilayer film, can be appropriately removed, and the portions of the second electrode, which are formed on the inner end surfaces, can be left with a predetermined thickness, thereby permitting the precise formation of the overlap portions of the electrode layer, which are equal in thickness in the track width direction.

In the step (g), a stopper layer preferably is formed on a region ranging from the multilayer film to the inner end surfaces and further to the first electrode layers before the second electrode layer is formed, and then the second electrode layer is formed on the stopper layer.

In the step (h), preferably, the portion of the second electrode layer, which is formed on the multilayer film, is removed until the stopper layer is exposed, the portion of the stopper layer, which is exposed by removing the second electrode layer, is removed, and then the exposed portion of the ferromagnetic layer is removed.

By forming the stopper layer, over etching can be prevented by the stopper layer in the step (h) in which a portion of the second electrode layer is removed. Then, ion milling is controlled by monitoring with, for example, a SIMS analyzer incorporated in an ion milling apparatus so that ion milling is stopped at an end point of ion milling, i.e., at the moment that removal of the ferromagnetic layer is started, thereby minimizing the influence of ion milling on the central portion of the free magnetic layer formed below the ferromagnetic layer.

The stopper layer is preferably made of a material having a lower etching rate than that of the electrode layer. More specifically, the stopper layer is preferably made of at least one element of Ta, Cr, V, Nb, Mo, W, Fe, Co, Ni, Pt, and Rh.

In one embodiment, the stopper layer may comprise a Cr layer, and a Ta layer may be laminated thereon.

In the step (b) or (f), an antiferromagnetic layer thinner than the second antiferromagnetic layers may be left between the second antiferromagnetic layers in the track width direction so as to be combined with the second antiferromagnetic layers. Also, in the step (d) or (h), the portions of the antiferromagnetic layer, which are exposed by removing the electrode or second electrode layer, may be removed to leave thin portions extending from the bottoms of the inner end surfaces of the respective second antiferromagnetic layers to the extending portions of the ferromagnetic layers. As described above, in the step (b) or (f), the antiferromagnetic layer thinner than the second antiferromagnetic layers is left between the second antiferromagnetic layers in the track width direction so as to be combined with the second antiferromagnetic layers, thereby avoiding the influence of etching on the ferromagnetic layers formed below the second antiferromagnetic layers.

In an alternative method of manufacturing the magnetic detecting element, an insulating layer and electrode layers may be formed above and below the multilayer film in the thickness direction instead of the electrode layer formed in the step (c), the first electrode layers formed in the step (f), and the second electrode layer formed in the step (g).

The method of manufacturing the magnetic detecting element can also be applied to a CPP (Current Perpendicular to the Plane) type magnetic detecting element.

The magnetic moment (Ms·t) per unit area of each of the free magnetic layer and the ferromagnetic layers is preferably controlled so that the synthetic magnetic moment (Net Mst) per unit area obtained by subtracting the magnetic moment (Ms·t) per unit area of the ferromagnetic layers from the magnetic moment (Ms·t) per unit area of the free magnetic layer is more than 0 T·nm and 2.6 T·nm or less.

The thickness (t) of each of the free magnetic layer and the ferromagnetic layers is preferably controlled so that the thickness difference obtained by subtracting the thickness (t) of the ferromagnetic layers from the thickness (t) of the free magnetic layer is 0 Å to 30 Å.

As described above, by setting the synthetic magnetic moment Net Mst in the predetermined range and the thickness difference in the predetermined range, magnetic field annealing can be appropriately performed for controlling the magnetization directions of the free magnetic layer and the ferromagnetic layer, thereby facilitating control of the magnetizations of the free magnetic layer and the ferromagnetic layer.

DESCRIPTION OF THE PREFERRED EMBODIMENTS

Figure 1:
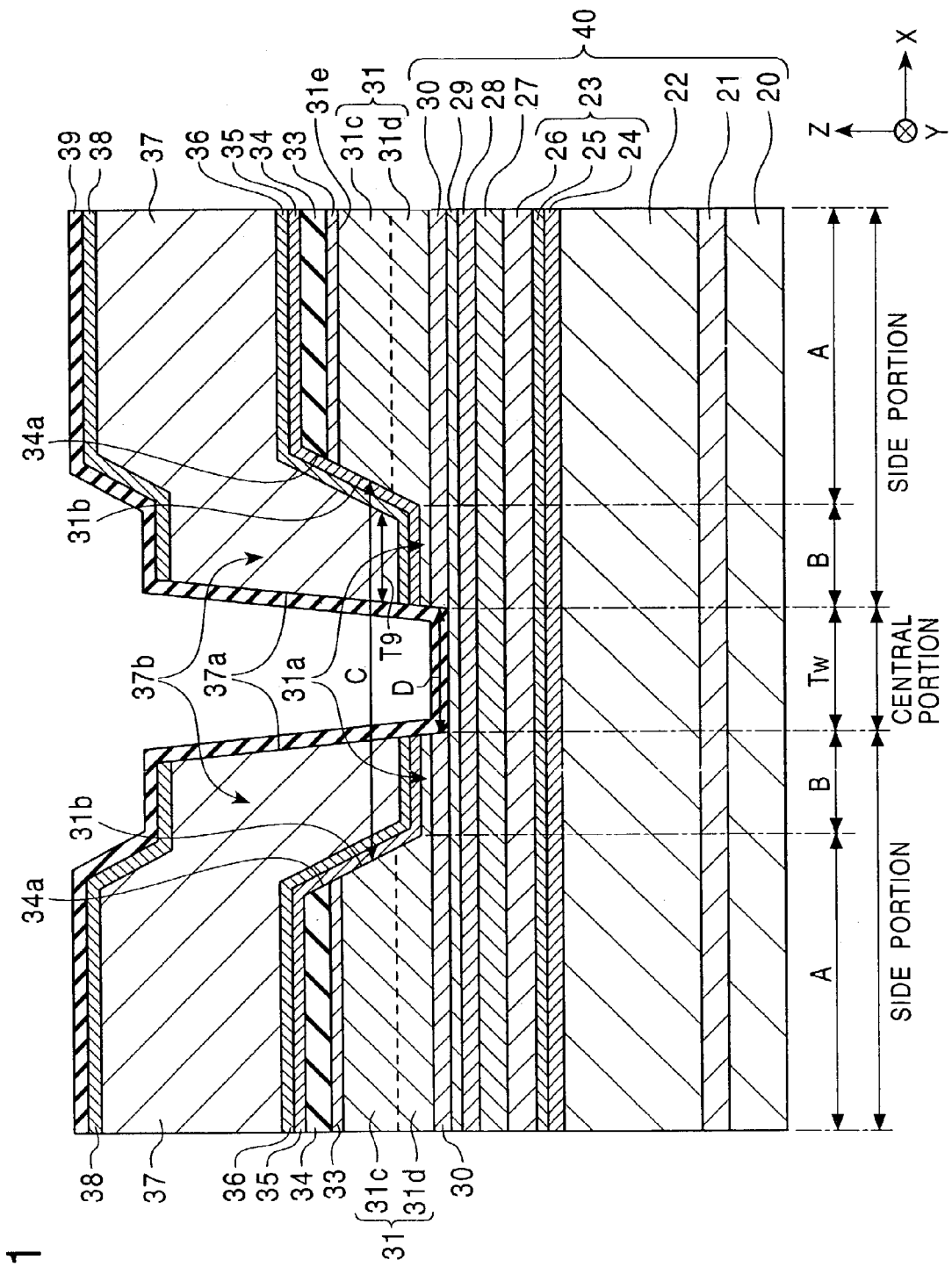
FIG. 1 is a partial sectional view of a structure of a first embodiment of a magnetic detecting element, as viewed from a side facing a recording medium.

FIG. 1 is a partial sectional view of one embodiment of a structure of a magnetic detecting element (spin-valve thin film element), as viewed from a side facing a recording medium.

In FIG. 1, reference numeral 20 denotes a substrate on which a seed layer 21 made of a NiFe alloy, a NiFeCr alloy, or Cr is formed. The seed layer 21 comprises, for example, $(Ni_{0.8}Fe_{0.2})_{60at\%}Cr_{40at\%}$ and has a thickness of 60 Å.

A first antiferromagnetic layer 22 is formed on the seed layer 21. The first antiferromagnetic layer 22 is made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

By using such an alloy for the first antiferromagnetic layer 22, heat treatment of the first antiferromagnetic layer 22 can produce an exchange coupling film producing a great exchange coupling magnetic field and comprising the first antiferromagnetic layer 22 and a pinned magnetic layer 23. Particularly, the use of the PtMn alloy can produce an excellent exchange coupling film comprising the first antiferromagnetic layer 22 and the pinned magnetic layer 23, and having an exchange coupling magnetic field of 48 kA/m or more, for example, over 64 kA/m, and a blocking temperature of as high as 380° C. at which the exchange coupling magnetic field is lost.

These alloys have a disordered face-centered cubic structure (fcc) immediately after deposition, but the fcc structure is transformed into a CuAuI-type ordered face-centered tetragonal structure (fct) by heat treatment.

The thickness of the first antiferromagnetic layer 22 is 80 Å to 300 Å near the center in the track width direction.

The pinned magnetic layer 23 is formed on the antiferromagnetic layer 22. The pinned magnetic layer 23 has a synthetic ferrimagnetic structure comprising the three layers including magnetic layers 24 and 26, and a nonmagnetic intermediate layer 25 interposed therebetween.

Each of the magnetic layers 24 and 26 is made of a magnetic material, for example, a NiFe alloy, Co, a CoNiFe alloy, a CoFe alloy, a CoNi alloy, or the like. The magnetic layers 24 and 26 are preferably made of a same material.

The nonmagnetic intermediate layer 25 is made of a nonmagnetic material, for example, one of Ru, Rh, Ir, Cr, Re, and Cu, or an alloy of at least two of these elements. Particularly, the nonmagnetic intermediate layer 25 is preferably made of Ru.

Furthermore, a nonmagnetic material layer 27 is formed on the pinned magnetic layer 23. The nonmagnetic material layer 27 is a layer through which a sensing current mainly flows, and a layer for preventing magnetic coupling between the pinned magnetic layer 23 and a free magnetic layer 28. The nonmagnetic material layer 27 is preferably made of a nonmagnetic material with conductivity, such as Cu, Cr, Au, Ag, or the like. Particularly, the nonmagnetic material layer 27 is preferably made of Cu.

The free magnetic layer 28 is formed on the nonmagnetic material layer 27. In the embodiment shown in FIG. 1, a nonmagnetic intermediate layer 29 is formed over the entire surface of the free magnetic layer 28. The free magnetic layer 28 is made of a magnetic material such as a NiFe alloy, or the like. In the embodiment shown in FIG. 1, an anti-diffusion layer (not shown in the drawing) composed of Co or CoFe may be formed between the free magnetic layer 28 and the nonmagnetic material layer 27.

In the embodiment shown in FIG. 1, ferromagnetic layers 30 are formed on both side portions of the free magnetic layer 28 through the nonmagnetic intermediate layer 29. The ferromagnetic layers 30 are preferably made of an existing magnetic material such as a NiFe alloy, a CoFe alloy, a CoFeNi alloy, Co, or the like.

Hereinafter, a laminate ranging from the substrate 20 to the ferromagnetic layers 30 is referred to as a "multilayer film 40".

Furthermore, second antiferromagnetic layers 31 are formed on the ferromagnetic layers 30. Like the first antiferromagnetic layer 22, the second antiferromagnetic layers 31 are preferably made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

In FIG. 1, a dotted line is shown in each of the second antiferromagnetic layers 31, a portion above the dotted line being denoted by reference numeral 31c, and a portion below the dotted line being denoted by reference numeral 31d. This means that the second antiferromagnetic layers 31 are divided into two layers in the manufacturing method described below. However, in the completed second antiferromagnetic layers 31, a clear boundary is not present between the upper and lower portions 31c and 31d.

In the embodiment shown in FIG. 1, the portions of the second antiferromagnetic layers 31 that are formed on the ferromagnetic layers 30 in regions A (simply referred to as "regions A" hereinafter) in both side portions of the element, apart form the central portion are thicker than the portions of the second antiferromagnetic layers 31 that are formed on the ferromagnetic layers 30 in regions B (simply referred to as "regions B" hereinafter) near the central portion. Hereinafter, the portions of the second antiferromagnetic layers 31 that are formed in the regions B, are referred to as "the inner ends 31a" of the second antiferromagnetic layers 31.

As shown in FIG. 1, the inner end surfaces 31b of the portions of the second antiferromagnetic layers 31 that are formed on the regions A, are inclined or curved so that the distance C between the second antiferromagnetic layers 31 in the track width direction gradually increases in the upward direction (the Z direction shown in the drawing). Furthermore, a first stopper layer 33 made of, for example, Cr or the like is formed on the upper surface 31e of each of the portions of the second antiferromagnetic layers 31 that are formed in the regions A, and a first protective layer 34 made of Ta or the like is formed on the first stopper layer 33. The inner end surfaces 34a of the first protective layers 34 are continued from the inner end surfaces 31b of the second antiferromagnetic layers 31.

In the embodiment shown in FIG. 1, in either side portion of the element, a second stopper layer 35 made of Cr or the like is formed on the first protective layer 34, the inner end surfaces 34a and 31b of the first protective layer 34 and the second antiferromagnetic layer 31, and the inner end 31a of the second antiferromagnetic layer 31. A second protective layer 36 made of Ta or the like is formed on the second stopper layer 35.

In the embodiment shown in FIG. 1, electrode layers 37 are formed on the respective second protective layers 36. The electrode layers 7 are preferably made of a nonmagnetic conductive material such as Au, Cr, Rh, Ru, Ta, W, or the like.

The electrode layers 37 are formed to overlap not only with the portions of the second antiferromagnetic layers 31 that are formed in the regions A, but also with the portions of the ferromagnetic layers 30 that are formed in the regions B, through the inner ends 31a of the second antiferromagnetic layers 31, the second stopper layers 35 and the second protective layers 36.

The inner end surfaces 37a of the electrode layers 37 are formed as surfaces continued from the inner end surfaces of the ferromagnetic layers 30, the inner ends 31a of the second antiferromagnetic layers 31, and the inner end surfaces of the second stopper layers 35 and the second protective layers 36. In the embodiment shown in FIG. 1, the inner end surface 37a of the electrode layers 37 are inclined or curved so that the distance between the electrode layers 37 in the track width direction gradually increases in the upward direction (the Z direction shown in the drawing). However, the inner end surfaces 37a of the electrode layers 37 may be formed in the direction (the Z direction) perpendicular to the surface of the substrate 20.

Furthermore, third protective layers 38 made of Ta or the like are formed on the electrode layers 37, and fourth protective layers 39 are formed on the third protective layers 38, the inner end surfaces 37a of the electrode layers 37, and the portion of the nonmagnetic intermediate layer 29 that is exposed in the distance D between the ferromagnetic layers 30. The fourth protective layers 39 are made of an insulating material such as $Al_2O_3$, $SiO_2$, or the like, so that the fourth protective layers 39 function as upper gap layers. Also, the fourth protective layers 39 can be caused to function as specular layers, as described below.

The characteristics of the embodiment shown in FIG. 1 will be described below. In the magnetic detecting element shown in FIG. 1, the ferromagnetic layers 30 are formed on both side portions of the free magnetic layer 28 through the nonmagnetic intermediate layer 29. The second antiferromagnetic layers 31 are formed on the ferromagnetic layers 30 at a distance C apart, which is larger than the distance D between the ferromagnetic layers 30 in the track width direction (the X direction).

In each of both side portions of the element, the portion of the second antiferromagnetic layer 31 that is formed in the region A is formed to a large thickness. Thus, in region A the magnetization of the ferromagnetic layer 30 overlapped by the portion of the second antiferromagnetic layer 31 in the thickness direction (the Z direction) is strongly pinned in the track width direction (the X direction) by an exchange coupling magnetic field produced between the ferromagnetic layer 30 and the second antiferromagnetic layer 31. In those portions of the free magnetic layer 28 facing in the thickness direction toward the ferromagnetic layer 30 with the pinned magnetization in each of the regions A, magnetization is pinned in a direction opposite to the magnetization direction of the ferromagnetic layer 30. This opposed pinning occurs by exchange coupling due to a Ruderman-Kittel-Kasuya-Yosida (RKKY) interaction produced between the free magnetic layer 28 and the ferromagnetic layer 30.

On the other hand, in each of the regions B, the extending portion of the ferromagnetic layer 30, which extends from the inner end surface 31b of the second antiferromagnetic layer 31 toward the center in the track width direction (the X direction), and the free magnetic layer 28 facing the ferromagnetic layer 30 are subjected not only to a bias magnetic field through an exchange interaction in the ferromagnetic layer 30 and the free magnetic layer 28, but also to exchange coupling due to a RKKY interaction produced between the ferromagnetic layer 30 and the free magnetic layer 28. In each of the regions B, therefore, sensitivity of the ferromagnetic layer 30 and the free magnetic layer 28 can be further lowered to zero, as described below.

The ferromagnetic layer 30 is not formed on the central portion of the free magnetic layer 28 with the nonmagnetic intermediate layer 29 provided therebetween in the thickness direction. Therefore, the central portion of the free magnetic layer 28 is subjected only to the bias magnetic field through the exchange interaction in the magnetic layer, and is not subjected to exchange coupling due to the RKKY interaction with the ferromagnetic layer 30. Therefore, the central portion of the free magnetic layer 28 is weakly put into a single magnetic domain state to an extent which permits magnetic reversal with high sensitivity to an external magnetic field.

As shown in FIG. 1, in each of the regions B, the inner end 37b of the electrode layer 37 is formed to overlap with the extending portion of the ferromagnetic layer 30, which extends from the inner end surface 31b of the second antiferromagnetic layer 31 toward the center in the track width direction (the X direction), through the inner end 31a of the second antiferromagnetic layer 31. Therefore, a sensing current from the electrode layers 37 is not shunted to the entire region of the multilayer film 40 positioned below the second antiferromagnetic layers 31 and the ferromagnetic layers 30 in both end portions of the element. Rather, such a sending current is caused to flow from the overlap portions (the inner ends 37b) of the electrode layers 37 to the central portion of the free magnetic layer 28 and to the central portion of the multilayer film 40 at the shortest distance.

In the embodiment shown in FIG. 1, therefore, the distance C between the second antiferromagnetic layers 31 in the track width direction can be widened to be larger than the track width Tw controlled by the distance D between the bottoms of the ferromagnetic layers 30. Also, the inner ends 37b of the electrode layers 37 overlap in the regions B with the extending portions of the ferromagnetic layers 30, which extend from the respective second antiferromagnetic layers 31 toward the center in the track width direction. Therefore, the sensing current can be effectively caused to flow to the central portion of the free magnetic layer 28 while suppressing a shunt of the sensing current. Furthermore, the central portion of the free magnetic layer 28 is not subjected to exchange coupling due to the RKKY interaction with the ferromagnetic layers 30, thereby permitting magnetic reversal with high sensitivity in the central portion of the free magnetic layer 28, and thereby improving reproduced output.

Furthermore, in each of the regions B, the extending portion of the ferromagnetic layer 30, which extends from the second antiferromagnetic layer 31 toward the center in the track width direction, preferably has a synthetic ferrimagnetic structure with the free magnetic layer 28 formed below the extending portion through the nonmagnetic intermediate layer 29. Therefore, exchange coupling is produced between each of the ferromagnetic layers 30 and the free magnetic layer 28 due to the RKKY interaction, and consequently, the sensitivity of the ferromagnetic layer 30 and the free magnetic layer 28 in each of the regions B to the external magnetic field can be effectively decreased, thereby effectively suppressing magnetic reversal in each of the regions B even with the external magnetic field applied thereto. Therefore, widening of the effective reproducing track width can be appropriately suppressed to suppress the occurrence of side reading, as compared with the conventional example shown in FIG. 25.

As described above, the magnetic detecting element shown in FIG. 1 is capable of improving reproduced output even with a narrower track, and suppressing widening of the effective reproducing track width to appropriately suppress the occurrence of side reading. It is thus possible to provide a magnetic detecting element capable of effectively improving reproducing characteristics even with a higher recording density, as compared with a conventional magnetic detecting element.

Other characteristics of the embodiment shown in FIG. 1 will be described below. In the embodiment shown in FIG. 1, in each of both side portions of the element, the ferromagnetic layer 30 and the free magnetic layer 28 with the nonmagnetic intermediate layer 29 provided therebetween form the synthetic ferrimagnetic structure. The nonmagnetic intermediate layer 29 is preferably made of at least one element of Ru, Rh, Ir, Cr, Re, and Cu.

In order to obtain the appropriate synthetic ferrimagnetic structure, the magnetic moments (saturation magnetization Ms x thickness t) per unit area of the ferromagnetic layer 30 and the free magnetic layer 28 must be set to different values for making the magnetizations of the ferromagnetic layer 30 and the free magnetic layer 28 antiparallel to each other and perpendicular to the magnetization of the pinned magnetic layer 23.

As described above, the sensitivity of the regions B in both side portions can be lowered by forming the synthetic ferrimagnetic structure. However, the sensitivity can be possibly further effectively lowered by appropriately controlling the magnetic moment per unit area.

The experiments described below indicate that when the synthetic magnetic moment (Net Mst) per unit area obtained by subtracting the magnetic moment per unit area of the ferromagnetic layer 30 from the magnetic moment per unit area of the free magnetic layer 28 is controlled in the range of −6 T·nm to 2.6 T·nm, an absolute value of reproducing sensitivity {ΔV (±100 Oe)/ΔV (±4000 Oe)} can be suppressed to 0.2 or less.

The reproducing sensitivity {ΔV (±100 Oe)/ΔV (±4000 Oe)} represents a ratio of a voltage difference (ΔV) with external magnetic fields of ±100 Oe (an external magnetic field of +100 Oe represents the direction and intensity of an external magnetic field, for example, in the height direction, and an external magnetic field of −100 Oe represents the direction and intensity of an external magnetic field, for example, in the direction opposite to the height direction) to a voltage difference (ΔV) with external magnetic fields of ±4000 Oe (an external magnetic field of +4000 Oe represents the direction and intensity of an external magnetic field, for example, in the height direction, and an external magnetic field of −4000 Oe represents the direction and intensity of an external magnetic field, for example, in the direction opposite to the height direction). The smaller the absolute value of this ratio becomes, the smaller the reproducing sensitivity becomes.

The reason for setting the absolute value of reproducing sensitivity {ΔV (±100 Oe)/ΔV (±4000 Oe)} to 0.2 or less is that according to the results of the experiments described below, the relationship between the synthetic magnetic moment (Net Mst) and reproducing sensitivity {ΔV (±100 Oe)/ΔV (±4000 Oe)} has an inflection point at a value of 0.2, and side reading can be suppressed to a practical level by suppressing the reproducing sensitivity to 0.2 or less. The "practical level" represents a level of ¼ or less of about 0.8 of the reproducing sensitivity of the central portion of the free magnetic layer 28. In this level, side reading can be effectively suppressed to permit the actual use as a product. That is, the reproducing sensitivity of 0.2 or less is a practical level at which side reading can be suppressed.

The synthetic magnetic moment (Net Mst) is preferably more than 0 T·nm and 2.6 T·nm or less. The reason for excluding a synthetic magnetic moment of 0 T·nm is that the synthetic magnetic moment of 0 T·nm means that the magnetic moment per unit area of the free magnetic layer 28 is the same value as that of the ferromagnetic layer 30. In this case, it is impossible to determine which of the free magnetic layer 28 and the ferromagnetic layer 30 is a dominant layer to be strongly influenced by a magnetic field in magnetic field annealing (i.e., a layer in which magnetization is oriented in the magnetic field direction during magnetic field annealing). Therefore, it is difficult to control the magnetizations of the free magnetic layer 28 and the ferromagnetic layer 30 to be antiparallel to each other and to cross the magnetization direction of the pinned magnetic layer 23. Therefore the synthetic magnetic moment of 0 T·nm is excluded from a preferred range.

Also, the reason for setting the synthetic magnetic moment to a plus value is that a value of spin flop magnetic field Hsf corresponding to a plus synthetic magnetic moment more rapidly increases than that corresponding to a minus synthetic magnetic moment, and thus a wide margin can easily be set in the magnetic field strength in magnetic field annealing for controlling the magnetizations of the free magnetic layer 28 and the ferromagnetic layer 30. Also, the magnetization directions of the free magnetic layer 28 and the ferromagnetic layer 30 can be easily appropriately controlled to be antiparallel to each other and to cross the magnetization direction of the pinned magnetic layer 23. Furthermore, when the synthetic magnetic moment is set to a minus value, a dipole magnetic field (static magnetic field) leaking from the inner ends of the ferromagnetic layers 30 to the free magnetic layer 28 is increased, and the static magnetic field exerts in the direction opposite to the magnetization direction of the free magnetic layer 28, thereby easily causing distortion and instability in a reproduced waveform. Therefore the synthetic magnetic moment preferably is set to a plus value.

It is conventionally thought that the synthetic magnetic moment is decreased by setting the magnetic moments per unit area of two ferromagnetic layers constituting a synthetic ferrimagnetic structure to substantially the same value, and thus sensitivity of the free magnetic layer 28 can be improved by applying the synthetic ferrimagnetic structure with the small synthetic magnetic moment to the free magnetic layer. However, as a result of repeated experiments using an exchange bias structure, it has been found that when the synthetic magnetic moment is decreased to some extent, the sensitivity is decreased.

Therefore, on the basis of the experiment results, a method has been found in which the synthetic magnetic moment of the ferromagnetic layer 30 and the free magnetic layer 28 in each region B desired to be decreased in sensitivity is decreased to more than 0 T·nm and 2.6 T·nm or less to decrease the sensitivity in the regions B to 0.2 or less, and the central portion of the element comprises only the free magnetic layer 28 without having the synthetic ferrimagnetic structure, thereby improving the sensitivity of the central portion of the free magnetic layer 28.

The synthetic magnetic moment is measured by a method in which the thickness of each of the free magnetic layer 28 and the ferromagnetic layers 30 is measured by a transmission electron microscope (TEM), and the material compositions of the free magnetic layer 28 and the ferromagnetic layers 30 are measured by an energy dispersive X-ray analyzer (EDX) provided on the transmission electron microscope. The saturation magnetizations Ms of the free magnetic layer 28 and the ferromagnetic layers 30 are estimated from the material compositions by referring to documents and the like, and the magnetic moment per unit area of each layer is calculated by multiplying the thickness t by the saturation magnetization Ms to determine the synthetic magnetic moment.

According to the experiments described below, it was also found that when the thickness difference obtained by subtracting the thickness (t) the ferromagnetic layer 30 from the thickness (t) of the free magnetic layer 28 is set to −30 Å to 30 Å, the absolute value of reproducing sensitivity {ΔV (±100 Oe)/ΔV (±4000 Oe)} can be suppressed to 0.2 or less.

However, with a minus value of thickness difference, the same problem as with a minus value of synthetic magnetic moment per unit area easily occurs, and thus the thickness difference is preferably a plus value. The thickness difference is therefore preferably set to 0 Å to 30 Å. Consequently, the absolute value of reproducing sensitivity {ΔV (±100 Oe)/ΔV (±4000 Oe)} can be suppressed to 0.2 or less, the magnetizations of the free magnetic layer 28 and the ferromagnetic layers 30 can be easily appropriately controlled, and a reproduced waveform can be stabilized.

The thickness difference between the free magnetic layer 28 and the ferromagnetic layers 30 is a parameter for determining the synthetic magnetic moment, and is thus related to the value of the synthetic magnetic moment. The value of the synthetic magnetic moment decreases as the thickness difference decreases. Since the saturation magnetization Ms is also necessary as a parameter for determining the synthetic magnetic moment, the synthetic magnetic moment cannot be determined directly only by the thickness difference. However, each of the free magnetic layer 28 and the ferromagnetic layers 30 is generally made of a ferromagnetic material mainly composed of Fe, Co and Ni, and each of the free magnetic layer 28 and the ferromagnetic layers 30 is preferably formed by using a ferromagnetic material mainly composed of Fe, Co and Ni to determine a preferred thickness difference in experiments. Therefore, in a magnetic detecting element having the same thickness difference as the preferred thickness difference, the sensitivity of the regions B can be lowered to suppress the occurrence of side reading, if the free magnetic layer 28 and the ferromagnetic layers 30 are formed by using these materials.

Furthermore, in the embodiment shown in FIG. 1, the second antiferromagnetic layers 31 have the inner ends 31a thinner than the portions formed in the regions A and extending from the bottoms of the inner end surfaces 31b to the portions of the ferromagnetic layers 30 formed in the regions B. Although the inner ends 31a of the second antiferromagnetic layers 31 are not necessarily formed, the inner ends 31a are preferably formed for preventing the influence of ion milling on the layers below the inner ends 31a in the method of manufacturing the magnetic detecting element described below.

Figure 24:
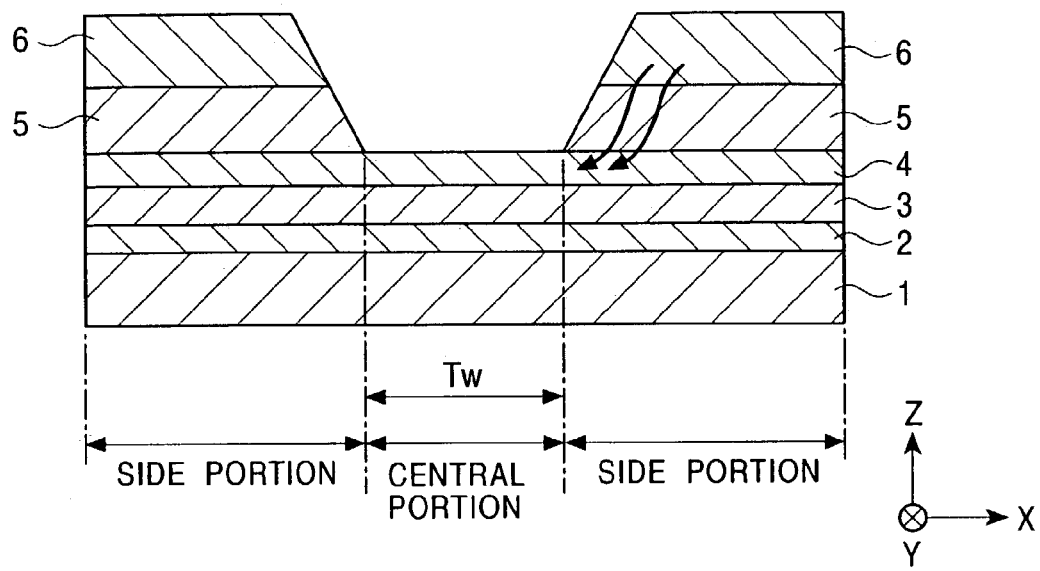
FIG. 24 is a partial sectional view of a structure of an example of conventional magnetic detecting elements, as viewed from a side facing a recording medium.

The thickness of each of the inner ends 31a is preferably 50 Å or less. With the inner ends 31a of 50 Å or more in thickness, the inner ends 31a are provided with antiferromagnetism to produce an exchange coupling magnetic field with the ferromagnetic layers 30 in the regions B, thereby strongly pinning the magnetizations of the ferromagnetic layers 30 and the free magnetic layer 28 in the regions B. Therefore, a bias magnetic field from each of the side portions of the free magnetic layer 28 through the exchange interaction in the magnetic layer is intensified near the boundary between the central portion and each side portion of the free magnetic layer 28. As a result, like in the conventional example shown in FIG. 24, dead zones are formed in the central portion of the free magnetic layer 28, thereby decreasing reproduced output.

The second antiferromagnetic layers 31 are preferably formed to a thickness of 80 Å to 300 Å in the regions A. Therefore, in each of the regions A, an exchange coupling magnetic field of a proper intensity is produced between the second antiferromagnetic layer 31 and the ferromagnetic layer 30, thereby effectively pinning the magnetizations of the ferromagnetic layer 30 and the antiferromagnetic layer 31 in each region A.

In the embodiment shown in FIG. 1, a plurality of stopper layers 33 and 35 are then formed. The stopper layers 33 and 35 are preferably made of at least one element of Ta, Cr, V, Nb, Mo, W, Fe, Co, Ni, Pt, and Rh.

Of the stopper layers 33 and 35, the second stopper layer 35 must be conductive and have a lower etching rate than that of the electrode layers 37. The reason for requiring conductivity is that a sensing current flows from the inner ends 37b of the electrode layers 37 to the multilayer film 40 through the second stopper layer 35. The reason for requiring the lower etching rate than that of the electrode layers 37 is to prevent the influence of over etching on the layers below the electrode layers 37 in the central portion of the element in the step of etching off the electrode layers 37 formed on the central portion of the multilayer film 40 in the manufacturing method described below. Even if over etching is performed, the second stopper layer 35 having a lower etching rate is exposed, and is thus unlikely to be completely removed by over etching, thereby avoiding the influence of etching on the layers below the second stopper layer 35.

When the second stopper layer 35 is made of a material which is not or less etched by reactive ion etching (RIE), the second stopper layer 35 is less influenced by the etching even if the second stopper layer 35 is exposed by over etching of the electrode layers 37. For example, in the step of removing the electrode layer 37 from the central portion of the element by reactive ion etching in the manufacturing method described below, the second stopper layer 35 made of a material that is not etched by the reactive ion etching is not etched by the reactive ion etching. Therefore, such a material may be used for the second stopper layer 35.

Furthermore, the second protective layer 36 made of Ta is formed on the second stopper layer 35. The second stopper layer 35 comprises, for example, a Cr layer which easily causes diffusion with the constituent material Au of the electrode layers 37. The diffusion undesirably increases the element resistance. For example, when the electrode layers 37 are made of Au, and the second stopper layer 35 comprises the Cr layer, the second protective layer 36 composed of Ta is preferably interposed between the Cr layer and the electrode layers 37, for preventing the diffusion.

A description will now be made of the film structure of the central portion of the magnetic detecting element shown in FIG. 1. In the embodiment shown in FIG. 1, in the central portion of the element, the nonmagnetic intermediate layer 29 is formed on the free magnetic layer 28. As described above, the nonmagnetic intermediate layer 29 is composed of Ru or the like, and is provided for forming the synthetic ferrimagnetic structure comprising the free magnetic layer 28 and the ferromagnetic layer 30 in each of the side portions.

Therefore, in the central portion without the ferromagnetic layers 30, the nonmagnetic intermediate layer 29 need not be provided on the free magnetic layer 28. In this case, the fourth protective layer 39 is formed directly on the central portion of the free magnetic layer 28 so that the fourth protective layer 39 can be served as a specular layer.

By forming the specular layer, conduction electrons (for example, spin-up conduction electrons) reaching the specular layer are specularly reflected by the specular layer while maintaining the spin state (energy, quantum state, etc.). The moving direction of the specularly reflected spin-up conduction electrons is changed so that the electrons can pass through the free magnetic layer 28.

By providing the specular layer, therefore, the mean free path $\lambda+$ of the spin-up conduction electrons can be increased, as compared with a conventional element, to increase the difference between the mean free path $\lambda+$ of the spin-up conduction electrons and the mean free path $\lambda-$ of spin-down conduction electrons. Therefore, the rate of change in resistance ($\Delta R/R$), and reproduced output can be improved.

The specular layer is formed by depositing the fourth protective layer 39 comprising, for example, a Ta film having a thickness of about 10 to 20 Å, and then completely oxidizing the Ta layer in air. Other materials for the specular layer include oxides such as Fe—O, Ni—O, Co—O, CoFe—O, Co—Fe—Ni—O, Al—O, Al—Q—O (wherein Q is at least one element selected from B, Si, N, Ti, V, Cr, Mn, Fe, Co, and Ni), and R—O (wherein R is at least one element selected from Cu, Ti, V, Cr, Zr, Nb, Mo, Hf, and W), nitrides such as Al—N, Al—Q—N (wherein Q is at least one element selected from B, Si, O, Ti, V, Cr, Mn, Fe, Co, and Ni), and R—N (wherein R is at least one element selected from Ti, V, Cr, Zr, Nb, Mo, Hf, Ta, and W), semimetal whistler alloys, and the like.

By forming the fourth protective layer 39, it is possible to appropriately prevent a short circuit between the electrode layers 37 and an upper shield layer (not shown in the drawing) at the rear side of the element in the height direction (the Y direction), and to appropriately prevent oxidation of the upper surfaces of the electrode layers 37.

Figure 25:
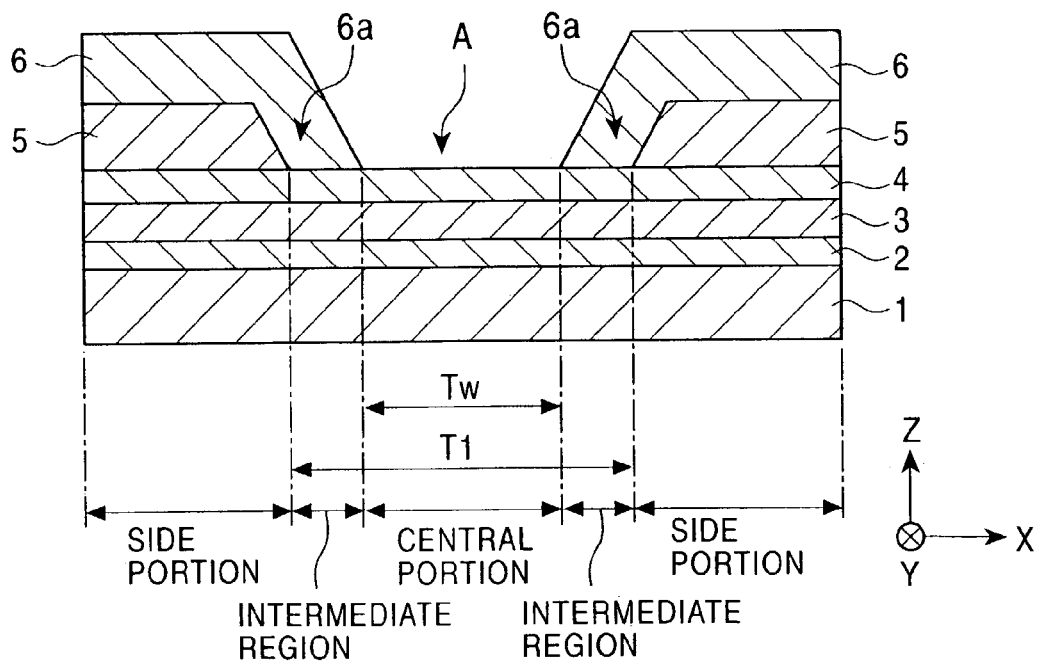
FIG. 25 is a partial sectional view of a structure of another example of conventional magnetic detecting elements, as viewed from a side facing a recording medium.

In the embodiment shown in FIG. 1, the overlap length T9 of the inner end 37b of each of the electrode layers 37 in the track width direction can be made longer than that of the conventional example shown in FIG. 25. The reason for this is that each of the regions B near the central portion can be effectively decreased in sensitivity due to the synthetic ferrimagnetic structure to form the dead zones in the regions B. Therefore, even when the regions B are extended to be longer than the intermediate regions shown in FIG. 25, the sensitivity of the regions B can be properly decreased. Thus, the overlap length T9 of each electrode layer 37 can be extended to be longer than that of the conventional element. For example, the overlap length T9 is about 50 Å to 2000 Å.

In the method of manufacturing the magnetic detecting element shown in FIG. 1, mask alignment must be performed twice. However, even with low alignment precision, the regions B with low sensitivity can be appropriately formed in both side portions of the element because the overlap length T9 of each electrode layer 37 can be increased.

Although the magnetic detecting element shown in FIG. 1 is a CIP (Current In the Plane) type in which the sensing current from the electrode layers 37 flows substantially in parallel with each film plane of the multilayer film 40, the structure of the magnetic detecting element shown in FIG. 1 can also be applied to a CPP (Current Perpendicular to the Plane) type magnetic detecting element in which the sensing current flows in each of the layers of the multilayer film 40 in the thickness direction.

Figure 2:
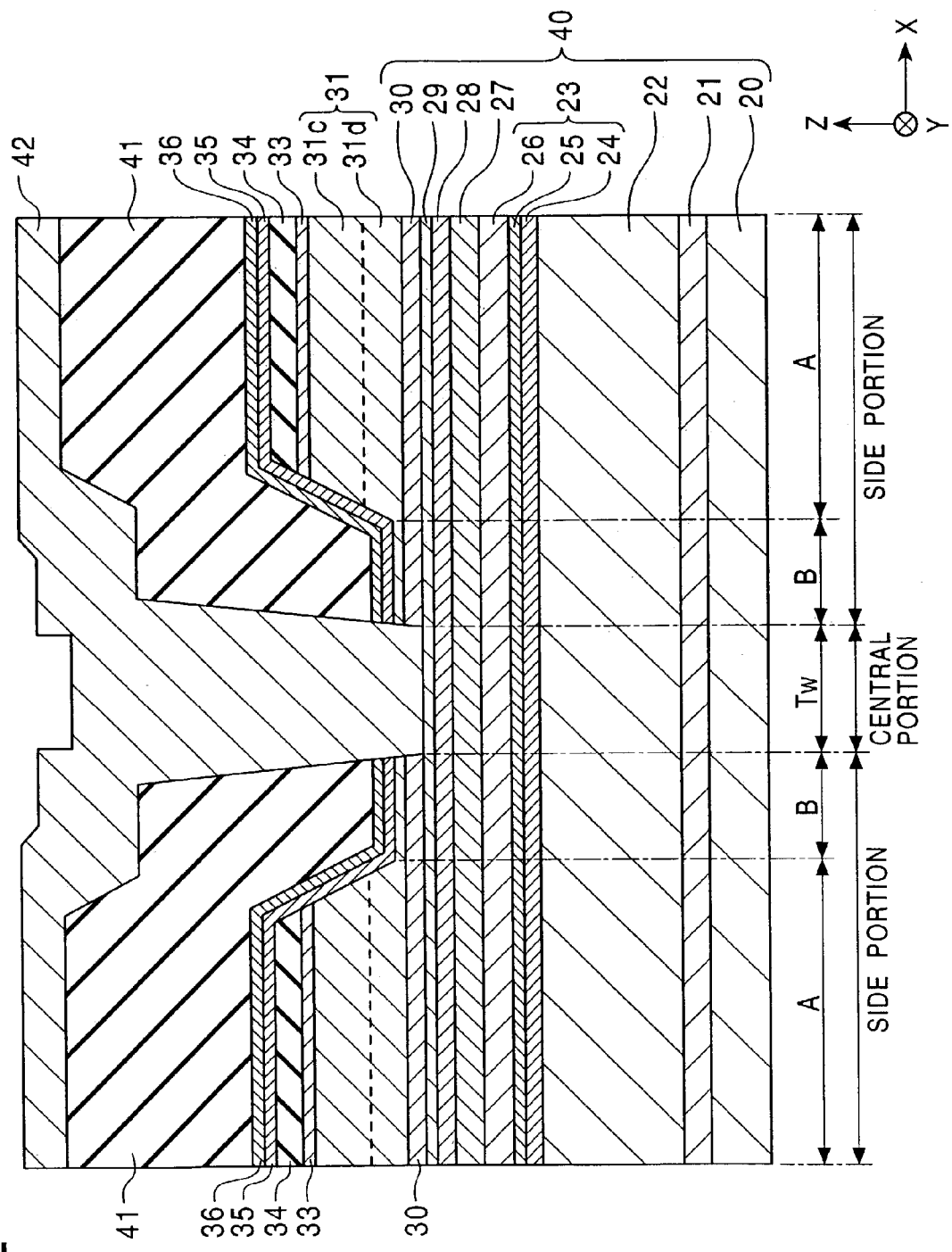
FIG. 2 is a partial sectional view of a structure of a second embodiment of a magnetic detecting element, as viewed from a side facing a recording medium.

FIG. 2 is a partial sectional view of a CPP type magnetic detecting element according to a second embodiment of a magnetic detecting element, as viewed from a side facing a recording medium. In FIG. 2, the same reference numerals as in FIG. 1 denote the same layers.

In the embodiment shown in FIG. 2, the substrate 20 serves as a lower electrode layer, for example, also serving as a lower shield layer made of a magnetic material.

In the embodiment shown in FIG. 2, insulating layers 41 made of an insulating material such as $Al_2O_3$, $SiO_2$, or the like are formed at the positions of the electrode layers 37 shown in FIG. 1. Unlike in the embodiment shown in FIG. 1, instead of the fourth protective layer 39, an upper electrode layer 42 is formed on the insulating layers 41 and on the central portion of the nonmagnetic intermediate layer 29. The upper electrode layer 42 serves as an upper shield layer made of, for example, a magnetic material.

In the embodiment shown in FIG. 2, the insulating layers 41 are formed between the second antiferromagnetic layers 31 and the upper electrode layer 42, and thus a sensing current flowing from the upper electrode layer 42 to the multilayer film 40 in the thickness direction can be suppressed from shunting to the second antiferromagnetic layers 31. It is thus possible to manufacture a magnetic detecting element producing large reproduced output.

Also, unlike in the embodiment shown in FIG. 1, the fourth insulating protective layer 39 is not provided because if the fourth protective layer 39 is formed on the central portion of the nonmagnetic intermediate layer 29, the sensing current from the electrode layer 42 less flows into the central portion of the multilayer film 40 in the thickness direction or the sensing current is cut off due to the presence of the fourth protective layer 39, thereby deteriorating the reproducing characteristics. However, when the fourth protective layer 39 is made of a nonmagnetic conductive material, the fourth protective layer 39 may be provided. In this case, the fourth protective layer 39 is formed as a part of an upper gap layer.

The nonmagnetic material layer 27 shown in FIG. 2 is made of, for example, Cu. However, in a tunneling magnetoresistive element (TMR element) using the principle of the spin tunnel effect, the nonmagnetic material layer 27 is made of an insulating material such as $A_2O_3$ or the like.

Figure 3:
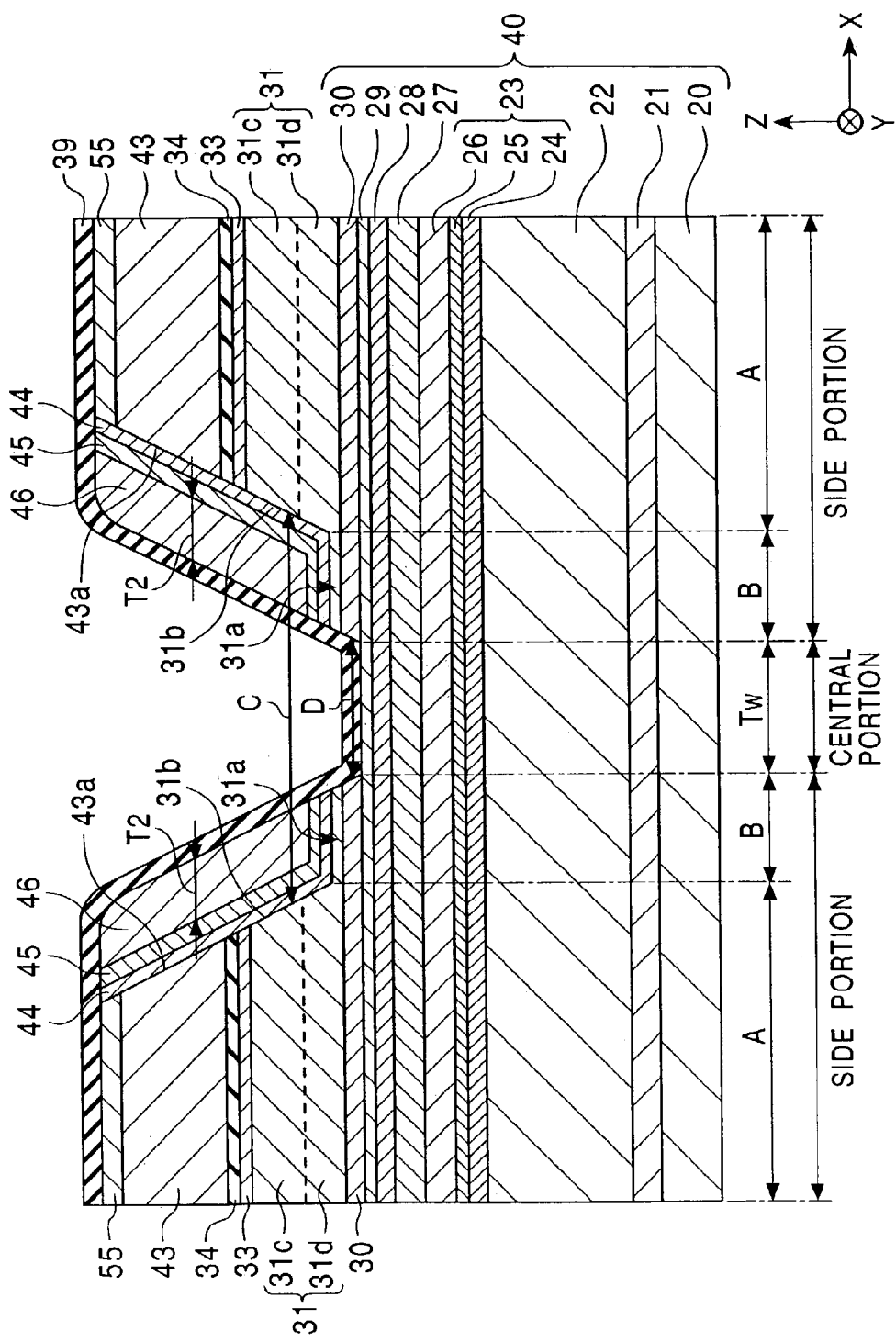
FIG. 3 is a partial sectional view of a structure of a third embodiment of a magnetic detecting element, as viewed from a side facing a recording medium.

FIG. 3 is a partial sectional view of a magnetic detecting element according to a third embodiment of a magnetic detecting element, as viewed from a side facing a recording medium. In FIG. 3, the same reference numerals as in FIG. 1 denote the same layers as in FIG. 1.

The characteristics of the magnetic detecting element shown in FIG. 3 will be described below. The ferromagnetic layers 30 are formed on both side portions of the free magnetic layer 28 through the nonmagnetic intermediate layer 29, and the second antiferromagnetic layers 31 are formed on the ferromagnetic layers 30 in regions A on both side portions of the element, the regions A being apart from the center in the track width direction. Also, first electrode layers 43 are formed on the second antiferromagnetic layers 31 through the first stopper layers 33 and the first protective layers 34. Further, protective layers 55 are formed on the first electrode layers 43. Furthermore, in a separate step from the first electrode layers 43, second electrode layers 46 are formed on the inner end surfaces 43a of the first electrode layers 43 and the inner end surfaces 31b of the second antiferromagnetic layers 31 through second stopper layers 44 and second protective layers 45. Further, the second electrode layers 46 are formed so as to extend to the portions of the ferromagnetic layers 30 formed in the regions B and extending from the inner end surfaces 31b of the second antiferromagnetic layers 31 toward the center in the track width direction. The track width Tw is controlled by the distance D between the lower surfaces of the ferromagnetic layers 30 in the track width direction (the X direction shown in the drawing).

In the embodiment shown in FIG. 3, the first electrode layers 43 are preferably formed separately from the second electrode layers 46.

In the embodiments of manufacturing methods described in detail below, even with a narrower track, the second electrode layers 46 can be precisely formed to equal thicknesses T2 in the track width direction without the need for alignment of a resist layer mask. The thicknesses T2 are overlap lengths, and are preferably 50 Å to 1000 Å.

In the embodiment shown in FIG. 3, the overlap lengths of the electrode layers can be easily made equal in the track width direction, and the occurrence of side reading can be effectively suppressed, as compared with the embodiment shown in FIG. 1.

Like in the embodiment shown in FIG. 1, in the embodiment shown in FIG. 3, the distance C between the second antiferromagnetic layers 31 in the track width direction can be made greater than the track width Tw controlled by the distance D between the ferromagnetic layers 30. In addition, the second electrode layers 46 overlap with those portions of the ferromagnetic layers 30 that are formed in the regions B to extend from the respective second antiferromagnetic layers 31 toward the center in the track width direction, such that the sensing current can be effectively caused to flow to the central portion of the free magnetic layer 28 while suppressing a shunt to the portion of the multilayer film 40 below the overlap portions of the second electrode layers 46. Furthermore, the central portion of the free magnetic layer 28 is not subjected to exchange coupling due to the RKKY interaction with the ferromagnetic layers 30, thereby allowing magnetic reversal in the central portion of the free magnetic layer 28 with high sensitivity. As a result, the reproduced output can be improved.

Furthermore, each of the portions of the ferromagnetic layers 30 that extend from the respective second antiferromagnetic layers 31 toward the center in the track width direction in the regions B, has a so-called synthetic ferrimagnetic structure with the free magnetic layer 28 formed below the extending portion through the nonmagnetic intermediate layer 29. Therefore, exchange coupling is produced between each of the ferromagnetic layers 30 and the free magnetic layer 28 due to the RKKY interaction, and consequently, the sensitivity of the ferromagnetic layer 30 and the free magnetic layer 28 in each of the regions B to the external magnetic field can be effectively decreased, thereby effectively suppressing magnetic reversal in each of the regions B even with the external magnetic field applied thereto. Therefore, widening of the effective reproducing track width can be appropriately suppressed to suppress the occurrence of side reading, as compared with the conventional example shown in FIG. 25.

In the magnetic detecting element, the synthetic magnetic moment (Net Mst) per unit area obtained by subtracting the magnetic moment (Ms·t) per unit area of the ferromagnetic layer 30 from the magnetic moment (Ms·t) per unit area of the free magnetic layer 28 is preferably more than 0 T·nm and 2.6 T·nm or more.

The thickness difference obtained by subtracting the thickness (t) the ferromagnetic layer 30 from the thickness (t) of the free magnetic layer 28 is preferably 0 Å to 30 Å. In this situation, the absolute value of reproducing sensitivity $\{\Delta V(\pm 100\text{ Oe})/\Delta V(\pm 4000\text{ Oe})\}$ can be suppressed to 0.2 or less, and the magnetizations of the free magnetic layer 28 and the ferromagnetic layers 30 can be easily properly controlled. Furthermore, the reproduced waveform can be stabilized.

As described above, the magnetic detecting element shown in FIG. 3 is capable of improving reproduced output even with a narrower track, and suppressing widening of the effective reproducing track width to appropriately suppress the occurrence of side reading. It is thus possible to provide a magnetic detecting element capable of effectively improving reproducing characteristics even with a higher recording density, as compared with a conventional magnetic detecting element.

Also, in the embodiment shown in FIG. 3, the first and second electrode layers 43 and 46 can be formed separately, and can thus be formed by using different materials. Therefore, the selectivity of the materials for the first and second electrode layers 43 and 46 can be extended.

The second electrode layers 46 are preferably made of a nonmagnetic conductive material having high conductivity. For example, the second electrode layers 46 are preferably made of at least one of Au, Cu, Ag, and the like. The reason for requiring the second electrode layers 46 to have high conductivity is to improve the flow of the sensing current to the multilayer film 40 through the second electrode layers 46.

In this embodiment, the first electrode layers 43 also preferably have high conductivity, but the conductivity of the first electrode layers 43 may be lower than that of the second electrode layers 46 because the first electrode layers 43 do not serve as main current paths for flowing the current to the multilayer film 40. However, the first electrode layers 43 preferably have higher conductivity than that of the second antiferromagnetic layers 31.

If like the second electrode layers 46, the first electrode layers 43 are made of Au or the like, which has high conductivity, smearing possibly occurs in the electrode layers due to the high ductility of Au when the electrode layer surfaces are polished by slider processing. In order to improve the reproducing characteristics, the region where smearing occurs is preferably made as small as possible. Also, the formation region of the first electrode layers 43 is likely to be larger than that of the second electrode layers 46, and thus the first electrode layers 43 are preferably made of a nonmagnetic conductive material having low ductility rather than low conductivity because the first electrode layers 43 do not require so high conductivity as the second electrode layers 46. The first electrode layers 43 are preferably made of an alloy material composed of Au and at least one of Pd, Cr, and Cu, or at least one of Cr, Rh, Ru, Ta, and W. However, when smearing has substantially no problem in the formation region of the first electrode layers 43, the first and second electrode layers 43 and 46 may both be made of the same nonmagnetic conductive material. Although the degree of "ductility" can be measured by a "ductility test", the ductility of such a thin film as in the cannot be easily measured. Therefore, the materials of the first and second electrode layers 43 and 46 can be selected by measuring the degree of ductility of a material in a bulk state, or the materials can be selected by referring to general chemical knowledge described in documents and the like.

In the embodiment shown in FIG. 3, second stopper layers 44 are formed to extend from the inner end surfaces 43a and 31b of the first electrode layers 43 and the second antiferromagnetic layers 31 to the portions of the ferromagnetic layers 30 that are formed in the regions B to extend from the inner end surfaces 31b of the respective second antiferromagnetic layers 31 toward the center in the track width direction. Further, second protective layers 45 are formed on the stopper layers 44. The second electrode layers 46 are formed on the second protective layers 45. The second stopper layers 44 must be conductive and have a lower etching rate than that of the second electrode layers 46. The reason for requiring conductivity is that a sensing current flows from the second electrode layers 46 to the multilayer film 40 through the second stopper layers 44. The reason for requiring the lower etching rate than that of the second electrode layers 46 is to prevent the influence of over etching on the layers below the second electrode layers 46 in the central portion of the element in the step of etching off the second electrode layers 46 formed on the central portion of the multilayer film 40 in the manufacturing method described below. Even if over etching is performed, the second stopper layers 44 having a lower etching rate are exposed, and are thus unlikely to be completely removed by over etching, thereby avoiding the influence of etching on the layers below the second stopper layers 44.

The material of the second stopper layers 44 is as described above with reference to FIG. 1.

In the embodiment shown in FIG. 3, the first stopper layers 33 and the first protective layers 34 are preferably provided between the second antiferromagnetic layers 31 and the first electrode layers 43. By providing the first stopper layers 33, a cutting depth of the second antiferromagnetic layers 31 can be appropriately controlled in the step of cutting the second antiferromagnetic layers 31 in the central portion of the element after the first electrode layers 43 are formed in a predetermined shape by an etching process, or the like. Therefore, the inner ends 31a of the second antiferromagnetic layers 31 can precisely be left with a predetermined smaller thickness than that of the both side portions of the second antiferromagnetic layers 31.

Although the magnetic detecting element shown in FIG. 3 is a CIP (Current In the Plane) type in which the sensing current from the second electrode layers 46 flows substantially in parallel with each film plane of the multilayer film 40, the structure of the magnetic detecting element shown in FIG. 3 can also be applied to a CPP (Current Perpendicular to the Plane) type magnetic detecting element in which the sensing current flows in each of the layers of the multilayer film 40 in the thickness direction.

Figure 4:
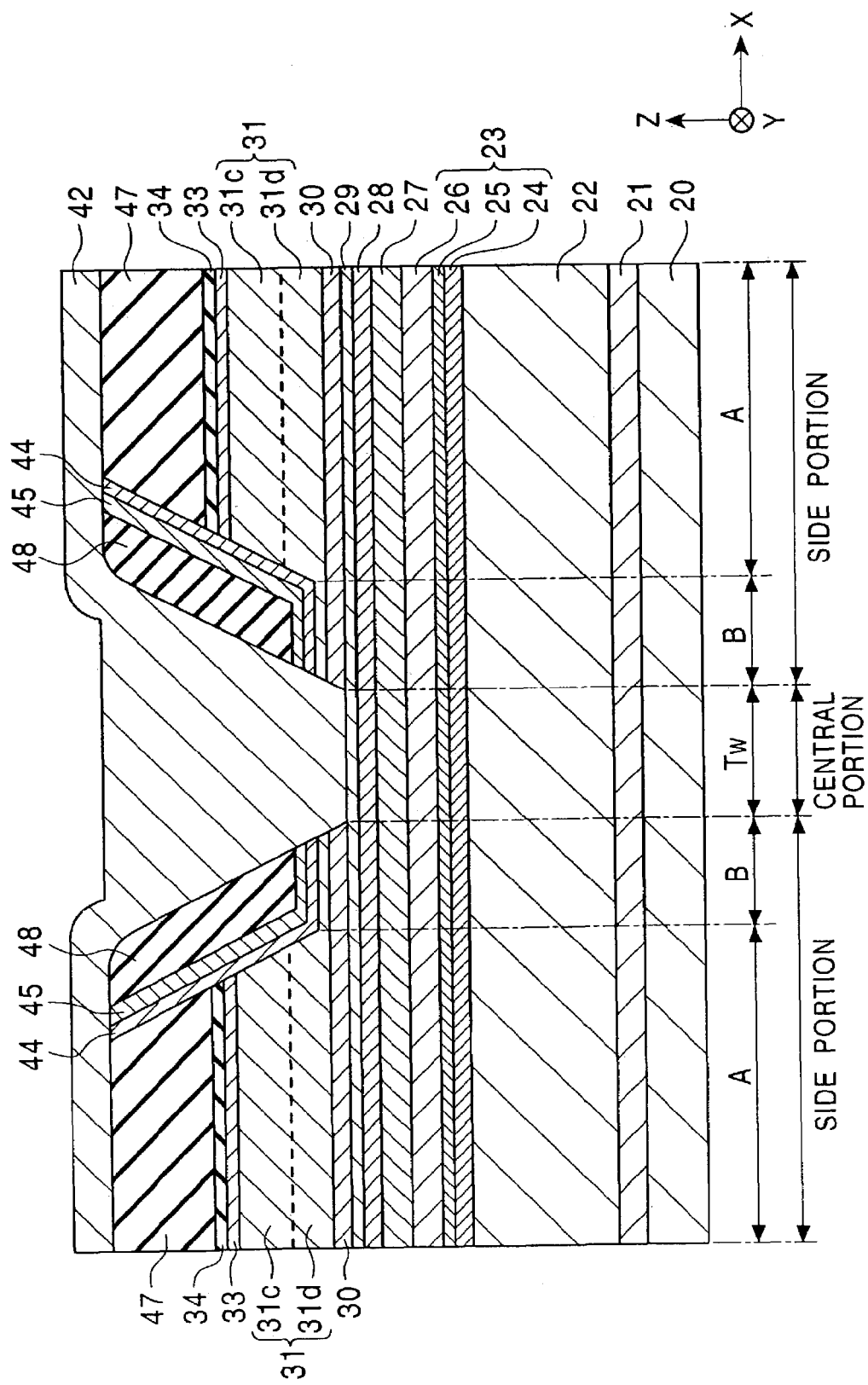
FIG. 4 is a partial sectional view of a structure of a fourth embodiment of a magnetic detecting element, as viewed from a side facing a recording medium.

FIG. 4 is a partial sectional view of a CPP type magnetic detecting element according to a fourth embodiment of a magnetic detecting element, as viewed from a side facing a recording medium. In FIG. 4, the same reference numerals as in FIG. 3 denote the same layers as those shown in FIG. 3.

In the embodiment shown in FIG. 4, the substrate 20 serves as a lower electrode layer, also serving as a lower shield layer made of, for example, a magnetic material.

In the embodiment shown in FIG. 4, insulating layers 47 and 48 made of an insulating material such as $Al_2O_3$, $SiO_2$, or the like are formed in place of the first and second electrode layers 43 and 46 shown in FIG. 3. Unlike in the embodiment shown in FIG. 3, instead of the fourth protective layers 39, an upper electrode layer 42 is formed on the insulating layers 47 and 48 and the central portion of the nonmagnetic intermediate layer 29. The upper electrode layer 42 serves as an upper shield layer made of, for example, a magnetic material.

In the embodiment shown in FIG. 4, the insulating layers 47 and 48 are formed between the second antiferromagnetic layers 31 and the upper electrode layer 42, and thus a sensing current flowing from the upper electrode layer 42 to the multilayer film 40 in the thickness direction can be suppressed from shunting to the second antiferromagnetic layers 31. It is thus possible to manufacture a magnetic detecting element producing large reproduced output.

FIGS. 5 to 13 are partial sectional views respectively showing steps of the method of manufacturing the magnetic detecting element shown in FIG. 1, as viewed from a side facing a recording medium.

Figure 5:
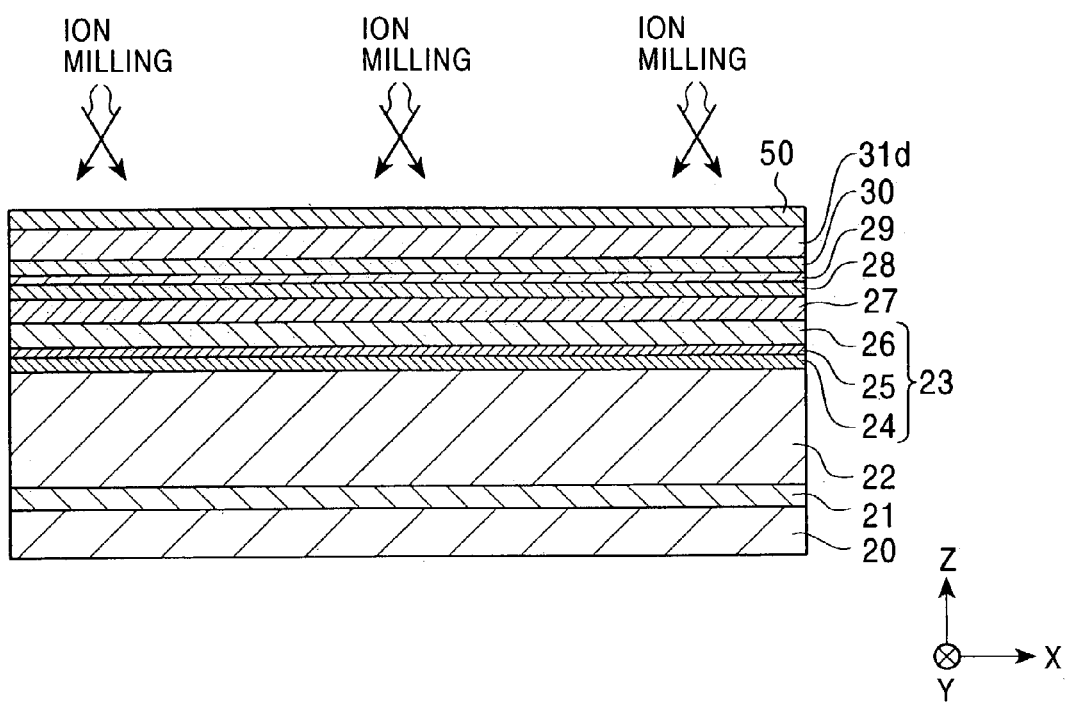
FIG. 5 is a drawing showing a step of a process for manufacturing a magnetic detecting element such as the element shown in FIG. 1.

In the step shown in FIG. 5, the seed layer 21, the first antiferromagnetic layer 22, the pinned magnetic layer 23, the nonmagnetic material layer 27, the free magnetic layer 28, the nonmagnetic intermediate layer 29, the ferromagnetic layer 30, a second antiferromagnetic layer 31d, and a nonmagnetic layer 50 are continuously deposited on the substrate 20 by sputtering or vapor deposition. Examples of a sputtering method include a dc magnetron sputtering method, a rf sputtering method, an ion beam sputtering method, a long slow sputtering method, a collimation sputtering method, and the like. The pinned magnetic layer 23 shown in FIG. 5 has a synthetic ferrimagnetic structure comprising magnetic layers 24 and 26 made of, for example, a CoFe alloy or the like, and a nonmagnetic intermediate layer 25 made of Ru or the like and interposed between the magnetic layers 24 and 26. Although the free magnetic layer 28 is made of a magnetic material such as a NiFe alloy or the like, an anti-diffusion layer made of a CoFe alloy or the like may be formed between the free magnetic layer 28 and the nonmagnetic material layer 27. Also, a CoFe layer may be provided between the nonmagnetic intermediate layer 29 and the free magnetic layer 28. The CoFe layer can intensify exchange coupling due to RKKY interaction exerting between the free magnetic layer 28 and the ferromagnetic layer 30.

In the step shown in FIG. 5, the ferromagnetic layer 30 is formed on the free magnetic layer 28 with the nonmagnetic intermediate layer 29 provided therebetween to form a synthetic ferrimagnetic structure comprising the three layers.

In the step shown in FIG. 5, the nonmagnetic intermediate layer 29 is preferably made of one of Ru, Rh, Ir, Cr, Re, and Cu, or an alloy of at least two of these elements. For example, the nonmagnetic intermediate layer 29 is formed to a thickness of 6 Å to 11 Å. With such a small thickness, exchange coupling occurs due to the RKKY interaction between the free magnetic layer 28 and the ferromagnetic layer 30, thereby making the magnetizations of the free magnetic layer 28 and the ferromagnetic layer 30 parallel to the track width direction (the X direction) and antiparallel to each other.

The magnetic moment (Ms·t) per unit area of each of the free magnetic layer 28 and the ferromagnetic layer 30 is preferably controlled so that the synthetic magnetic moment (Net Mst) per unit area obtained by subtracting the magnetic moment (Ms·t) per unit area of the ferromagnetic layer 30 from the magnetic moment (Ms·t) per unit area of the free magnetic layer 28 is more than 0 T·nm and 2.6 T·nm or more.

The intensity of the magnetic moment per unit area is controlled by controlling the material and thickness of each of the free magnetic layer 28 and the ferromagnetic layer 30. The saturation magnetizations Ms of the free magnetic layer 28 and the ferromagnetic layers 30 are estimated from the materials by referring to documents and the like, and the magnetic moment per unit area of each layer is calculated by multiplying the thickness t by the saturation magnetization Ms to determine the magnetic moment per unit area.

In the magnetic detecting element, the thickness (t) of each of the free magnetic layer 28 and the ferromagnetic layer 30 is preferably controlled so that the thickness difference obtained by subtracting the thickness (t) the ferromagnetic layer 30 from the thickness (t) of the free magnetic layer 28 is 0 Å to 30 Å.

Examples of materials used for the free magnetic layer 28 and the ferromagnetic layer 30 include $Co_{90at\%}Fe_{10at\%}/Ni_{80at\%}Fe_{20at\%}/Co_{90at\%}Fe_{10at\%}$ used for the free magnetic layer 28, $Co_{90at\%}Fe_{10at\%}$ used for the ferromagnetic layer 30, and $Co_{90at\%}Fe_{10at\%}$ used for both the free magnetic layer 28 and the ferromagnetic layer 30. By using these materials, the thickness of each of the free magnetic layer 28 and the ferromagnetic layer 30 is controlled so that the thickness difference is 0 Å to 30 Å. Particularly, in the use of $Co_{90at\%}Fe_{10at\%}$ for both the free magnetic layer 28 and the ferromagnetic layer 30, the synthetic magnetic moment (Net Mst) is more preferably set to more than 0 T·nm and 1.5 T·nm or more, and the thickness difference is more preferably set to more than 0 Å and 10 Å or less.

The reason for setting the synthetic magnetic moment and the thickness difference in the above-described proper ranges is that the sensitivity of the regions B (refer to FIG. 1) of the completed magnetic detecting element is lowered to suppress the occurrence of side reading. Particularly, when the synthetic magnetic moment and the thickness difference are set to plus values, the effect below can be expected from the manufacturing process.

That is, a value of spin flop magnetic field Hsf corresponding to a plus synthetic magnetic moment more rapidly increases than that corresponding to a minus synthetic magnetic moment. The applied magnetic field strength in magnetic field annealing for controlling the magnetizations of the free magnetic layer 28 and the ferromagnetic layer 30 is preferably lower than the spin flop magnetic field Hsf because the magnetizations of the free magnetic layer 28 and the ferromagnetic layer 30 can be prevented from being aligned in unexpected directions, and the magnetizations of the free magnetic layer 28 and the ferromagnetic layer 30 can be controlled in predetermined directions. However, when the intensity of synthetic magnetic moment is set to a plus value as described above, the spin flop magnetic field can be set to a high value, and thus the margin of the magnetic field strength in magnetic field annealing for controlling the magnetizations of the free magnetic layer 28 and the ferromagnetic layer 30 can be widened. Also, the magnetization directions of the free magnetic layer 28 and the ferromagnetic layer 30 can be easily appropriately controlled to be antiparallel to each other and to cross the magnetization direction of the pinned magnetic layer 23. Furthermore, the intensity of the synthetic magnetic moment is set to a plus value. For the same reason, the thickness difference between the free magnetic layer 28 and the ferromagnetic layer 30 is preferably a plus value.

In the step shown in FIG. 5, the first antiferromagnetic layer 22 and the second antiferromagnetic layer 31d are preferably made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

In the PtMn alloy and the alloy represented by the formula X—Mn, Pt or X is preferably in the range of 37 to 63 at %, and more preferably in the range of 47 to 57 at %. The upper limit and lower limit of the range represent "not more than" and "not less than", respectively, unless otherwise specified.

In the alloy represented by the formula Pt—Mn—X', X'+Pt is preferably in the range of 37 to 63 at %, and more preferably in the range of 47 to 57 at %, and X' is preferably in the range of 0.2 to 10 at %. However, when X' is at least one of Pd, Ir, Rh, Ru, Os, Ni, and Fe, X' is preferably in the range of 0.2 to 40 at %.

In the step shown in FIG. 5, the thickness of the first antiferromagnetic layer 22 is preferably 80 Å to 300 Å. With the first antiferromagnetic layer 22 having such a thickness, a great exchange coupling magnetic field can be produced between the first antiferromagnetic layer 22 and the pinned magnetic layer 23 in magnetic field annealing. Specifically, an exchange coupling magnetic field of 48 kA/m or more, for example, over 65 kA/m, can be produced.

In the magnetic detecting element, the thickness of the second antiferromagnetic layer 31d is preferably 20 Å to 50 Å, and more preferably 30 Å to 40 Å.

By forming the second antiferromagnetic layer 31d having a thickness of as small as 50 Å or less, the second antiferromagnetic layer 31d is given non-antiferromagnetism. Therefore, the second antiferromagnetic layer 31d is less transformed into an ordered structure even by first magnetic field annealing, and thus no or little exchange coupling magnetic field is produced between the second antiferromagnetic layer 31d and the ferromagnetic layer 30. Therefore, unlike the pinned magnetic layer 23, the magnetizations of the ferromagnetic layer 30 and the free magnetic layer 28 are not strongly pinned.

The reason for forming the second antiferromagnetic layer 31d to a thickness of 20 Å or more, preferably 30 Å or more, is that with a thickness of less than this value, even when another second antiferromagnetic layer 31c (as described above in the discussion of FIG. 1, and below in the discussion of FIG. 6) is formed on the second antiferromagnetic layer 31d to form the second antiferromagnetic layer 31 comprising the second antiferromagnetic layers 31d and 31c, it is difficult to give antiferromagnetism to the second antiferromagnetic layer 31, thereby failing to produce an appropriate exchange coupling magnetic field between the second antiferromagnetic layer 31 and the ferromagnetic layer 30.

In the step shown in FIG. 5, the nonmagnetic layer 50 is formed on the second antiferromagnetic layer 31d, for preventing oxidation of the second antiferromagnetic layer 31d even when the laminate shown in FIG. 5 is exposed to air.

The nonmagnetic layer 50 must be a dense layer which is not easily oxidized by air exposure. Also, the nonmagnetic layer 50 must be made of a material which does not deteriorate the properties of an antiferromagnetic layer even if the constituent elements of the nonmagnetic layer 50 enters the second antiferromagnetic layer 31 by thermal diffusion.

The nonmagnetic layer 50 is preferably composed of at least one element of Ru, Re, Os, Ir, Pt, Au, Rh, Cu, and Cr.

The nonmagnetic layer 50 when composed of element Ru is a dense layer that is not easily oxidized by air exposure. Therefore, even when the thickness of the nonmagnetic layer 50 is decreased, oxidation of the second antiferromagnetic layer 31d due to air exposure can be properly prevented.

The thickness of the nonmagnetic layer 50 is preferably 3 Å to 10 Å. The oxidation of the second antiferromagnetic layer 31d due to air exposure can be appropriately prevented merely by giving the nonmagnetic layer 50 such a small thickness.

The nonmagnetic layer 50 is preferably made of an element such as Ru or the like, and is formed to a thickness of as small as about 3 Å to 10 Å, and thus the nonmagnetic layer 50 can be cut out by ion milling with low energy in an ion milling step, thereby improving milling controllability as compared with a conventional example.

After the layers up to the nonmagnetic layer 50 are laminated on the substrate 20, as shown in FIG. 5, a first magnetic field annealing is performed. The layers are heat-treated at a first heat treatment temperature with a first magnetic field (in the Y direction) applied in the direction perpendicular to the track width Tw (the X direction) to produce an exchange coupling magnetic field between the first antiferromagnetic layer 22 and the magnetic layer 24 that is in the pinned magnetic layer 23, so that the magnetization of the magnetic layer 24 is pinned in the Y direction. The magnetization of the other magnetic layer 26 is pinned in the direction opposite to the Y direction by exchange coupling due to the RKKY interaction exerting with the magnetic layer 24. For example, in one version of the first magnetic field annealing, the first heat treatment temperature is 270° C., and the intensity of the first magnetic field is 800 (kA/m).

As described above, in the first magnetic field annealing, no or less exchange coupling magnetic field occurs between the second antiferromagnetic layer 31d and the ferromagnetic layer 30. This is because the second antiferromagnetic layer 31d is formed to a small thickness of 50 Å or less, and does not have antiferromagnetism.

Also, the constituent elements Ru or the like in the nonmagnetic layer 50 possibly diffuse into the second antiferromagnetic layer 31d during the first magnetic field annealing. Therefore, after the heat treatment, the constituent elements of the second antiferromagnetic layer 31d near the surface thereof include the constituent elements of the second antiferromagnetic layer 31d and possibly others, such as Ru. Furthermore, the amount of the element such as Ru or the like which diffuses into the surface side of the second antiferromagnetic layer 31d is larger than the amount of the element which diffuses into its lower side, and the ratio of the diffusing elements such as Ru or the like possibly gradually decreases from the surface to the lower side of the second antiferromagnetic layer 31d. This change in the ratio can be confirmed by a SIMS analyzer or the like.

Next, the nonmagnetic layer 50 is cut by ion milling. The reason for cutting the nonmagnetic layer 50 is that an antiferromagnetic interaction cannot be produced between the nonmagnetic layer 50 and the second antiferromagnetic layer 31c further laminated on the second antiferromagnetic layer 31d in the next step unless the thickness of the nonmagnetic layer 50 is decreased as much as possible.

In the step shown in FIG. 5, the nonmagnetic layer 50 may be completely removed by the ion milling step, or left with a thickness of 3 Å or less. By decreasing the thickness of the nonmagnetic layer 50 to such a small thickness, another second antiferromagnetic layer can be added to increase the thickness in the next step so that the second antiferromagnetic layer 31 functions as an antiferromagnetic layer.

In the ion milling step shown in FIG. 5, low-energy ion milling can be performed. This is because the nonmagnetic layer 50 is formed to a thickness of as small as about 3 Å to 10 Å. Even when the nonmagnetic layer 50 made of Ru or the like has a thickness of as small as 3 Å to 10 Å, oxidation of the second antiferromagnetic layer 31d formed below the nonmagnetic layer 50 can be sufficiently prevented, and the amount of the nonmagnetic layer 50 cut by low-energy ion milling can easily be controlled.

Figure 6:
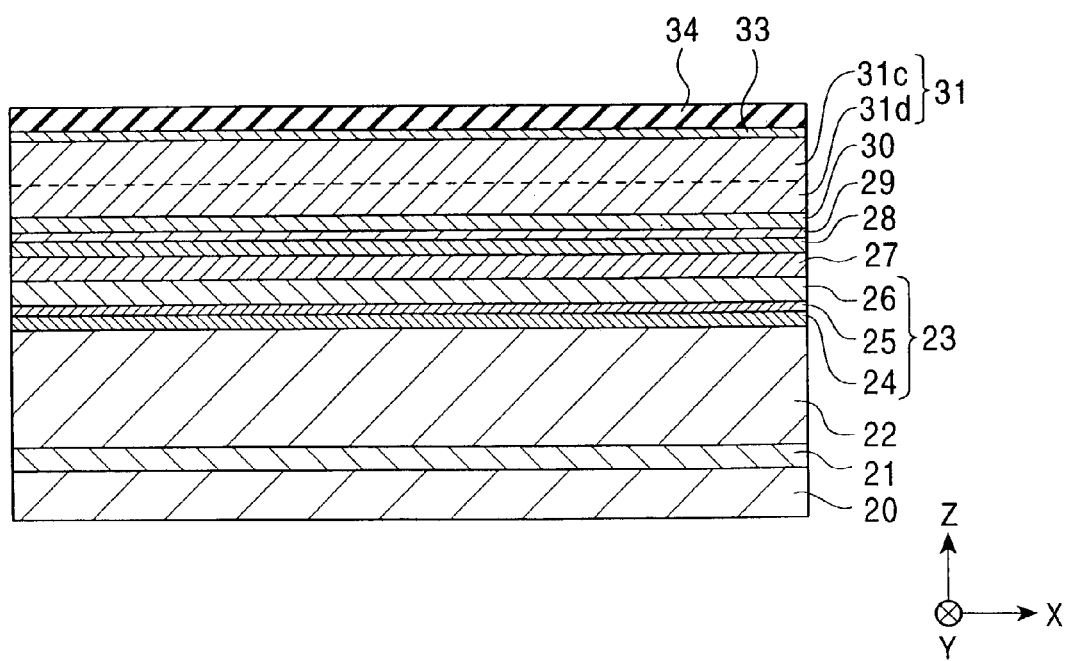
FIG. 6 is a drawing showing a step after the step shown in FIG. 5.

Next, the step shown in FIG. 6 is performed. In the step shown in FIG. 6, the second antiferromagnetic layer 31c is deposited on the second antiferromagnetic thin layer 31d (or on the nonmagnetic layer 50 when a portion of the nonmagnetic layer 50 is left). The two depositions of second antiferromagnetic layers 31c and 31d constitute the second antiferromagnetic layer 31. In this case, the thickness of the second antiferromagnetic layer 31 is controlled to 80 Å to 300 Å.

Next, a first stopper layer 33 is formed on the second antiferromagnetic layer 31. The first stopper layer 33 is preferably made of at least one element of Cr, Ta, V, Nb, Mo, W, Fe, Co, Ni, Pt, and Rh. The first stopper layer 33 is preferably formed to a thickness of 30 Å to 100 Å.

Also, a first protective layer 34 is preferably formed on the first stopper layer 33, for appropriately protecting the first stopper layer 33 and the layers below the first stopper layer 33 from oxidation by air exposure. The first protective layer 34 also functions as a part of a mask for etching the second antiferromagnetic layer 31. The first protective layer 34 is made of, for example, Ta.

Next, second magnetic field annealing is performed. In this annealing, the magnetic field direction coincides with the track width direction (the X direction). In the second magnetic field annealing, a second applied magnetic field is lower than the exchange anisotropic magnetic field of the first antiferromagnetic layer 22 and the spin flop magnetic field of the free magnetic layer 28 and the ferromagnetic layer 30, and higher than coercive forces and anisotropic magnetic fields of the free magnetic layer 28 and the ferromagnetic layer 30.

The second heat treatment temperature is set to be lower than the blocking temperature of the first antiferromagnetic layer 22. As a result, even when the first antiferromagnetic layer 22 and the second antiferromagnetic layer 33 are made of a PtMn alloy, a PtMnX alloy, or the like, the exchange anisotropic magnetic field of the second antiferromagnetic layer 31 can be oriented in the track width direction (the X direction) while the exchange anisotropic magnetic field of the first antiferromagnetic layer 22 is oriented in the height direction (the Y direction). For example, in one version of the second heat treatment the temperature is 250° C., and the magnetic field intensity is 24 (kA/m).

In the second magnetic field annealing, the second antiferromagnetic layers 31 are properly transformed into an ordered structure to produce an exchange coupling magnetic field of an appropriate intensity between the second antiferromagnetic layers 31 and the ferromagnetic layers 30, such that the magnetization of the ferromagnetic layers 30 is pinned in the track width direction (the X direction). However, if the applied magnetic field is higher than the spin flop magnetic field Hsf, the ferromagnetic layers 30 are annealed in a direction shifted from a desired direction (the track width direction), and the magnetization of the ferromagnetic layers 30 is pinned in an unintended direction. Therefore the applied magnetic field is desirably lower than the spin flop magnetic field Hsf. Also the synthetic magnetic moment per unit area and the thickness difference between the free magnetic layer 28 and the ferromagnetic layers 30 are set preferably in the predetermined ranges to widen the spin flop magnetic field, thereby widening the margin of the applied magnetic field. Therefore, the second magnetic field annealing can be easily and properly performed.

When the applied magnetic field is lower than the coercive forces and anisotropic magnetic fields of the free magnetic layer 28 and the ferromagnetic layers 30, the free magnetic layer 28 and the ferromagnetic layers 30 cannot be annealed in a single magnetic domain state. Therefore, the applied magnetic field is desirably set to be higher than the coercive forces and anisotropic magnetic fields of the free magnetic layer 28 and the ferromagnetic layers 30.

In the second magnetic field annealing, the magnetization of the free magnetic layer 28 is pinned in antiparallel with the ferromagnetic layers 30 by exchange coupling due to the RKKY interaction produced between the free magnetic layer 28 and the ferromagnetic layer 30. Although the second magnetic field annealing may be performed after the step shown in FIG. 6, the second magnetic field annealing is preferably performed after the step shown in FIG. 9.

Figure 7:
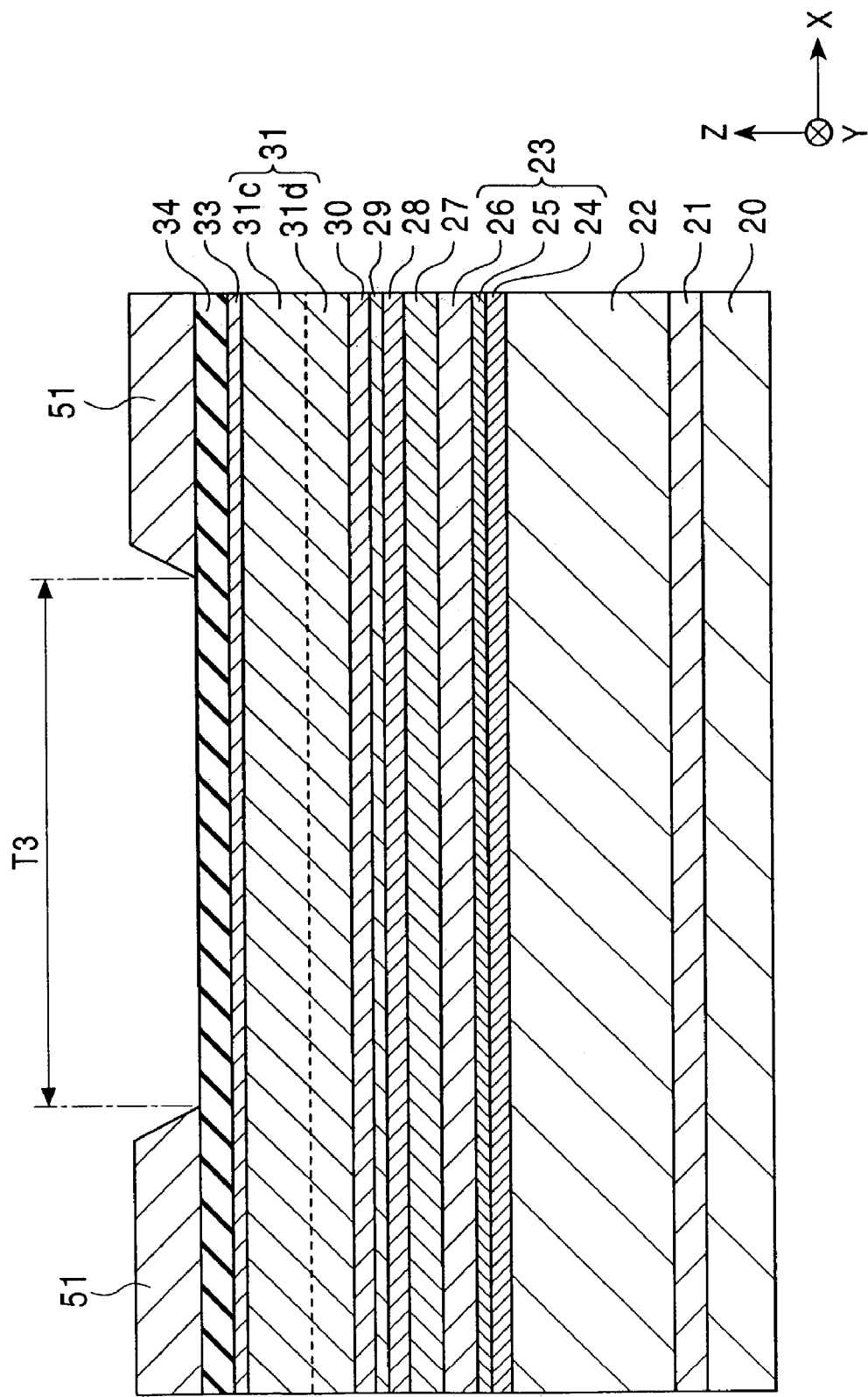
FIG. 7 is a drawing showing a step after the step shown in FIG. 6.

In the step shown in FIG. 7, mask layers 51 are formed on the first protective layer 34 with a predetermined distance T3 apart in the track width direction (the X direction shown in the drawing). The distance T3 is greater than at least the track width Tw. In this step, the mask layers 51 are made of a material that is not or little cut by reactive ion etching (RIE). The mask layers 51 may be made of resist, but when the mask layers are made of a metal, a remaining portion of the mask layers 51 can be used as an electrode. In the step shown in FIG. 7, the mask layers 51 are formed by using a metal, for example, Cr. In a next step, the portions of the first protective layer 34, the first stopper layer 33, and the second antiferromagnetic layer 31 that are not covered with the mask layers 51, are etched. However, the first protective layer 34 must be left below at least the mask layers 51 until the etching step is finished. Therefore, in forming the mask layers, 51, the material and thickness of the mask layers 51 must be controlled. For example, when the mask layers 51 are made of Cr and the first stopper layer 33 is made of Cr, the thickness of the mask layers 51 must be larger than that of the first stopper layer 33, for leaving the mask layers 51 on the first protective layer 34 when the first stopper layer 33 is removed. Also, the mask layers 51 and the first protective layer 34 are preferably made of materials which have a lower etching rate than that of the second antiferromagnetic layers 31, or materials which are not etched with an etching gas used for etching the second antiferromagnetic layers 31.

When the mask layers 51 are made of a metal layer, the thickness of the mask layers 51 is preferably about 100 Å to 500 Å.

The mask layers 51 are formed by forming a lift-off resist layer (not shown) on the distance T3 of the first protective layer 34, depositing a mask layer made of Cr by sputtering on both side portions of the first protective layer 34 that are not covered with the resist layer, and then removing the resist layer.

Figure 8:
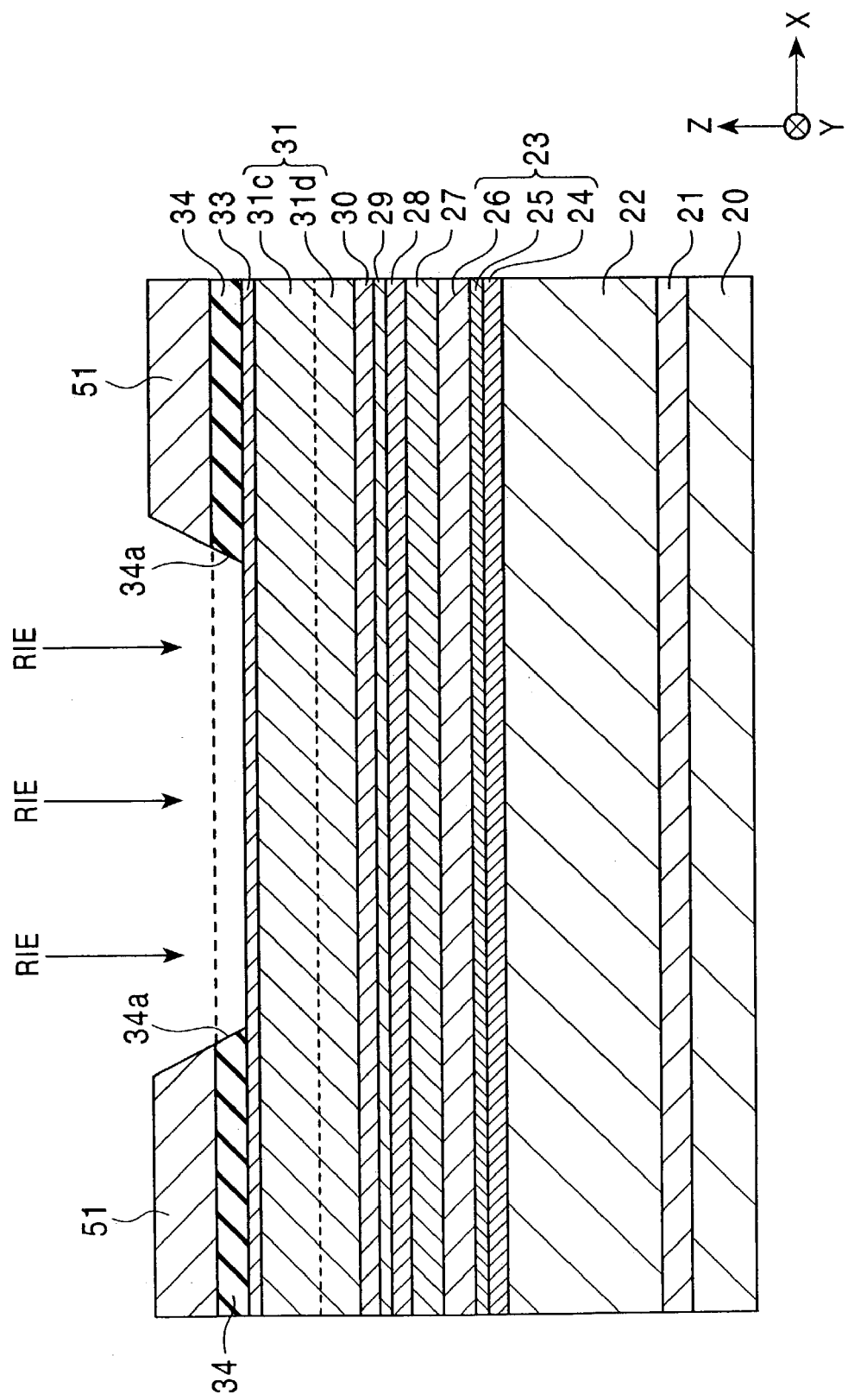
FIG. 8 is a drawing showing a step after the step shown in FIG. 7.

In the step shown in FIG. 8, the portion of the first protective layer 34 that is not covered with the mask layers 51, is removed by etching. As the etching, reactive ion etching (RIE) is preferably used. As an etching gas, $CF_4$, $C_3F_8$, a mixed gas of Ar and $CF_4$, or a mixed gas of $C_3F_8$ and Ar is preferably used.

In FIG. 8, a dotted-line portion of the first protective layer 34 is removed to expose the surface of the first stopper layer 33. Since the first stopper layer 33 is provided below the first protective layer 34, the first stopper layer 33 is not completely removed even if the first protective layer is over-etched. The portion of the first protective layer 34 that is exposed between the mask layers 51 is over-etched to form the appropriately inclined or curved inner end surfaces 34a of the first protective layer 34, without leaving the first protective layer 34 on the exposed portion of the first stopper layer 33.

Figure 9:
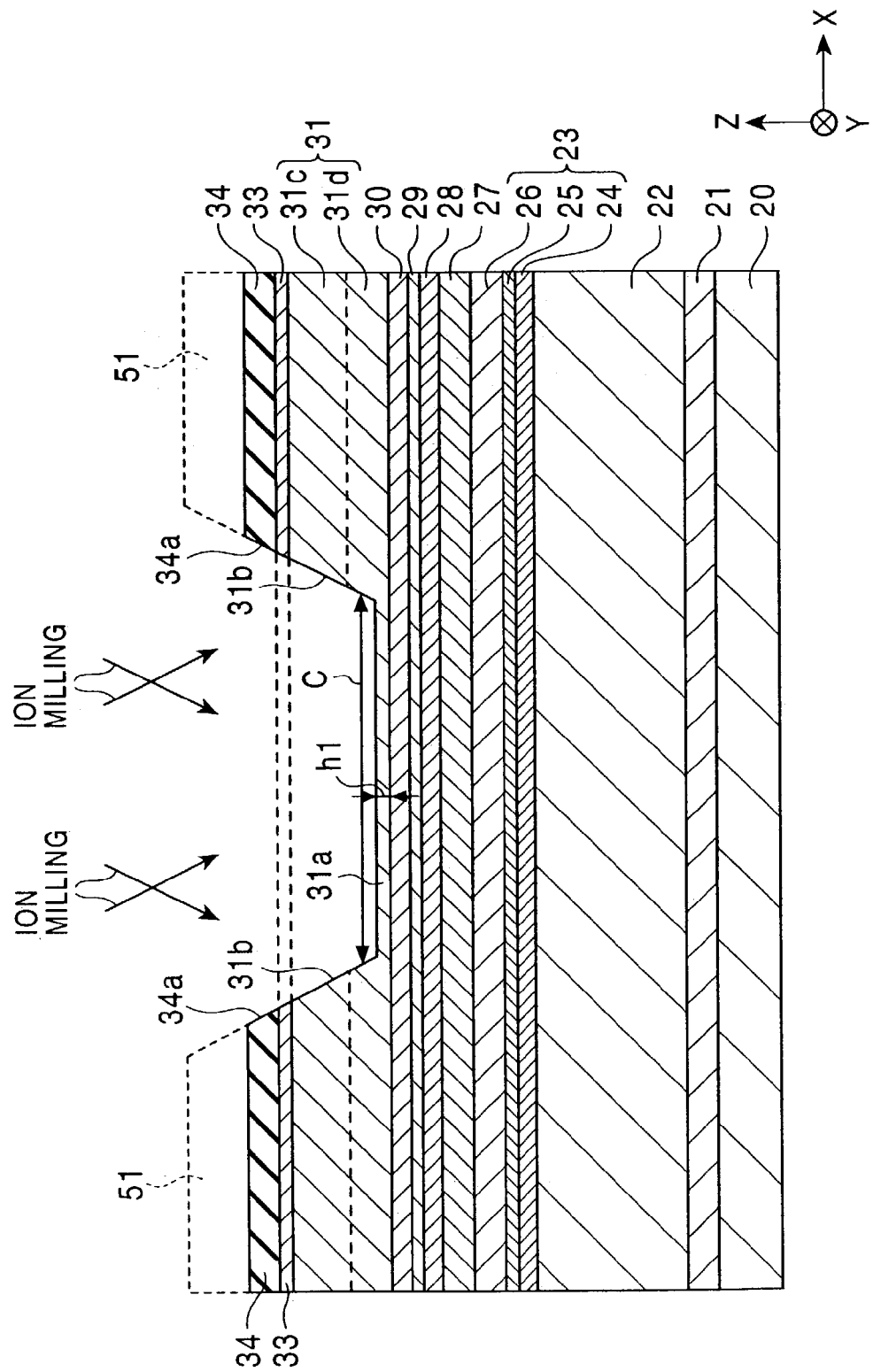
FIG. 9 is a drawing showing a step after the step shown in FIG. 8.

In the next step shown in FIG. 9, the exposed portion (a dotted-line portion) of the first stopper layer 33 between the mask layers 51 is removed by ion milling, and then the second antiferromagnetic layer 31 formed below the first stopper layer 33 is further removed to an intermediate portion (a dotted-line portion) by ion milling. In this step, the mask layers 51 are also removed. As shown in FIG. 9, the second antiferromagnetic layer 31a (referred to as the "inner ends 31a" hereinbefore, but referred to as the "second antiferromagnetic layer 31a" hereinafter for convenience's sake) having a thickness of h1 is left at the center of the element. The thickness hi is 50 Å or less, and preferably 40 Å or less. With the second antiferromagnetic layer 31a having the thickness hi of as small as 50 Å or less, an exchange coupling magnetic field produced between the second antiferromagnetic layer 31a and the ferromagnetic layer 30 formed below the second antiferromagnetic layer 31a is weakened or disappears. Where the second magnetic field annealing is performed after the step shown in FIG. 9, not after the step shown in FIG. 6, the second antiferromagnetic layer 31a is less transformed into an ordered structure because of its small thickness, thereby producing no or less antiferromagnetic property. The cutting amount of the second antiferromagnetic layer 31 can be controlled by monitoring with a SIMS analyzer incorporated into an ion milling apparatus. The second antiferromagnetic layer 31a in the central portion may be completely removed to expose the surface of the ferromagnetic layer 30. However, it is difficult to stop etching at the moment the second antiferromagnetic layer 31a in the central portion is completely removed. In this case, the ferromagnetic layer 30 is influenced by etching, and thus a portion of the second antiferromagnetic layer 31a having a thickness of as small as 50 Å or less is preferably left at the center, as shown in FIG. 9.

Also, the portions of the first protective layer 34, the first stopper layer 33 and the second antiferromagnetic layer 31 that are exposed between the mask layers 51, are removed by etching to form the inner end surfaces 34a of the first protective layer 34 and the inner end surfaces 31b of the second antiferromagnetic layer 31 into continued inclined or curved surfaces. Although, as shown in FIG. 9, the mask layers 51 may be completely removed (shown by dotted lines) by the ion milling step, alternatively the mask layers 51 may be slightly left.

After the step shown in FIG. 9, in order to define the element height length (the length dimension in the Y direction) of the magnetic detecting element to be manufactured, the magnetic detecting element is patterned into a predetermined shape to remove the rear side in the height direction, and an insulating layer (referred to as a "back-fill gap layer") made of $Al_2O_3$ is formed on the removed rear side.

Figure 10:
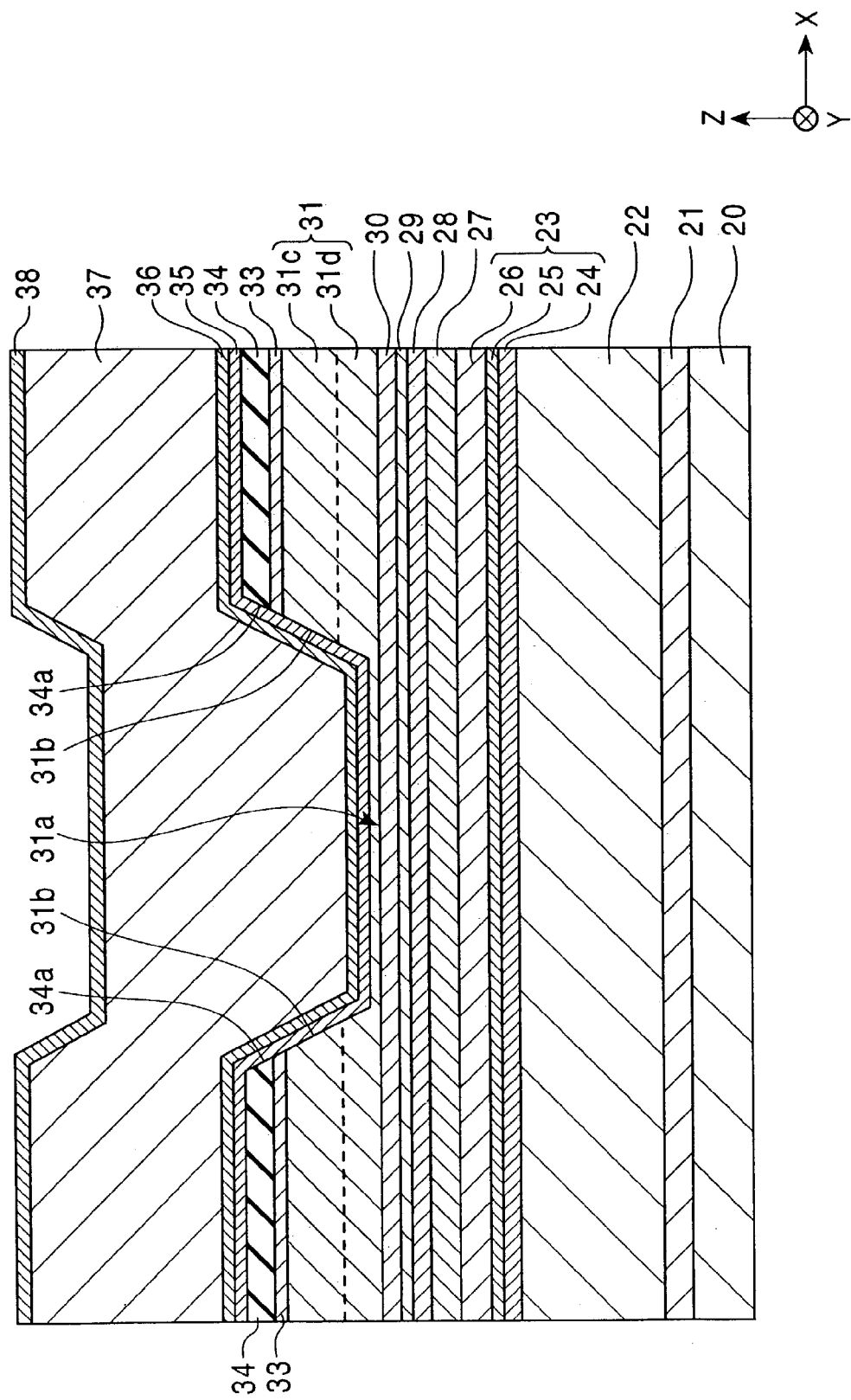
FIG. 10 is a drawing showing a step after the step shown in FIG. 9.

In the next step shown in FIG. 10, a second stopper layer 35 is formed on the first protective layer 34, the inner end surfaces 34a and 31b of the first protective layer 34 and the second antiferromagnetic layer 31, and the second antiferromagnetic layer 31a left in the central portion of the element. Furthermore, a second protective layer 36 is formed on the second stopper layer 35. In the step shown in FIG. 10, an electrode layer 37 is further formed on the second protective layer 36, and a third protective layer 38 is formed on the electrode layer 37. The second stopper layer 35 is made of the same material as that used for the first stopper layer 33. The second and third protective layers 36 and 38 are preferably made of the same material as that used for the first protective layer 34.

The electrode layer 37 is preferably made of a nonmagnetic conductive material such as Au, Pd, Cr, Rh, Ru, Ta, W, or the like.

A first property desirable for the second stopper layer 35 is conductivity. As shown in FIG. 1, the second stopper layer 35 is partially left below the inner ends 37b of the electrode layer 37, and thus the sensing current flows from the inner ends 37b of the electrode layer 37 to the multilayer film 40. Therefore, if the second stopper layer 35 is electrically insulating, the flow of the sensing current is inhibited.

Next, the second stopper layer 35 is preferably made of a material having a lower etching rate than that of the electrode layer 37, or a material which is not etched by the etching gas used for etching the electrode layer 37. The electrode layer 37 is made of, for example, Au or the like, and Ar gas or a mixed gas of Ar and $C_3F_8$ is preferably used as the etching gas. By forming the second stopper layer 35 using Cr or the like, the etching rate of the second stopper layer 35 with the Ar etching gas or mixed etching gas of Ar and $C_3F_8$ can be made lower than that of the electrode layer 37.

When the second stopper layer 35 is made of Cr, and the electrode layer 37 is made of Au, element diffusion easily occurs between the second stopper layer 35 and the electrode layer 37. In order to prevent the element diffusion, the second protective layer 36 made of Ta or the like is preferably formed between the second stopper layer 35 and the electrode layer 37. When the element diffusion does not occur, the second protective layer 36 need not be provided.

The third protective layer 38 is an antioxidation layer for protecting the electrode layer 37 from oxidation due to air exposure.

As described above, the height of the magnetic detecting element is defined to the predetermined dimension before the step shown in FIG. 10. Thus, the height-direction end of the electrode layer 37 can be extended from the height-direction end of the multilayer film ranging from the substrate 20 to the second antiferromagnetic layer 31 formed below the electrode layer 37. Therefore, the element resistance can be decreased to produce a magnetic detecting element capable with good reproduced output.

Figure 11:
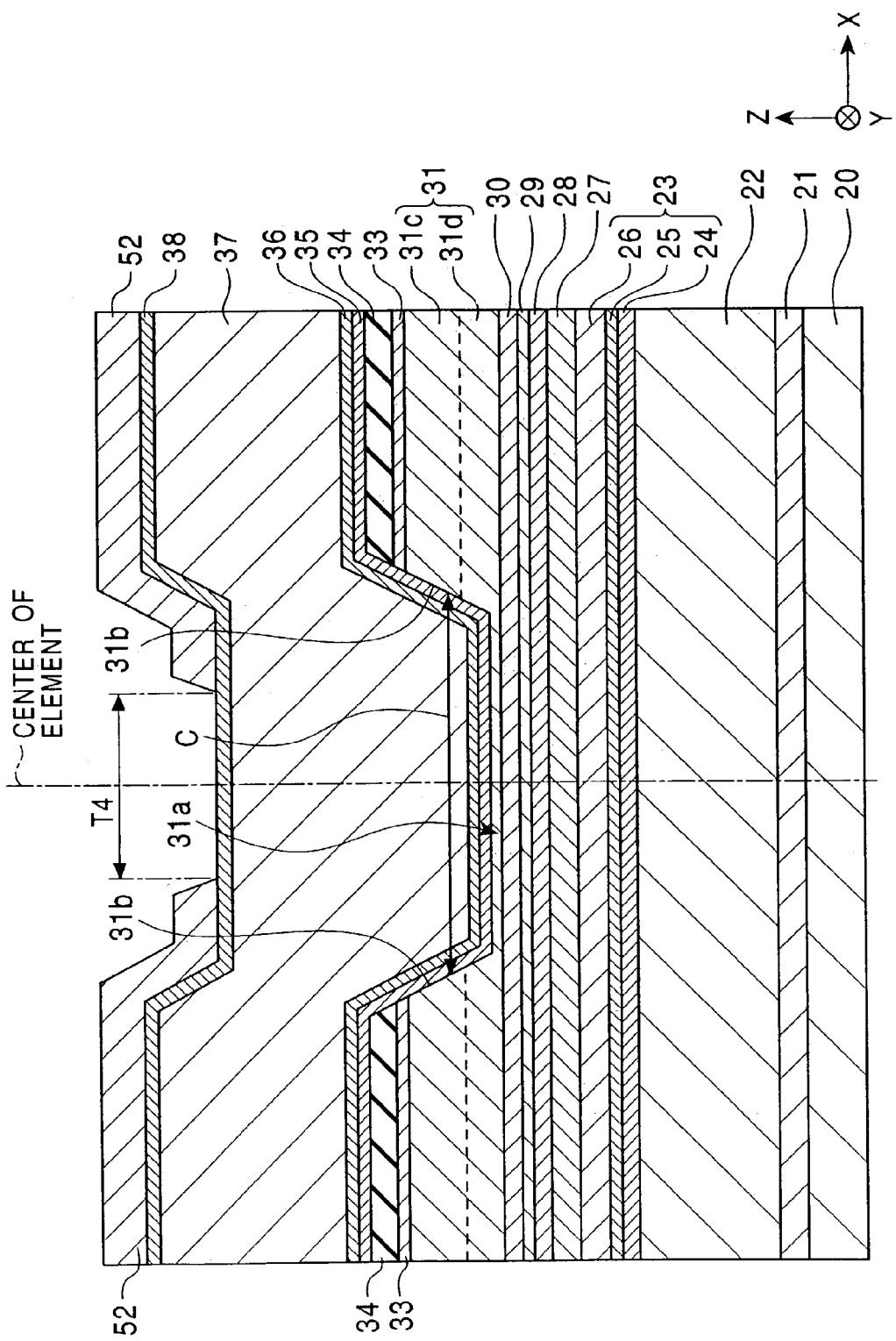
FIG. 11 is a drawing showing a step after the step shown in FIG. 10.

In the next step shown in FIG. 11, mask layers 52 are formed on the third protective layer 38 at a predetermined distance T4 apart in the track width direction (the X direction shown in the drawing). The mask layers 52 are formed in an alignment manner in which the center of the distance T4 between the mask layers 52 in the track width direction coincides with the center of the element in the track width direction. In this step, the mask layers 52 are made of a material which is not or little cut by reaction ion etching (RIE). The mask layers 52 may be made of resist or a metal. In the step shown in FIG. 11, the mask layers 52 are formed by using a metal, for example, Cr. In a next step, the portions of the electrode layer 37, the second antiferromagnetic layer 31a left in the central portion of the element, and the ferromagnetic layer 30 that are not covered with the mask layers 52, are etched. However, at least the mask layers 52 or the third protective layer 38 below the mask layers 52 must be left until the etching step is finished. Therefore, in forming the mask layers 52, the material and thickness of the mask layers 52 must be controlled. Also, the mask layers 52 are preferably made of a material which has a lower etching rate than that of the electrode layer 37, or a material which is not etched.

When the mask layers 52 are made of a metal layer, the thickness of the mask layers 52 is preferably about 100 Å to 500 Å.

The mask layers 52 are preferably formed by forming a lift-off resist layer (not shown) on the distance T4 of the third protective layer 38, depositing a mask layer made of Cr by sputtering on both side portions of the third protective layer 38, which are not covered with the resist layer, and then removing the resist layer.

The distance T4 between the mask layers 52 in the track width direction (the X direction) is preferably smaller than the distance C between the bottoms of the inner end surfaces 31b of the second antiferromagnetic layers 31 in the track width direction. However, when the end surfaces of the electrode layer 37 are formed in inclined or curved surfaces, the distance T4 is not necessarily smaller than the distance C.

Figure 12:
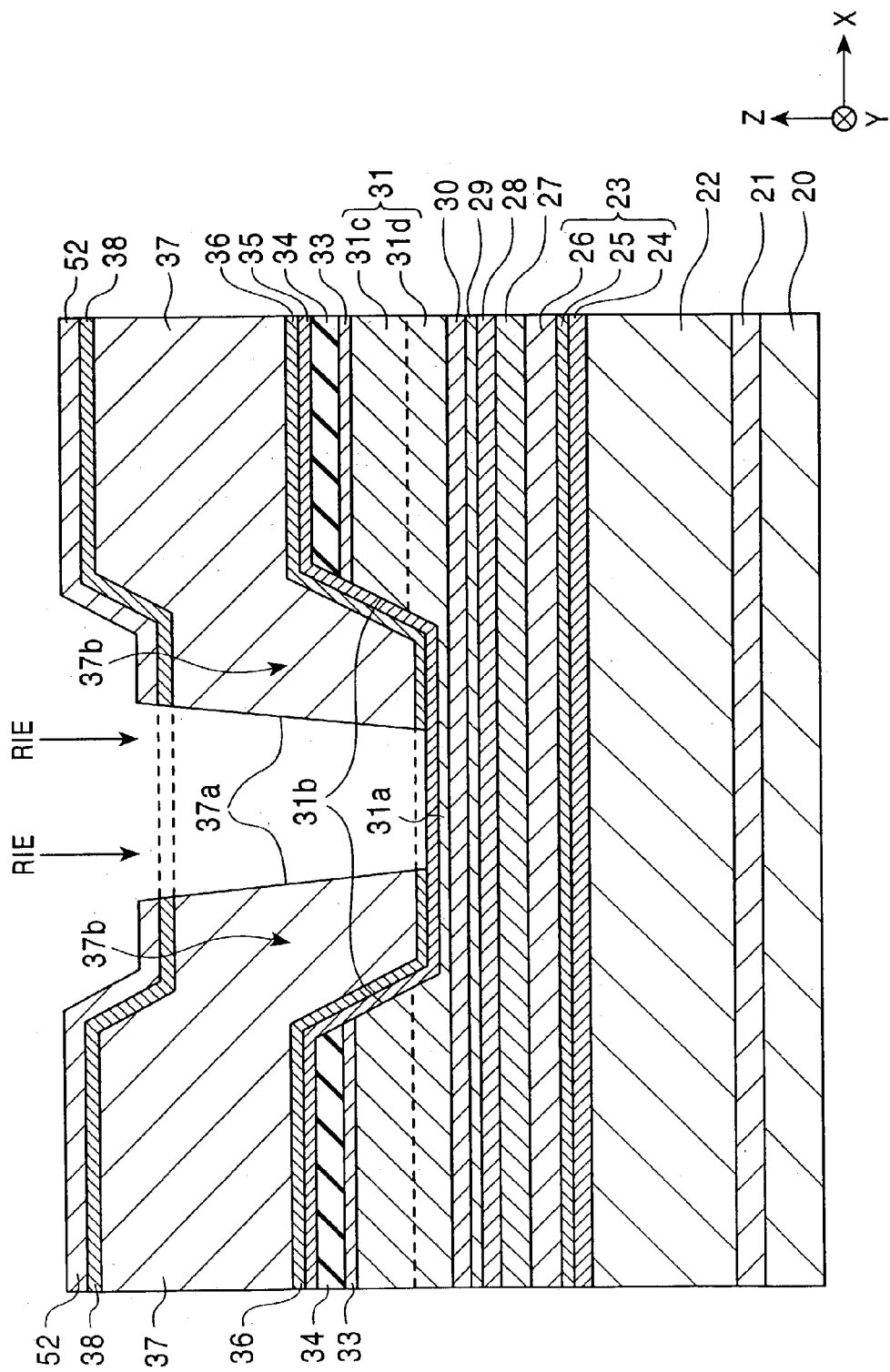
FIG. 12 is a drawing showing a step after the step shown in FIG. 11.

In the next step shown in FIG. 12, the portions of the third protective layer 38 and the electrode layer 37 (shown by dotted lines in FIG. 12) that are not covered with the mask layers 52, are removed by etching. As the etching, reactive ion etching (RIE) is preferably used. As an etching gas, $CF_4$, $C_3F_8$, a mixed gas of Ar and $CF_4$, or a mixed gas of $C_3F_8$ and Ar is preferably used.

In FIG. 12, dotted-line portions of the third protective layer 38, the electrode layer 37 and the second protective layer 36 are removed to expose the surface of the second stopper layer 35. Since the second stopper layer 35 is exposed by completely removing the electrode layer 37, the second stopper layer 35 is unlikely to be completely removed even by over etching. The inner end surfaces 37a of the electrode layer 37 can be formed in appropriately inclined or curved surfaces by over etching so that the distance between the inner end surfaces 37a gradually increases in the upward direction (the Z direction), without leaving a portion of the electrode layer 37 on the second stopper layer 35 exposed by etching.

In the next step shown in FIG. 13, the exposed portion (a dotted-line portion) of the second stopper layer 35 between the mask layers 52 is removed by ion milling, and then the second antiferromagnetic layer 31a left below is further removed. In the step shown in FIG. 13, ion milling is stopped after the exposed portion of the ferromagnetic layer 30 is completely removed. In the ion milling, the cutting amount can be controlled by monitoring with a SIMS analyzer incorporated into an ion milling apparatus. Particularly, low-energy ion milling can be performed because a layer to be cut is thin. Therefore, milling controllability can be improved, and milling can be precisely stopped at the moment the exposed portion of the ferromagnetic layer 30 is completely removed.

The low-energy ion milling is defined as ion milling using an ion beam with a beam voltage (acceleration voltage) of less than 1000 V. For example, a beam voltage of 150 V to 500 V can be used. In this embodiment, an (Ar) argon ion beam with a low beam voltage of 200 V is used.

In the step shown in FIG. 13, the nonmagnetic intermediate layer 29 below the ferromagnetic layer 30 is left after the exposed portion of the ferromagnetic layer 30 is removed by ion milling. However, the nonmagnetic intermediate layer 29 may be partially removed or completely removed to expose the surface of the free magnetic layer 28. In the step shown in FIG. 13, the portion of the ferromagnetic layer 30 that is exposed between the mask layers 52, is completely removed by ion milling, but alternatively the exposed portion may be partially left.

Figure 13:
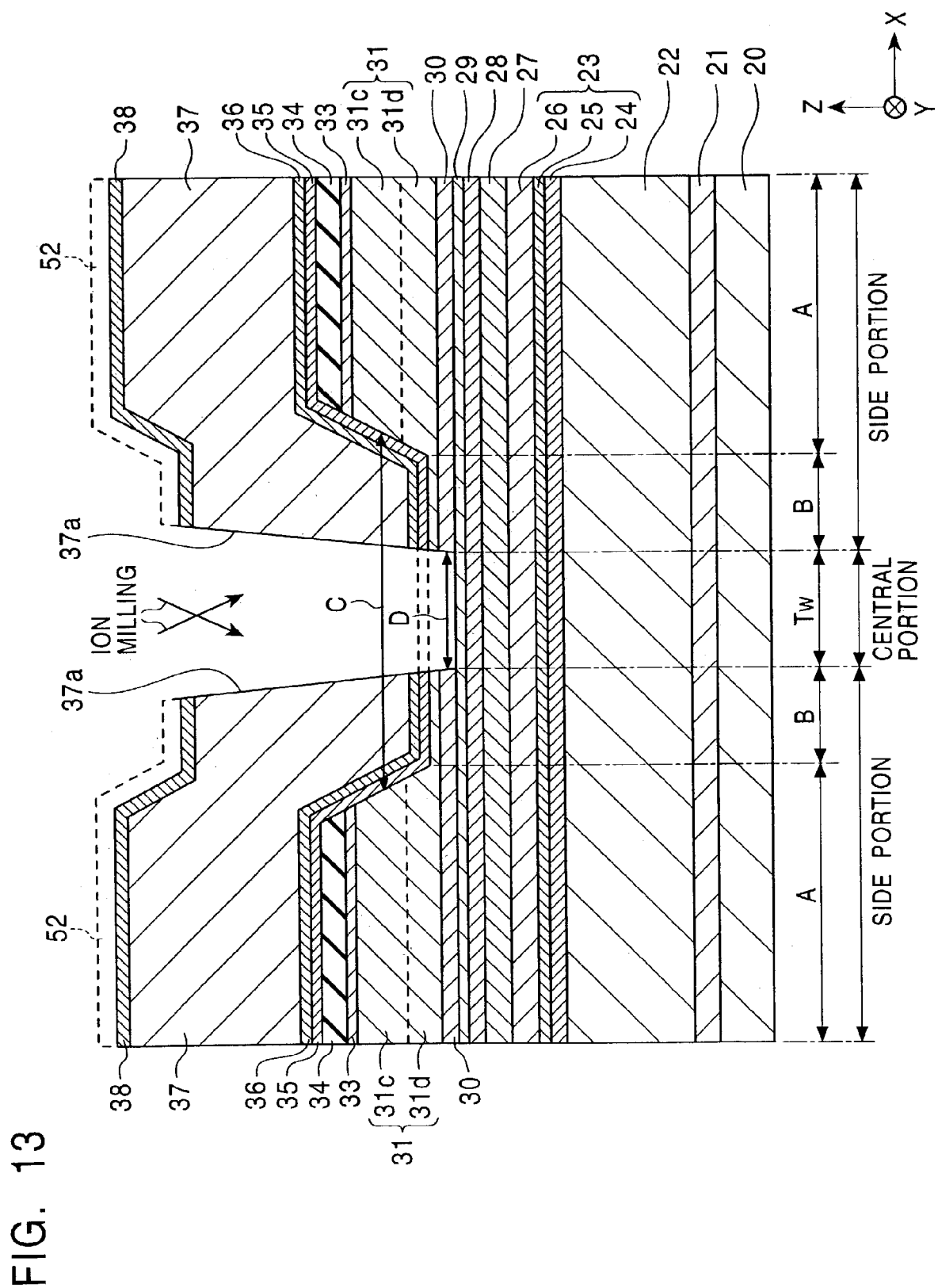
FIG. 13 is a drawing showing a step after the step shown in FIG. 12.

After the step shown in FIG. 13 is completed, the ferromagnetic layer 30 is absent from the central portion of the free magnetic layer 28, while in each of the regions B of the side portions near the central portion, a synthetic ferrimagnetic structure comprising the free magnetic layer 28 and the ferromagnetic layer 30 provided thereon with the nonmagnetic intermediate layer 29 provided between the two layers is formed. However, in each of the regions B, the second antiferromagnetic layer 31 is not provided on the ferromagnetic layer 30 (in FIG. 13, the thin inner end 31*a* of the second antiferromagnetic layer 31 is left on the ferromagnetic layer 30). In each of the regions A in the side portions apart from the center of the element, a synthetic ferrimagnetic structure comprising the free magnetic layer 28 and the ferromagnetic layer 30 provided thereon with the nonmagnetic intermediate layer 29 provided between the two layers is formed, and the second antiferromagnetic thick layer 31 is laminated on the ferromagnetic layer 30.

The track width Tw is determined by the distance D between the bottoms of the ferromagnetic layers 30 in the track width direction.

After the step shown in FIG. 13, a fourth protective layer 39 is formed on the third protective layer 38, the inner ends 37*a* of the electrode layer 37 and the exposed portion of the nonmagnetic intermediate layer 29. Alternatively, where the exposed portion of the nonmagnetic intermediate layer 29 is completely removed to expose the surface of the free magnetic layer 28, the fourth protective layer 39 can be used as a specular layer in one implementation, the fourth protective layer 39 is formed to a thickness of about 10 Å to 20 Å by using Ta, and then the Ta layer is entirely oxidized to form the fourth protective layer 39 functioning as the specular layer. By forming the fourth protective layer 39, electrical insulation between the electrode layer 37 and an upper shield layer formed in a subsequent step can be increased.

The embodiment of the method of manufacturing the magnetic detecting element shown in FIG. 1 is described above with reference to FIGS. 5 to 13. For this embodiment, in the step shown in FIG. 5, the nonmagnetic intermediate layer 29 and the ferromagnetic layer 30 are formed on the free magnetic layer 28 to form the synthetic ferrimagnetic structure. In the step shown in FIG. 9, the central portion of the second antiferromagnetic layer 31, which is not covered with the mask layers 51, is removed by ion milling, to form the distance C larger than the track width Tw in the second antiferromagnetic layer 31. In the step shown in FIG. 12, the portion of the electrode layer 37 that is not covered with the mask layers 52 is removed by RIE to form, in the electrode layer 37, a distance smaller than the distance C of the second antiferromagnetic layer 31 in the track width direction. In the step shown in FIG. 13, the portion of the ferromagnetic layer 30 that is exposed by removing the electrode layer 37 is also removed by ion milling.

Therefore, a portion of the ferromagnetic layer 30 is left so as to extend from each of the inner end surfaces 31*b* of the second antiferromagnetic layer 31 toward the center in the track width direction, and the distance D between the extending portions of the ferromagnetic layer 30 can be made smaller than that distance C of the second antiferromagnetic layer 31. Furthermore, only the free magnetic layer 28 can be left in the central portion of the element so as not to form the synthetic ferrimagnetic structure. The inner ends 37*b* of the electrode layer 37 can be overlapped with the extending portions of the ferromagnetic layer 30.

In the embodiment described above, the nonmagnetic intermediate layer 29 and the ferromagnetic layer 30 are formed on the free magnetic layer 28 to form the synthetic ferrimagnetic structure, and mask alignment is performed twice to permit the easy formation of the proper magnetic detecting element shown in FIG. 1.

However, with low alignment precision, the two times of mask alignment have the problem of failing to form the inner ends 37*b* of the electrode layer 27 in equal shapes in the track width direction on the extending portions of the ferromagnetic layer 30, which extend from the inner end surfaces 31*b* of the respective second antiferromagnetic layer 31 toward the center in the track width direction. The inner ends 37*b* of the electrode layer 37 are preferably formed in equal shapes for improving reproduced output and suppressing the occurrence of side reading.

Therefore, as in the embodiment of the magnetic detective element shown in FIG. 3, the electrode layer is divided into the first and second electrodes 43 and 46 which are formed separately. FIGS. 14 to 17 are partial sectional views respectively showing steps of the method of manufacturing the magnetic detecting element shown in FIG. 3, as viewed from a side facing a recording medium.

First, a description will be made of the initial steps corresponding to steps described above for the embodiments shown in FIGS. 6 to 9. After the step shown in FIG. 6 (in the step corresponding to that shown in FIG. 7), a first electrode layer 43 and a protective layer 55 made of Ta are deposited on a first protective layer 34, and mask layers 51 are formed on the protective layer 55. Next (in the step corresponding to FIG. 8), the portions of the protective layer 55, the first electrode layer 43 and the first protective layer 34 that are not covered with the mask layers 51, are removed by reactive ion etching (RIE) to form a distance with a predetermined width in the central portion of the element, exposing the first stopper layer 33 within the distance. Then (in the step corresponding to FIG. 9), the exposed portions of the first stopper layer 33 and the second antiferromagnetic layer 31 are removed by ion milling to form a space with a predetermined width in the central portion of the element. The resultant state is shown in FIG. 14.

Figure 14:
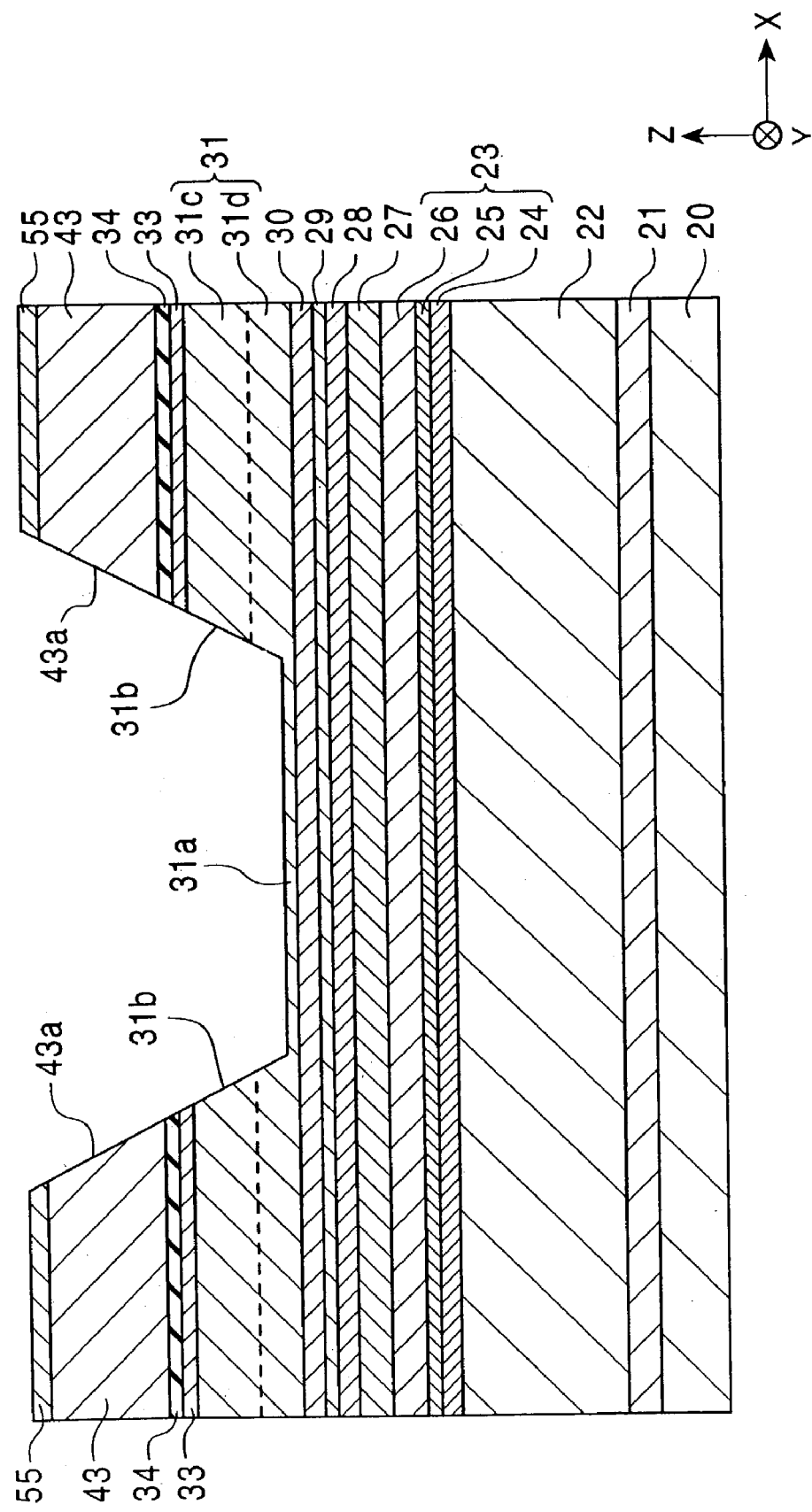
FIG. 14 is a drawing showing a step of a process for manufacturing a magnetic detecting element such as the element shown in FIG. 3.

As shown in FIG. 14, the inner end surfaces 43*a* and 31*b* of the first electrode layer 43 and the second antiferromagnetic layer 31 are formed in a continuous inclined or curved surface so that the space formed in the track width direction of the first electrode layer 43 and the second antiferromagnetic layer 31 gradually increases in the upward direction.

Although a second antiferromagnetic layer 31*a* which is thinner than the side portions of the second antiferromagnetic layer 31 is left at the center of the element, as shown in FIG. 14, the second antiferromagnetic layer 31*a* may be completely removed from the central portion of the element to expose the surface of the ferromagnetic layer 30.

Figure 15:
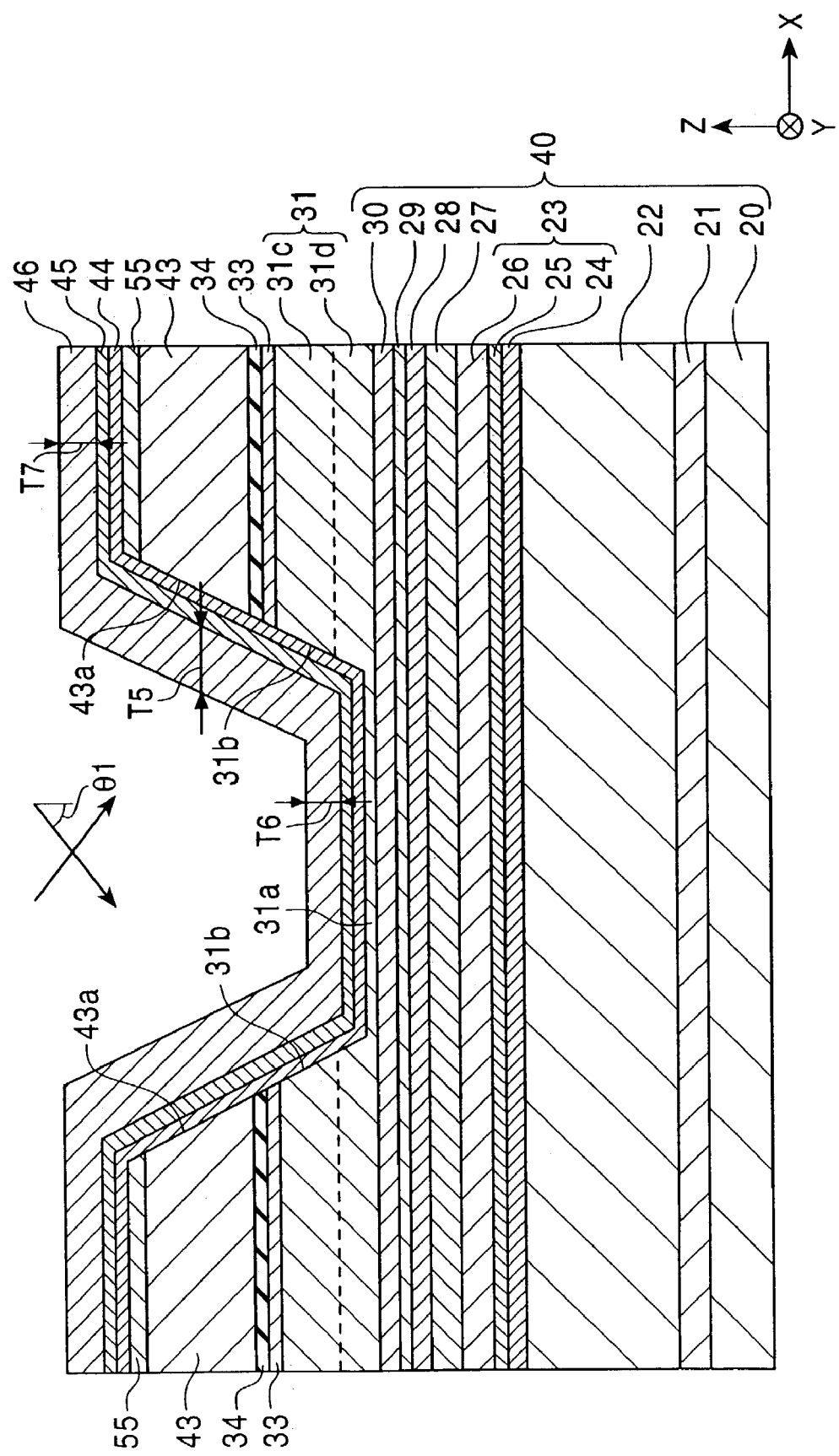
FIG. 15 is a drawing showing a step after the step shown in FIG. 14.

In the next step shown in FIG. 15, a second stopper layer 44 is formed on the protective layer 55, the inner end surfaces 43*a* and 31*b* of the first electrode layer 43 and the second antiferromagnetic layer 31, and the second antiferromagnetic thin layer 31*a* left at the center of the element, and a second protective layer 45 is formed on the second stopper layer 44. For example, in this step, the layers are deposited by an ion beam sputtering method.

Particularly, the second stopper layer 44 is preferably formed to a predetermined thickness on the portion of the second antiferromagnetic layer 31a, which is left at the center of the element. This is because in a subsequent step, the second stopper layer 44 must be appropriately used as a stopper layer in the central portion. Therefore, in depositing the second stopper layer 44, the sputtering angle is preferably perpendicular to the surface of the substrate or close to the perpendicular direction.

In this step, the second stopper layer 44 is preferably made of Cr, or at least one element of Ta, V, Nb, Mo, W, Fe, Co, Ni, Pt, and Rh. A first property desirable for the second stopper layer 44 is conductivity. The second stopper layer 44 is partially left below the second electrode layer 46 described below, and thus the sensing current flows from the second electrode layer 46 to the multilayer film 40. Therefore, if the second stopper layer 44 is electrically insulating, the flow of the sensing current is inhibited.

Next, the second stopper layer 44 is preferably made of a material having a lower etching rate than that of the second electrode layer 46, or a material which is not etched with an etching gas used for etching the second electrode layer 46. The second electrode layer 46 is made of, for example, Au or the like, and Ar gas or a mixed gas of Ar and $C_3F_8$ is preferably used as the etching gas. By forming the second stopper layer 44 using Cr or the like, the etching rate of the second stopper layer 44 with the Ar etching gas or mixed etching gas of Ar and $C_3F_8$ can be made lower than that of the second electrode layer 46.

When the second electrode layer 46 is made of Au, and the second stopper layer 44 is made of Cr, element diffusion easily occurs between the second electrode layer 46 and the second stopper layer 44. Therefore, the second protective layer 45 made of Ta or the like is preferably formed between and the second electrode layer 46 and the second stopper layer 44.

In depositing the second electrode layer 46, the sputtering angle is θ1{inclination from a direction (the Z direction) perpendicular to the substrate 20}. In one implementation of the method, the sputtering angle θ1 is about 50° to 70°. That is, the sputtering angle θ1 is set to a larger value so that the second electrode layer 46 can be deposited by sputtering in an oblique direction.

By increasing the sputtering angle θ1, the second electrode layer 46 can be formed on the inner end surfaces 43a of the first electrode layer 43 and the inner end surfaces 31b of the second antiferromagnetic layer 31 through the second stopper layer 44 and the second protective layer 45, with a thickness T5 in the track width direction (the X direction) that can be made larger than (1) the thickness T6 of the portion of the second electrode layer 46, which is formed on the second antiferromagnetic layer 31a left at the center of the element through the second stopper layer 44 and the second protective layer 45, and (2) the thickness T7 of the portion of the second electrode layer 46, which is formed on the first electrode layer 43 through the protective layer 55, the second stopper layer 44 and the second protective layer 45.

If the thickness of the second electrode layer 46 is not controlled in the above-described manner, the portions of the second electrode layer 46 that are formed on the inner ends 43a and 31b of the first electrode layer 43 and the second antiferromagnetic layer 31 can be entirely removed by ion milling or reactive ion etching (RIE) in the next step, or the second electrode layer 46 can be thinly left, thereby failing to form an electrode layer having an appropriate overlap structure.

During sputtering, the thickness T6 of the portion of the second electrode layer 46, as formed on the second antiferromagnetic layer 31a, is decreased by a so-called shadow effect in which the second antiferromagnetic layer 31a left at the center of the element is shadowed due to the presence of the second antiferromagnetic thick layer 31 and the first electrode thick layer 43 on both sides of the second antiferromagnetic layer 31a.

In this step, the portions of the second electrode layer 46 that are formed on the inner end surfaces 43a of the first electrode 43 and on the inner end surfaces 31b of the second antiferromagnetic layer 31 can easily be formed to the equal thicknesses T5 in the track width direction.

Figure 16:
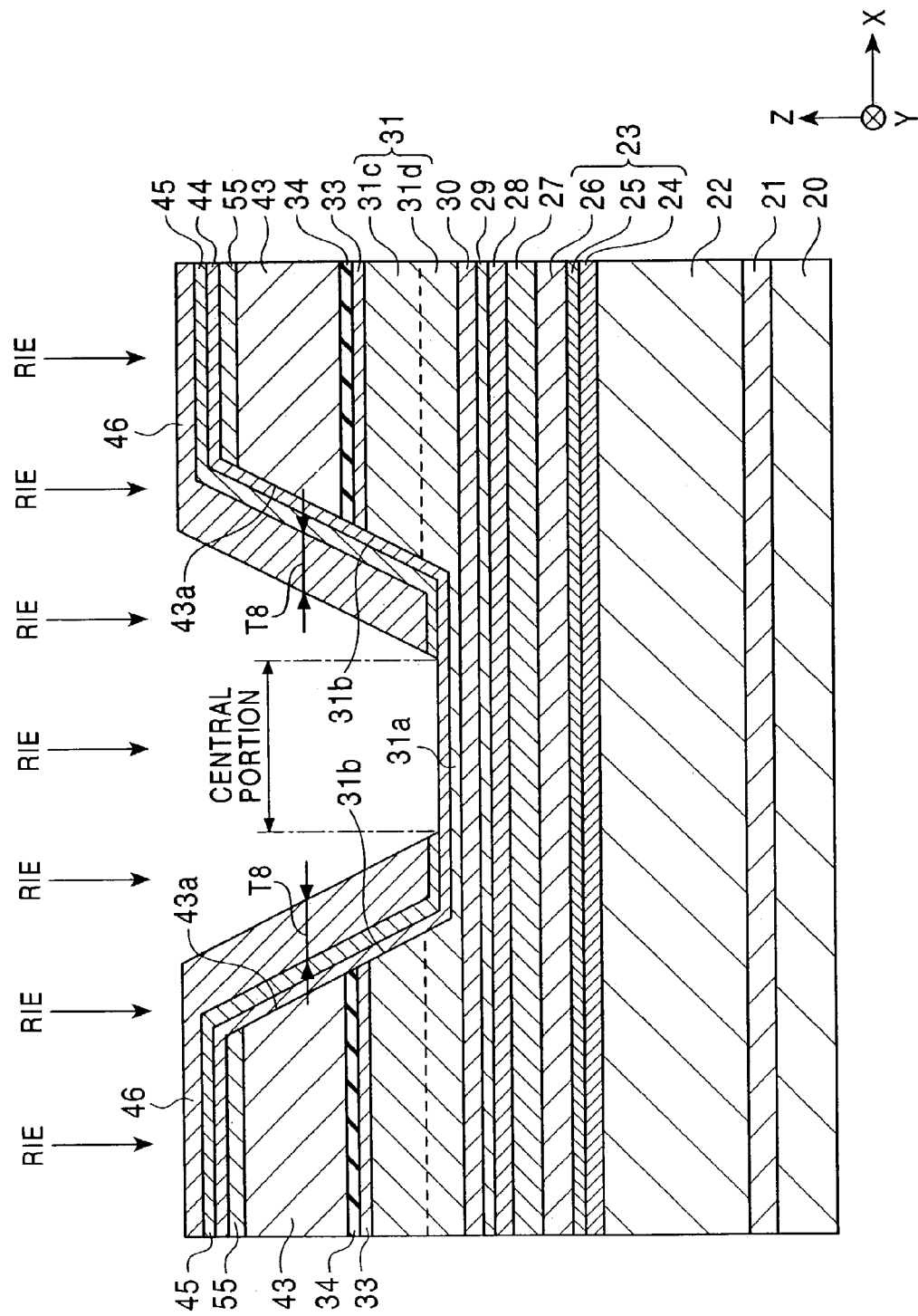
FIG. 16 is a drawing showing a step after the step shown in FIG. 15.

Next, anisotropic etching is performed by reaction ion etching (RIE) in the direction (parallel to the Z direction shown in the drawing) perpendicular to the substrate 20 or at an angle (about 0° to 20° with respect to the direction perpendicular to the surface of each layer of the multilayer film) close to a right angle, as shown by arrows in FIG. 16. In this step, RIE is continued until the portion of the second electrode layer 46 that is formed on the second antiferromagnetic layer 31a left at the center of the element, is appropriately removed. Although the portion of the second electrode layer 46 that is formed on the first electrode layer 43 is also partially removed by ion milling or RIE, the second electrode layer 46 is slightly left on the first electrode layer 43.

Portions of the second electrode layer 46 that are formed on the inner end surfaces 43a of the first electrode 43 and on the inner end surface 31b of the second antiferromagnetic layer 31 are also slightly removed. Nonetheless, the portions of the second electrode 46 that are formed on the inner end surfaces 43a of the first electrode 43 and on the inner end surface 31b of the second antiferromagnetic layer 31 have a larger thickness than that of the second electrode layer 46 formed on the second antiferromagnetic layer 31a. The etching direction is inclined with respect to the portions of the second electrode layer 46 that are formed on the inner end surfaces 43a of the first electrode 43 and on the inner end surface 31b of the second antiferromagnetic layer 31. Therefore, the portions of the second electrode layer 46 that are formed on the inner end surfaces 43a of the first electrode 43 and on the inner end surfaces 31b of the second antiferromagnetic layer 31 are less removed than the second electrode layer 46 formed on the second antiferromagnetic layer 31a, thereby leaving the second electrode layer 46 with an appropriate thickness T8 on the inner end surfaces 43a of the first electrode 43 and on the inner end surface 31b of the second antiferromagnetic layer 31.

As shown in FIG. 16, the second stopper layer 44 is exposed in the central portion of the element after the second electrode layer 46 is entirely removed. The second stopper layer 44 is made of, for example, a material having a lower etching rate than hat of the second electrode layer 46. Therefore, even when over etching is performed for entirely removing the second electrode layer 46 from the central portion of the element, the second stopper layer 44 appropriately protects the lower layers from the etching.

In the RIE step shown in FIG. 16, the portions of the second electrode layer 46 that are formed on the inner end surfaces 43a of the first electrode 43 and on the inner end surface 31b of the second antiferromagnetic layer 31, are removed to equal thicknesses in the track width direction. Therefore, the portions of the second electrode layer 46 that are left on the inner end surfaces 31b and 43a, have equal thicknesses T8 in the width direction.

Figure 17:
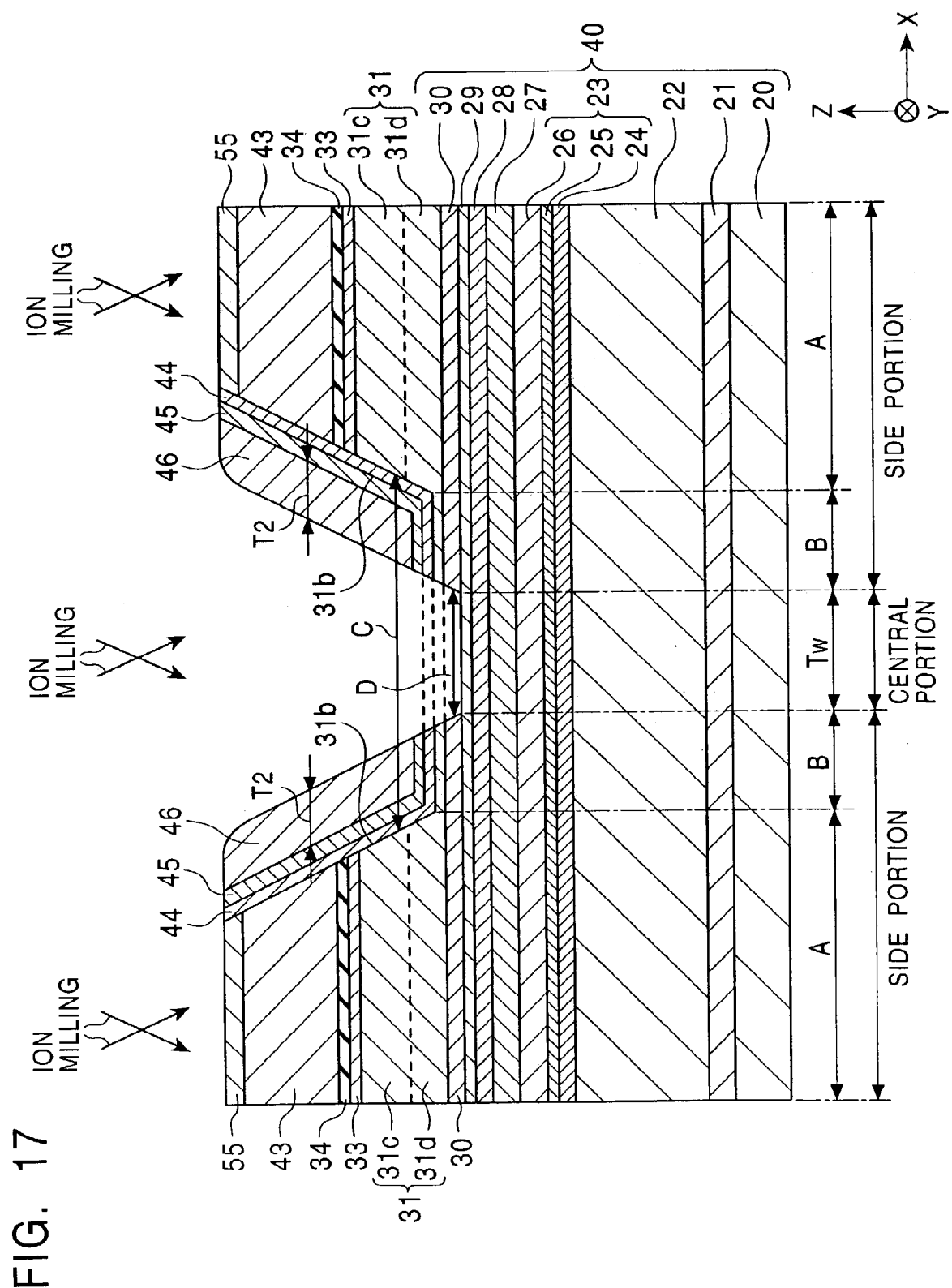
FIG. 17 is a drawing showing a step after the step shown in FIG. 16.

In the next step shown in FIG. 17, the portion of the second stopper layer 44 that is exposed in the central portion of the element, the second antiferromagnetic thin layer 31a, and the ferromagnetic layer 30 (shown by dotted line in FIG. 17) are removed by ion milling to expose the surface of the nonmagnetic intermediate layer 29 from the central portion of the element.

In the ion milling, portions of the second electrode layer 46 that were left on the top of the first electrode layer 43 are removed to leave the second electrode layer 46 only on the inner end surfaces 43a and 31b of the first electrode 43 and the second antiferromagnetic layer 31.

In the ion milling step shown in FIG. 17, the milling angle is close to the direction perpendicular to the substrate 20. Therefore, the portions of the second electrode layer 46 that are formed on the inner end surfaces 43a and 31b of the first electrode layer 43 and the second antiferromagnetic layer 31 are less affected by the ion milling, but are slightly removed to equal thicknesses of T2 in the track width direction. The thicknesses T2 correspond to the lengths of overlap with the multilayer film 40, and are preferably 50 Å to 1000 Å.

In the step shown in FIG. 17, the nonmagnetic intermediate layer 29 is exposed from the central portion of the element. However, in the alternative, the exposed portion of the nonmagnetic intermediate layer 29 may be removed to expose the surface of the free magnetic layer 28 from the central portion of the element.

Although, in the step shown in FIG. 17, the portion of the ferromagnetic layer 30 that is exposed from the central portion of the element is entirely removed, the exposed portion of the ferromagnetic layer 30 may be partially left.

In the step shown in FIG. 17, the track width Tw is controlled by the distance D between the lower edges of the ferromagnetic layer 30.

Then, as shown in FIG. 3, the fourth protective layer 39 is formed on the protective layer 55, the inner end surfaces of the second electrode layer 46, and the portion of the nonmagnetic intermediate layer 29 that is exposed in the central portion of the element. The fourth protective layer 39 comprises, for example, a Ta oxide layer.

Unlike the method of manufacturing the magnetic detecting element shown in FIG. 1, the above-described method of manufacturing the magnetic detecting element shown in FIG. 3 can form the first and second electrode layers 43 and 46 in the separate steps without the need for two times of mask alignment. In the magnetic detecting element shown in FIG. 3, the first electrode layer 43 is formed in a predetermined shape on the side portions of the second antiferromagnetic layer 31 by one time of mask alignment in the same step as shown in FIG. 7. However, in the steps shown in FIGS. 15 to 17, the second electrode layer 46 can be formed to the equal thicknesses in the width direction only by sputtering deposition, ion milling and RIE without the need for mask alignment, thereby precisely forming the equal overlap structures in the width direction.

Like in the embodiment of manufacturing the magnetic detecting element shown in FIG. 1, in the embodiment of manufacturing the magnetic detecting element shown in FIG. 3, the nonmagnetic intermediate layer 29 and the ferromagnetic layer 30 are first formed on the free magnetic layer 28 (as was discussed for FIG. 5) to form the synthetic ferrimagnetic structure, and then (as was discussed for FIG. 9) the central portion of the second antiferromagnetic layer 31, which is not covered with the mask layers 51, is removed by ion milling. However, the distance C, which is greater than the track width Tw, is formed in the second antiferromagnetic layer 31, and in the step shown in FIG. 16, only the central portion of the second electrode layer 46 is removed by RIE. Furthermore, in the step shown in FIG. 17, the portions of the second stopper layer 44, the second antiferromagnetic thin layer 31a, and the ferromagnetic layer 30 that are exposed in the central portion of the element, are removed.

As a result, the extending portion of the ferromagnetic layer 30, which extends from the inner end surfaces 31b of the respective second antiferromagnetic layer 31 toward the center in the track width direction, can be left, and the distance D between the extending portions of the ferromagnetic layer 30 can be made smaller than the distance C of the second antiferromagnetic layer 31. Furthermore, only the free magnetic layer 28 can be left in the central portion of the element so as not to form the synthetic ferrimagnetic structure. The second electrode layer 46 can be overlapped with the extending portions of the ferromagnetic layer 30.

In the embodiments shown in FIGS. 1 and 3, the second antiferromagnetic thin layer 31a is left at the center of the element in the step shown in FIG. 9, so that the ferromagnetic layer 30 below the second antiferromagnetic layer 31a can be protected from ion milling in the step shown in FIG. 9. Also, the second antiferromagnetic thin layer 31a is finally left as the inner ends 31a on the portions of the ferromagnetic layer 30 that extend from the inner end surfaces 31b of the respective second antiferromagnetic layer 31 toward the center in the track width direction in the regions B.

In the step shown in FIG. 10 or 15, the second stopper layer 35 or 44 is formed so that the influence of etching on the layers below the second stopper layer 35 or 44 can be prevented by the second stopper layer 35 or 44 even when over etching is performed in the step shown in FIG. 12 or 16. In the next step shown in FIG. 13 or 17, the amount of cutting by low-energy ion milling can easily be precisely adjusted by the SIMS analyzer, thereby avoiding the problem of over-etching the portion of the free magnetic layer 28, which is exposed from the central portion of the element.

Each of the CPP-type magnetic detecting elements shown in FIGS. 2 and 4 may be manufactured by the same steps as shown in FIGS. 5 to 17 except that an insulating layer made of $Al_2O_3$, $SiO_2$, or the like is formed in place of the electrode layer. In this embodiment of the technique for manufacturing the CPP-type magnetic detecting element, the substrate 20 is used as a lower electrode layer, and an upper electrode layer is formed in place of the fourth protective layer 39 after the steps are completed.

The magnetic detecting element can be provided on a magnetic head incorporated into a hard disk device, and used as a magnetic sensor.

EXAMPLES

Figure 18A:
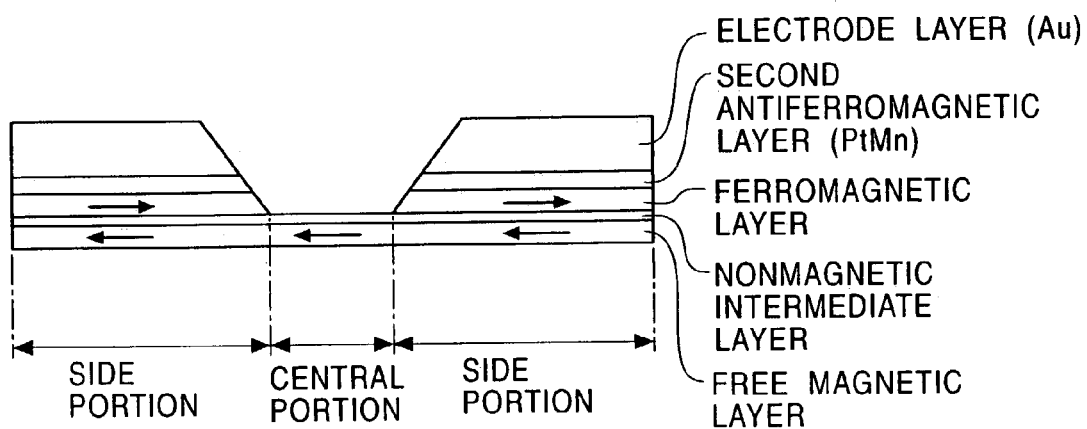
FIGS. 18A and 18B are drawings of the structures of magnetic detecting elements used in experiments, in each of which only a free magnetic layer and layers formed thereon are shown.
Figure 18B:
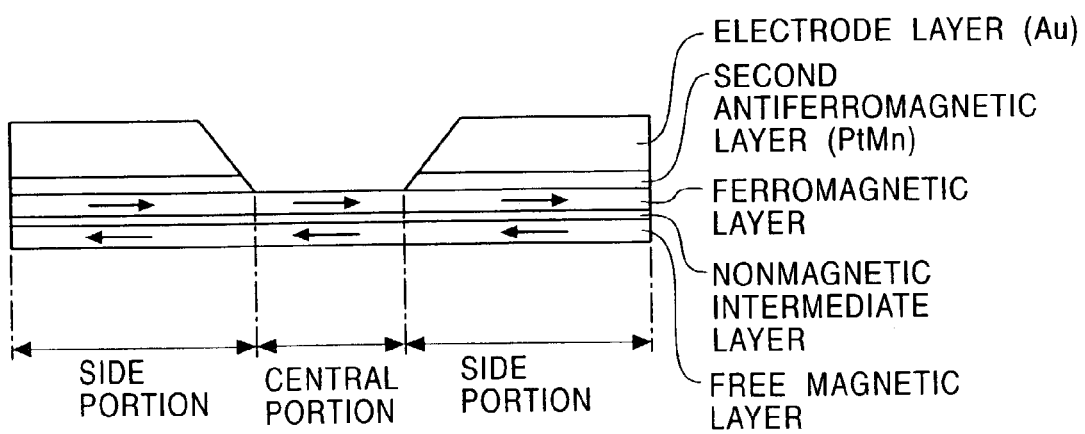

A magnetic detecting element having each of the structures shown in FIGS. 18A and 18B was formed, and studied with respect to reproduced output.

FIGS. 18A and 18B are respectively schematic drawings of the structures in each of which only a free magnetic layer and layers formed on the free magnetic layer of the magnetic detecting element are shown. Each of the magnetic detecting elements shown in FIGS. 18A and 18B comprises a first antiferromagnetic layer made of a PtMn alloy, a pinned magnetic layer of a synthetic ferrimagnetic structure, and a nonmagnetic material layer made of Cu are laminated on a substrate (not shown in the drawings), and a free magnetic layer, a nonmagnetic intermediate layer and a ferromagnetic layer are formed on the nonmagnetic material layer.

The free magnetic layer comprises $Co_{90at\%}Fe_{10at\%}$ of 32 Å, the nonmagnetic intermediate layer comprises Ru of 9 Å, and the ferromagnetic layer comprising $Co_{90at\%}Fe_{10at\%}$ of 14 Å. Also, second antiferromagnetic layers comprising $Pt_{50at\%}Mn_{50at}\%$ of 200 Å, and electrode layers made of Au are formed.

In the magnetic detecting element shown in FIG. 18A, the ferromagnetic layer is formed only on both side portions of the element without being formed in the central portion of the element, while in the magnetic detecting element shown in FIG. 18B, the ferromagnetic layer is formed over the entire region including the central portion and side portions of the element.

The track width Tw (in FIG. 18A, the distance between the ferromagnetic layers, while in FIG. 18B, the distance between the second antiferromagnetic layer) is about 0.2 μm. In FIGS. 18A and 18B, the magnetization directions of the free magnetic layer and the ferromagnetic layer are shown by arrows. The free magnetic layer and the ferromagnetic layer with the nonmagnetic intermediate layer provided therebetween constitute a synthetic ferrimagnetic structure in which the magnetizations of the free magnetic layer and the ferromagnetic layer are antiparallel to each other.

Experiments were conducted by using each of the magnetic detecting elements shown in FIGS. 18A and 18B to determine a voltage difference (ΔV) with external magnetic fields of ±100 Oe (an external magnetic field of +100 Oe represents the direction and intensity of an external magnetic field, for example, in the height direction, and an external magnetic field of -100 Oe represents the direction and intensity of an external magnetic field in the direction opposite to the height direction). A larger voltage difference shows that the reproduced output is large. The external magnetic field intensity of 100 Oe is about $7.9 \times 10^3$ (A/m).

As a result of the experiments, a voltage different of 1.17 mV was produced in the magnetic detecting element shown in FIG. 18A, and a voltage difference of 0.33 mV was produced in the magnetic detecting element shown in FIG. 18B. It was thus found that in the magnetic detecting element shown in FIG. 18A having a structure in which the central portion of the element comprises only the free magnetic layer without the ferromagnetic layer, the reproduced output can be improved, as compared with the magnetic detecting element FIG. 18B having a structure in which the central portion of the element has the synthetic ferrimagnetic structure. Therefore, in the central portion of the element, the ferromagnetic layer 30 is preferably not formed on the free magnetic layer 28 with the nonmagnetic intermediate layer 29 provided therebetween, so that the central portion comprises only the free magnetic layer 28, as shown in FIGS. 1 to 4.

Next, the magnetic detecting element shown in FIG. 18B was used for studying the relationship between the reproduced output and the synthetic magnetic moment (Net Mst) per unit area obtained by subtracting the magnetic moment per unit area of the ferromagnetic layer from the magnetic moment per unit area of the free magnetic layer, and the relationship between the reproduced output and the thickness difference obtained by subtracting the thickness of the ferromagnetic layer from the thickness of the free magnetic layer.

Experiments were conducted by using the film structure of the magnetic detecting element shown in FIG. 18B. The material and thickness of each layer were as described above.

In the experiments, the thickness of each of the free magnetic layer and the ferromagnetic layer was changed to change the magnetic moment (saturation magnetization Ms×thickness t) per unit area of each of the free magnetic layer and the ferromagnetic layer. Then, the magnetic detecting element shown in FIG. 18B was used for determining a ratio {ΔV (±100 Oe)/ΔV (±4000 Oe)} of the voltage difference (ΔV) with external magnetic fields of ±100 Oe (an external magnetic field of +100 Oe represents the direction and intensity of an external magnetic field, for example, in the height direction, and an external magnetic field of -100 Oe represents the direction and intensity of an external magnetic field in the direction opposite to the height direction) to the voltage difference (ΔV) with external magnetic fields of ±4000 Oe (an external magnetic field of +4000 Oe represents the direction and intensity of an external magnetic field, for example, in the height direction, and an external magnetic field of -4000 Oe represents the direction and intensity of an external magnetic field in the direction opposite to the height direction). The ratio {ΔV (±100 Oe)/ΔV (±4000 Oe)} represents a degree of rotation of magnetization of the free magnetic layer with a weak magnetic field, i.e., sensitivity of the free magnetic layer. The external magnetic field intensity of 4000 Oe is about $31.6 \times 10^4$ (A/m).

Figure 19:
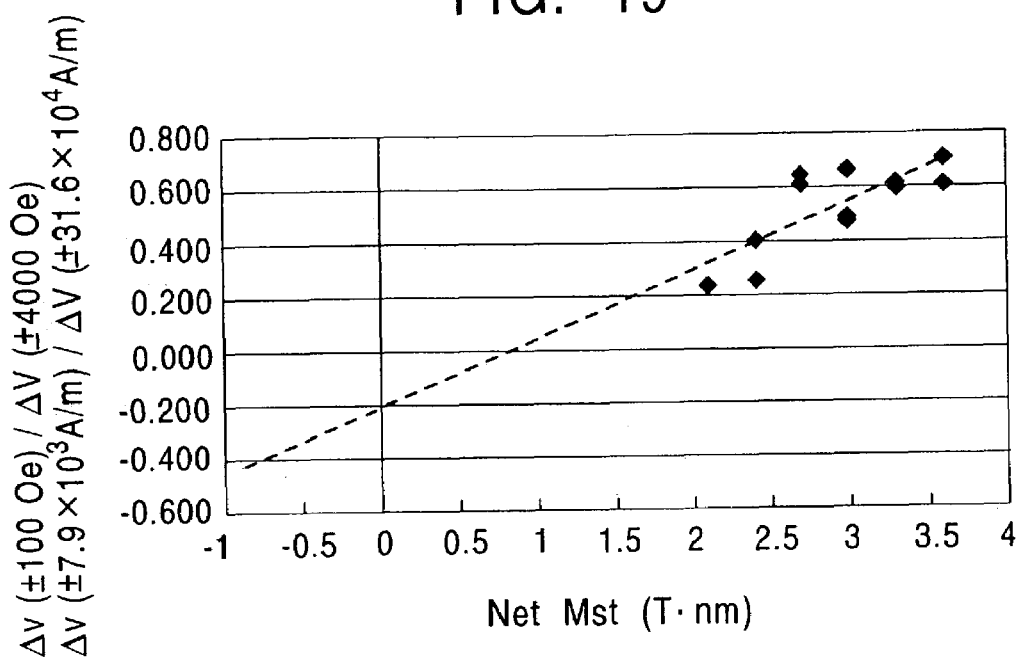
FIG. 19 is a graph showing the relationship between the synthetic magnetic moment (Net Mst) per unit area and $\Delta V$ ($\pm 100$ Oe)/$\Delta V$ ($\pm 4000$ Oe) of the magnetic detecting element shown in FIG. 18B.

FIG. 19 is a graph showing the relationship between the synthetic magnetic moment per unit area and sensitivity {ΔV (±100 Oe)/ΔV (±4000 Oe)} (simply referred to as "sensitivity" hereinafter). FIG. 19 indicates that the sensitivity gradually decreases as the synthetic magnetic moment per unit area decreases. It is found from FIG. 19 that the sensitivity becomes zero near a synthetic magnetic moment per unit area of 1 T·nm. It is also found that the sensitivity can be suppressed to 0.2 or less by controlling the synthetic magnetic moment per unit area to 1.5 T·nm or less.

As a result of the experiments, it was found that the sensitivity can be effectively decreased by decreasing the synthetic magnetic moment per unit area in a predetermined range.

Figure 20:
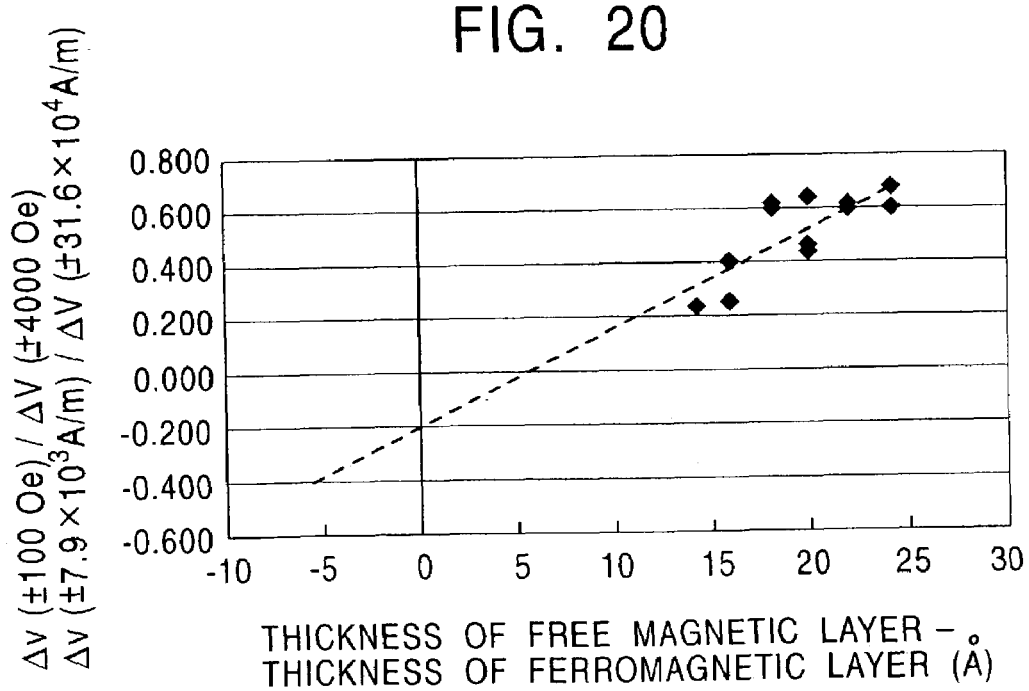
FIG. 20 is a graph showing the relationship between the thickness difference obtained by subtracting the thickness of a ferromagnetic layer from the thickness of the free magnetic layer, and $\Delta V$ ($\pm 100$ Oe)/$\Delta V$ ($\pm 4000$ Oe) of the magnetic detecting element shown in FIG. 18B.

FIG. 20 is a graph showing the relationship between the thickness difference obtained by subtracting the thickness of the ferromagnetic layer from the thickness of the free magnetic layer and sensitivity. The graph of FIG. 20 shows the same tendency as in FIG. 19, i.e., the tendency that the sensitivity gradually decreases as the thickness difference decreases. It is found from FIG. 20 that the sensitivity becomes zero near a thickness different of 5 Å. It is also found that the sensitivity can be suppressed to 0.2 or less by controlling the thickness difference to 10 Å or less.

Next, a magnetic detecting element having the same film structure as in FIG. 18B was produced except that the composition and thickness of the free magnetic layer were modified from the above-described experiments, and the same experiments as shown in FIGS. 19 and 20 were performed.

The free magnetic layer used in the modified experiments was formed in a three-layer structure of $Co_{90at\%}Fe_{10at\%}$ (10 Å)/$Ni_{80at\%}Fe_{20at\%}$ (30 Å)/$Co_{90at\%}Fe_{10at\%}$ (6 Å) The numerical value in parentheses indicates the thickness of each layer.

The nonmagnetic intermediate layer comprising Ru of 9 Å, and the ferromagnetic layer comprising $Co_{90at\%}Fe_{10at\%}$ were used. The thickness of the ferromagnetic layer was changed to change the synthetic magnetic moment per unit area and the thickness difference between the free magnetic layer and the ferromagnetic layer.

Figure 21:
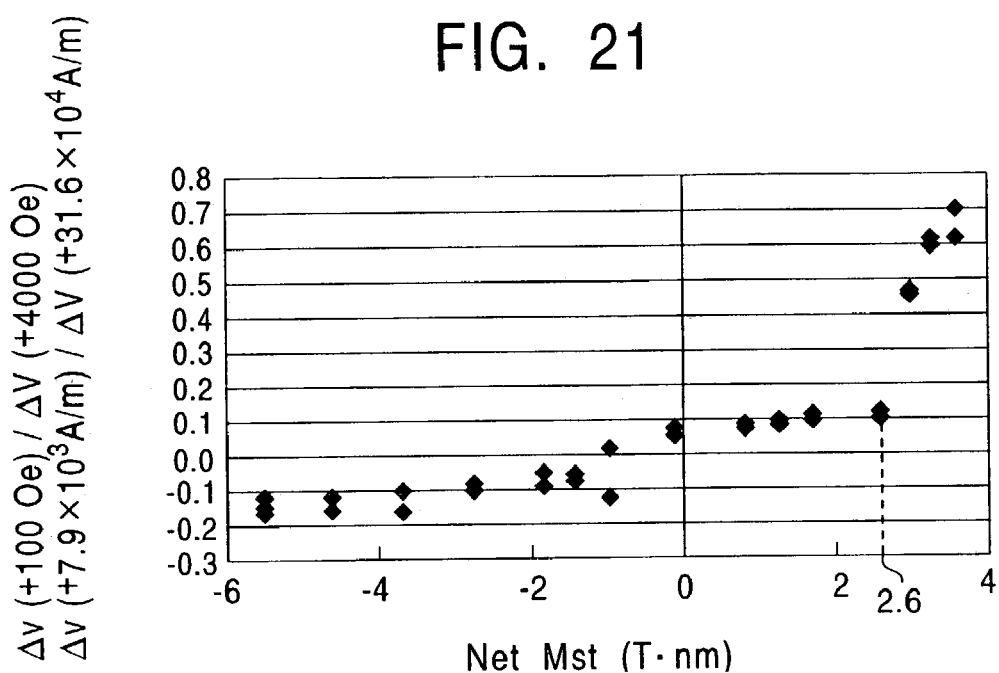
FIG. 21 is a graph showing the relationship between the synthetic magnetic moment (Net Mst) per unit area and $\Delta V$ ($\pm 100$ Oe)/$\Delta V$ ($\pm 4000$ Oe) of a magnetic detecting element formed in the same structure as shown in FIG. 18B by using different materials from those used in the experiments shown in FIG. 19.

FIG. 21 is a graph showing the relationship between the synthetic magnetic moment (Net Mst) per unit area obtained by subtracting the magnetic moment of the ferromagnetic layer from the magnetic moment of the free magnetic layer and sensitivity.

FIG. 21 indicates that the sensitivity gradually decreases as the synthetic magnetic moment per unit area decreases in the same manner as in FIG. 19. In FIG. 21, the sensitivity rapidly changes with the synthetic magnetic moment per unit area of 2.6 T·nm as a boundary. That is, the sensitivity rapidly changes at an inflection point with the synthetic magnetic moment per unit area of 2.6 T·nm.

As a result, it was found that the sensitivity is 0.2 or less when the synthetic magnetic moment per unit area is 2.6 T·nm or less.

Figure 22:
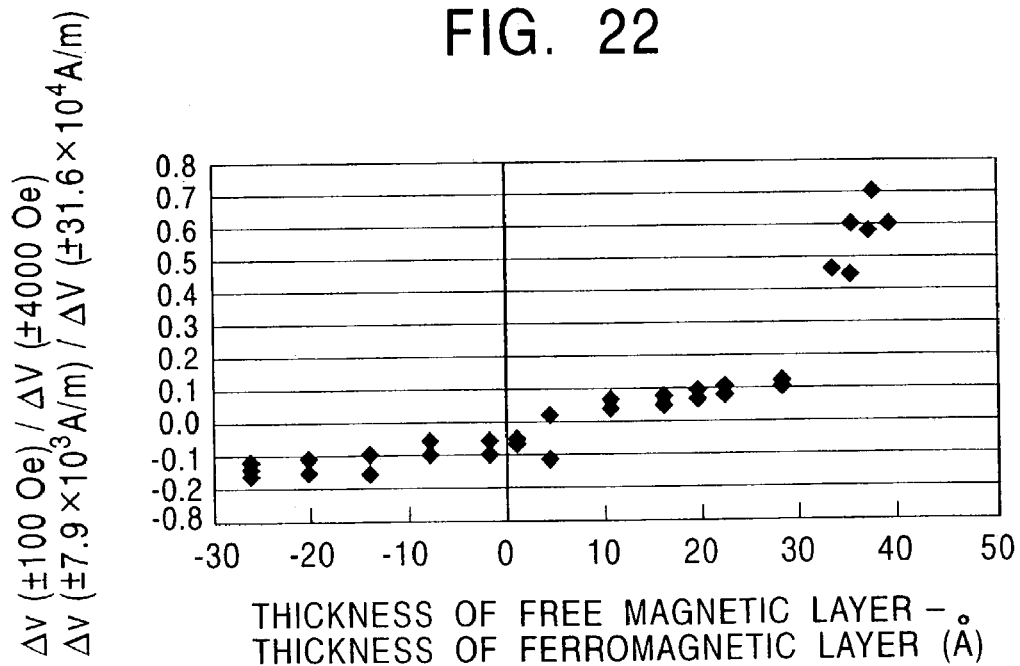
FIG. 22 is a graph showing the relationship between the thickness difference obtained by subtracting the thickness of a ferromagnetic layer from the thickness of the free magnetic layer, and ΔV (±100 Oe)/ΔV (±4000 Oe) of a magnetic detecting element formed in the same structure as shown in FIG. 18B by using different materials from those used in the experiments shown in FIG. 19.

FIG. 22 is a graph showing the relationship between the thickness difference obtained by subtracting the thickness of the ferromagnetic layer from the thickness of the free magnetic layer and sensitivity.

FIG. 22 indicates that the sensitivity gradually decreases as the thickness difference decreases in the same manner as in FIG. 20.

FIG. 22 indicates that the sensitivity rapidly changes with the thickness difference of 30 Å as a boundary. That is, the sensitivity rapidly changes at an inflection point with the thickness difference of 30 Å. Therefore, FIG. 22 indicates the sensitivity is 0.2 or less when the thickness difference is 30 Å or less.

In each of the embodiments shown in FIGS. 1 to 4, the synthetic ferrimagnetic structure comprising the free magnetic layer 28, the nonmagnetic intermediate layer 29 and the ferromagnetic layer 30 is maintained in each of the regions B of both side portions. However, the sensitivity of the synthetic ferrimagnetic structure in the regions B is preferably as low as possible for suppressing the occurrence of side reading.

Therefore, the magnitude of the magnetic moment per unit area and the thickness difference are determined preferably from the experimental results shown in FIGS. 19 to 22.

The preferred sensitivity on both side portions of the element is described. Since the sensitivity of the central portion of the free magnetic layer is about 0.8, the preferred sensitivity range of both side portions of the element is set to ¼ or less of the sensitivity of the central portion, i.e., 0.2 or less, for suppressing side reading to a practical level.

FIG. 21 indicates that the sensitivity rapidly changes with the synthetic magnetic moment per unit area of 2.6 T·nm as a boundary, and thus the sensitivity can be suppressed to 0.2 or less by controlling the synthetic magnetic moment per unit area to 2.6 T·nm or less.

From this viewpoint, the synthetic magnetic moment per unit area and the thickness difference with which the sensitivity can be suppressed to 0.2 or less is determined.

The graph of FIG. 21 reveals that the absolute value of sensitivity can be suppressed to 0.2 or less by setting the synthetic magnetic moment per unit area in the range of −6 T·nm to 2.6 T·nm.

However, the synthetic magnetic moment per unit area has a difference in effect between the minus value and plus value sides, as described below.

Figure 23:
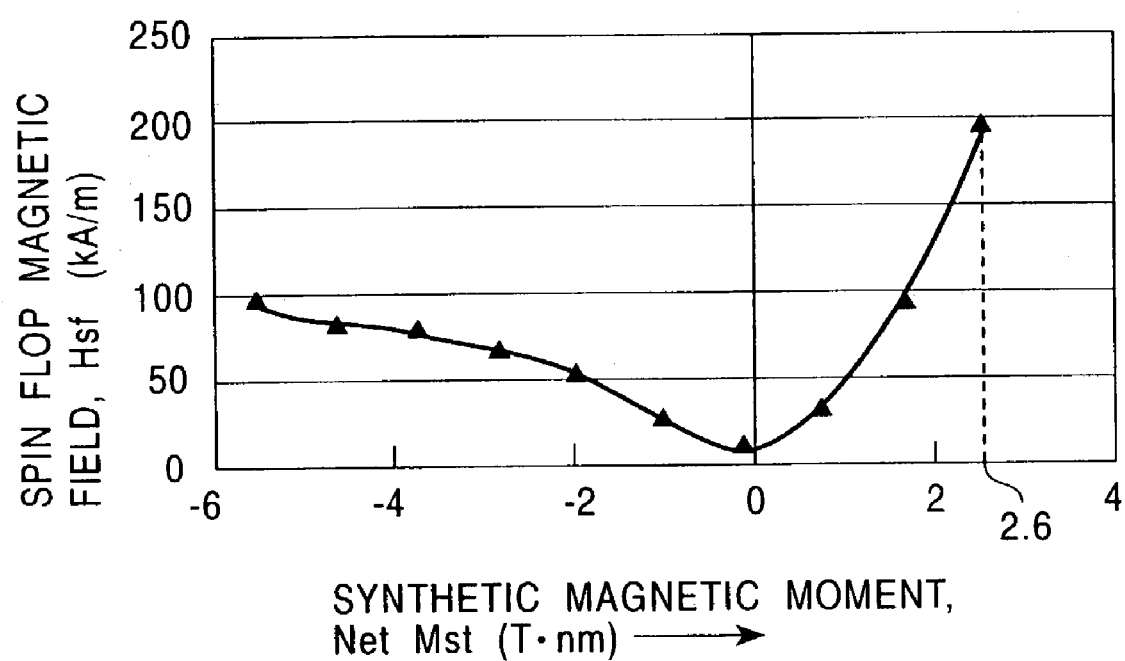
FIG. 23 is a graph showing the relationship between the synthetic magnetic moment per unit area of a free magnetic layer and a ferromagnetic layer and a spin-flop magnetic field.

FIG. 23 is a graph showing the relationship between the synthetic magnetic moment per unit area and spin flop magnetic field Hsf. The spin flop magnetic field Hsf represents the magnitude of a magnetic field at which the antiparallel magnetization state between the free magnetic layer and the ferromagnetic layer is broken. A higher the spin flop magnetic field Hsf leads to a more robust antiparallel magnetization state between the free magnetic layer and the ferromagnetic layer. The magnetic sensing element used in the experiments shown in FIG. 23 is the same as that used in the experiments shown in FIGS. 21 and 22.

FIG. 23 indicates that the spin flow magnetic field Hsf increases as the synthetic magnetic moment per unit area increases from 0 T·nm to the plus side, and increases as the synthetic magnetic moment decreases from 0 T·nm to the minus side.

FIG. 23 also indicates that the spin flow magnetic field Hsf rapidly increases as the synthetic magnetic moment per unit area increases to the plus side, as compared with decreases to the minus side.

The magnitude of the spin flop magnetic field influences the magnitude of the magnetic field applied in magnetic field annealing for controlling the magnetizations of the free magnetic layer and the ferromagnetic layer. That is, the magnitude of the magnetic field applied in magnetic field annealing is set to be lower than the spin flop magnetic field so that the free magnetic layer and the ferromagnetic layer can be appropriately put into a single magnetic domain state, and in an antiparallel magnetized state. If the magnitude of the magnetic field applied in magnetic field annealing is higher than the magnitude of the spin flop magnetic field, the ferromagnetic layer becomes annealed in a direction shifted from the predetermined direction (the track width direction), and thus the ferromagnetic layer is pinned in an unintended direction. In such a situation, the free magnetic layer and the ferromagnetic layer cannot be appropriately kept in the antiparallel magnetized state in the track width direction.

Therefore, the magnitude of the magnetic field applied in magnetic field annealing is preferably lower than the magnitude of the spin flop magnetic field. By increasing the magnitude of the spin flop magnetic field, the margin of the magnitude of the magnetic field applied in magnetic field annealing can be widened, the magnetic field annealing can be facilitated, and the free magnetic layer and the ferromagnetic layer can be easily controlled in the antiparallel magnetized state in the track width direction.

From the above-described reason, the synthetic magnetic moment is preferably in the plus region in which the spin flop magnetic field rapidly increases, for facilitating and optimizing the manufacturing process.

Where the synthetic magnetic moment is a minus value, the magnetic moment per unit area of the ferromagnetic layer is higher than that of the free magnetic layer. In this case, the ferromagnetic layer is liable to be formed to a larger thickness than the free magnetic layer. With the ferromagnetic layer having a larger thickness, the ferromagnetic layers 30 shown in FIG. 1 produce a large magnetic charge at its inner ends, and thus the dipole magnetic field (static magnetic field) leaking from the inner ends of the ferromagnetic layers 30 to the free magnetic layer 28 acts in the direction opposite to the magnetization direction of the free magnetic layer 28. Therefore, the problem of easily causing distortion and instability in a reproduced waveform occurs.

From this viewpoint, the synthetic magnetic moment is preferably a plus value.

Where the synthetic magnetic moment is 0 T·nm, the magnetic moment per unit area of the free magnetic layer is the same value as that of the ferromagnetic layer. In this case, it is impossible to determine which of the free magnetic layer and the ferromagnetic layer is a dominant layer in magnetic field annealing (i.e., a layer in which magnetization is oriented in the direction of the applied magnetic field). Therefore, it is difficult to control the magnetizations of the free magnetic layer and the ferromagnetic layer to be antiparallel to each other and to cross the magnetization direction of the pinned magnetic layer. It is thus desirable that the synthetic magnetic moment is not 0 T·nm.

Consequently, the synthetic magnetic moment is preferably in the range of more than 0 T·nm and 2.6 T·nm or less, so that the sensitivity can be suppressed to 0.2 or less, and the magnetic field annealing step for controlling the magnetizations of the free magnetic layer and the ferromagnetic layer can be facilitated and optimized. Also, a magnetic detecting element having stability of a reproduced waveform can be manufactured.

The experiments shown in FIG. 19 were performed by using the magnetic detecting element comprising the free magnetic layer and the ferromagnetic layer both of which were made of a CoFe alloy. In this case, the sensitivity can be suppressed to 0.2 or less by setting the synthetic magnetic moment to 1.5 T·nm or less. Therefore, when both of the free magnetic layer and the ferromagnetic layer are made of a CoFe alloy, the synthetic magnetic moment is preferably more than 0 T·nm and 1.5 T·nm or less.

A preferred range of the thickness difference will be described below. FIG. 22 indicates that the absolute value of sensitivity can be suppressed to 0.2 or less by setting the thickness difference to −30 Å to 30 Å. However, a minus value of thickness difference easily produces the same problem as the case of a minus value of synthetic magnetic moment, and thus the thickness difference is preferably a plus value.

The experiments shown in FIG. 22 were performed by using the free magnetic layer having the three-layer structure of CoFe/NiFe/CoFe, and the ferromagnetic layer having a single layer structure of CoFe, and thus the free magnetic layer and the ferromagnetic layer had different values of saturation magnetization Ms. In this case, even where the free magnetic layer and the ferromagnetic layer have the same thickness, i.e., the thickness difference is 0 Å, the synthetic magnetic moment per unit area is not 0 T·nm.

Therefore, the thickness difference is preferably 0 Å to 30 Å. However, the experiments shown in FIG. 20 were performed by using the magnetic detecting element comprising the free magnetic layer and the ferromagnetic layer both of which were made of a CoFe alloy, and the sensitivity could be suppressed to 0.2 or less by setting the thickness difference to 10 Å or less. In this case, with the thickness difference of 0 Å, the synthetic magnetic moment becomes 0 T·nm. Therefore, the thickness difference is preferably set to more than 0 Å and 10 Å or less.

In the above-described magnetic detecting element, the ferromagnetic layers are formed on both side portions of the free magnetic layer through the nonmagnetic intermediate layer, and the second antiferromagnetic layers are formed on the ferromagnetic layers with a distance greater than the distance between the ferromagnetic layers in the track width direction. Also, in both side portions of the element, the ferromagnetic layers have portions extending from the inner end surfaces of the respective second antiferromagnetic layers to the center in the track width direction. Furthermore, electrode layers are formed on the respective second antiferromagnetic layers and on the extending portions of the ferromagnetic layers.

As described above, the distance between the second antiferromagnetic layers in the track width direction can be increased to be greater than the track width Tw controlled by the distance between the bottoms of the ferromagnetic layers, and the inner ends of the electrode layers overlap with the extending portions of the ferromagnetic layers, which extend from the respective second antiferromagnetic layers toward the center in the track width direction. Therefore, the sensing current can be caused to appropriately flow to the central portion of the free magnetic layer while suppressing a shunt to the multilayer film through the overlapped portions. Furthermore, the central portion of the free magnetic layer is not subjected to exchange coupling due to the RKKY interaction with the ferromagnetic layers, and thus magnetic reversal occurs in the central portion with high sensitivity, resulting in an improvement in reproduced output.

Furthermore, each of the extending portions of the ferromagnetic layers, which extend from the inner ends of the respective second antiferromagnetic layers toward the center in the track width direction, has a so-called synthetic ferrimagnetic structure comprising the free magnetic layer formed below the ferromagnetic layer through the nonmagnetic intermediate layer. Therefore, sensitivity to the external magnetic field can be effectively lowered by exchange coupling due to the RKKY interaction between the ferromagnetic layers and the free magnetic layer. As a result, it is possible to appropriately suppress widening of an effective reproducing track, and suppress the occurrence of side reading, as compared with a conventional example.

As described above, reproduced output from the magnetic detecting element can be increased even with a narrower track, and widening of the effective reproducing track width can be suppressed to accordingly suppress the occurrence of side reading. It is thus possible to provide a magnetic detecting element capable of effectively improving reproducing characteristics even with a higher recording density, as compared with a conventional element.

What is claimed is:

1. A magnetic detecting element comprising:
   a multilayer film comprising a first antiferromagnetic layer, a pinned magnetic layer, a nonmagnetic layer, and a free magnetic layer, which are laminated in that order from below;
   ferromagnetic layers formed on two side portions of the free magnetic layer over nonmagnetic intermediate layers;
   second antiferromagnetic layer formed on the ferromagnetic layers with a spacing greater than the spacing between the ferromagnetic layers in the track width direction, so that the ferromagnetic layers have extending portions extending from the inner ends of the respective second antiferromagnetic layers toward the center in the track width direction within both side portions; and
   insulating layers extending above the second antiferromagnetic layers and the extending portions of the ferromagnetic layers;
   an upper electrode extending above the insulating layers and the multilayer film between the insulating layers;
   a lower electrode formed below the multilayer film.

2. A magnetic detecting element according to claim 1, wherein the synthetic magnetic moment per unit area obtained by subtracting the magnetic moment (Ms·t) per unit area of the ferromagnetic layers from the magnetic moment (Ms·t) per unit area of the free magnetic layer is more than 0 T·nm and 2.6 T·nm or less.

3. A magnetic detecting element according to claim 1, wherein the thickness difference obtained by subtracting the thickness (t) of the ferromagnetic layers from the thickness (t) of the free magnetic layer is 0 Å to 30 Å.

4. A magnetic detecting element comprising:
   a substrate extending perpendicular to a first direction,
   a first antiferromagnetic layer formed above the substrate;

a pinned magnetic layer formed above the first antiferromagnetic layer;

a nonmagnetic layer formed above the pinned magnetic layer;

a free magnetic layer formed above the nonmagnetic layer;

a ferromagnetic layer formed on above the free magnetic layer;

a first space formed in the ferromagnetic layer with a first width in a second direction, wherein the second direction is perpendicular to the first direction;

a second antiferromagnetic layer formed above the ferromagnetic layer;

a second space formed in the second antiferromagnetic layer with a second width in the second direction, wherein the second width is greater than the first width;

wherein a multilayer film comprises a laminate that ranges from the substrate to the ferromagnetic layer and the ferromagnetic layer comprises extending portions in a region greater than the first width and smaller than the second width;

an upper electrode extending above the second antiferromagnetic layer, the extending portions of the ferromagnetic layer and the multilayer film between the extending portions of the ferromagnetic layer in the second direction; and wherein the substrate operates as a lower electrode formed below the multilayer film.

5. The magnetic detecting element of claim 4, wherein the free magnetic layer has a thickness t1, wherein the ferromagnetic layer has a thickness t2, and wherein the absolute value of t1−t2 is less than approximately 30 angstroms.

6. The magnetic detecting element of claim 4, wherein the free magnetic layer has a thickness t1, wherein the ferromagnetic layer has a thickness t2, and wherein the value of t1−t2 is greater than zero and less than approximately 30 angstroms.

7. The magnetic detecting element of claim 4, wherein the free magnetic layer has a first magnetic moment per unit area, wherein the ferromagnetic layer has a second magnetic moment per unit area, and wherein the first magnetic moment per unit area is substantially different from the second magnetic moment per unit area.

8. A magnetic detecting element comprising:

a substrate extending perpendicular to a first direction, a first antiferromagnetic layer formed above the substrate;

a pinned magnetic layer formed above the first antiferromagnetic layer;

a first nonmagnetic layer formed above the pinned magnetic layer;

a free magnetic layer formed above the first nonmagnetic layer;

a ferromagnetic layer formed on a second nonmagnetic layer above the free magnetic layer;

a first space formed in the ferromagnetic layer with a first width in a second direction, wherein the second direction is perpendicular to the first direction;

a second antiferromagnetic layer formed above the ferromagnetic layer;

a second space formed in the second antiferromagnetic layer with a second width in the second direction, wherein the second width is greater than the first width;

wherein a multilayer film comprises a laminate that ranges from the substrate to the ferromagnetic layer and the ferromagnetic layer comprises extending portions in a region greater than the first width and smaller than the second width;

an upper electrode extending above the second antiferromagnetic layer, the extending portions of the ferromagnetic layer, and the multilayer film between the extending portions of the ferromagnetic layer in the second direction; and wherein the substrate operates as a lower electrode formed below the multilayer film in the second direction; and wherein the first space and the second space are formed above the second nonmagnetic layer.

* * * * *